(12) United States Patent
Katsuno et al.

(10) Patent No.: US 9,070,837 B2
(45) Date of Patent: Jun. 30, 2015

(54) SEMICONDUCTOR LIGHT-EMITTING DEVICE AND METHOD FOR MANUFACTURING SAME

(75) Inventors: Hiroshi Katsuno, Tokyo (JP); Yasuo Ohba, Kanagawa-ken (JP); Kei Kaneko, Kanagawa-ken (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 772 days.

(21) Appl. No.: 12/400,396

(22) Filed: Mar. 9, 2009

(65) Prior Publication Data

US 2010/0051987 A1 Mar. 4, 2010

(30) Foreign Application Priority Data

Aug. 28, 2008 (JP) ................. 2008-220143

(51) Int. Cl.
*H01L 33/00* (2010.01)
*H01L 33/44* (2010.01)
*H01L 33/38* (2010.01)

(52) U.S. Cl.
CPC ............... *H01L 33/44* (2013.01); *H01L 33/38* (2013.01); *H01L 2224/13* (2013.01); *H01L 2224/48091* (2013.01); *H01L 2224/73265* (2013.01)

(58) Field of Classification Search
CPC .................................................. H01L 2224/13
USPC .......................................................... 257/99
See application file for complete search history.

(56) References Cited

U.S. PATENT DOCUMENTS 6,117,700 A * 9/2000 Orita et al. ...................... 438/46
6,577,006 B1 * 6/2003 Oota et al. ...................... 257/745

(Continued)

FOREIGN PATENT DOCUMENTS

JP 2000-31588 1/2000
JP 2002-26384 A 1/2002

(Continued)

OTHER PUBLICATIONS

Van Nostrand, J.E., et al. "Dissociation of Al2O3(0001) Substrates and the Roles of Silicon and Oxygen in n-Type GaN Thin Solid Films Grown by Gas-Source Molecualr Beam Epitaxy." J. Appl. Phys., vol. 87, No. 12 (Jun. 15, 2000): pp. 8766-8772.*

(Continued)

*Primary Examiner* — Mark Tornow
(74) *Attorney, Agent, or Firm* — Oblon, McClelland, Maier & Neustadt, L.L.P.

(57) ABSTRACT

A semiconductor light-emitting device includes: a laminated structure, a first electrode, a second electrode and a dielectric laminated film. The laminated structure includes, a first semiconductor layer, a second semiconductor layer, and a light-emitting layer provided between the first semiconductor layer and the second semiconductor layer, in which the second semiconductor layer and the light-emitting layer are selectively removed and a part of the first semiconductor layer is exposed to a first main surface on the side of the second semiconductor layer. The first electrode is provided on the first main surface of the laminated structure and connected to the first semiconductor layer and has a first region including a first metal film provided on the first semiconductor layer of the first main surface, and a second region including a second metal film provided on the first semiconductor layer and having a higher reflectance for light emitted from the light-emitting layer than the first metal film and having a higher contact resistance with respect to the first semiconductor layer than the first metal film. The second electrode is provided on the first main surface of the laminated structure and connected to the second semiconductor layer. The dielectric laminated film is provided on the first and second semiconductor layer being not covered with the first and second electrode and has a plurality of dielectric films having different refractive indices being laminated.

13 Claims, 31 Drawing Sheets

(56) References Cited

U.S. PATENT DOCUMENTS

| | | | |
|---|---|---|---|
| 6,693,352 B1* | 2/2004 | Huang et al. | 257/743 |
| 6,841,802 B2* | 1/2005 | Yoo | 257/98 |
| 7,176,479 B2 | 2/2007 | Ohba | |
| 7,902,565 B2* | 3/2011 | Katsuno et al. | 257/98 |
| 2003/0006409 A1 | 1/2003 | Ohba | |
| 2003/0006422 A1* | 1/2003 | Miki et al. | 257/99 |
| 2003/0025212 A1 | 2/2003 | Bhat et al. | |
| 2004/0238837 A1* | 12/2004 | Jacob et al. | 257/99 |
| 2005/0156188 A1* | 7/2005 | Ro et al. | 257/103 |
| 2005/0212002 A1* | 9/2005 | Sanga et al. | 257/96 |
| 2005/0233484 A1* | 10/2005 | Stein et al. | 438/22 |
| 2007/0034883 A1 | 2/2007 | Ohba | |
| 2008/0185609 A1* | 8/2008 | Kozawa et al. | |
| 2008/0308832 A1* | 12/2008 | Hsieh et al. | 257/98 |
| 2009/0050916 A1 | 2/2009 | Katsuno et al. | |
| 2009/0057707 A1* | 3/2009 | Katsuno et al. | 257/99 |
| 2010/0308366 A1* | 12/2010 | Kang et al. | 257/99 |

FOREIGN PATENT DOCUMENTS

| | | |
|---|---|---|
| JP | 2002-353504 A | 12/2002 |
| JP | 2003-110140 A | 4/2003 |
| JP | 2006-41403 A | 2/2006 |
| JP | 2007-324585 A | 12/2007 |
| JP | 2008-192782 A | 8/2008 |

OTHER PUBLICATIONS

U.S. Appl. No. 12/400,236, filed Mar. 9, 2009, Katsuno et al.
Office Action issued Mar. 12, 2014 in Japanese Patent Application No. 2013-002891 with English language translation.
Office Action issued Sep. 26, 2013 in Japanese Patent Application No. 2013-002891 with English language translation.

* cited by examiner

SEMICONDUCTOR LIGHT-EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2008-220143, filed on Aug. 28, 2008; the entire contents of which are incorporated herein by reference.

BACKGROUND OF THE INVENTION

This invention relates to a semiconductor light-emitting device and a method for manufacturing the same.

BACKGROUND ART

Light generated in a semiconductor light-emitting device such as LED (Light Emitting Diode) is directly taken out of the device, or taken out from a device surface or a substrate surface or a side surface of the device by repeating reflection inside the semiconductor light-emitting device such as a reflection film, an interface between a semiconductor layer and a substrate, or an interface between a substrate and ambient air. Some of the light inside the device is absorbed by an n-side electrode having low reflection efficiency, and some of the light taken out of the device is absorbed by a mount material or the like, and these are factors of lowering the light extraction efficiency.

An effective method for enhancing the light extraction efficiency is taking out the light emitted inside the device to the direction in which an absorber such as the mount material does not exist by ingenuity of the device shape or the reflection film or the like. On the other hand, the area of the n-side electrode which is an absorber inside the device is required to be large to a certain extent from the constraint on the electrode design such as, wire bonding by ball bonding or the like, formation of bump for a flip chip, and reduction of voltage drop due to the contact resistance of the n-side electrode. Moreover, in the case of the device in which the reflection film is combined with the p-side electrode, the area of the reflection film cannot be freely enlarged from the constraint on the design of the light-emitting region or the electrode design such as the combination with the n-side electrode.

On the other hand, there has been disclosed a technique in which a semiconductor device made of nitride semiconductor having few crystal defects is provided by forming a nitride semiconductor of high quality on a substrate (Patent document 1: JP-A 2000-31588 (Kokai)). If there is a layer having a large number of crystal defects, the light emitted from a light-emitting layer is absorbed and the loss is caused, but by using such a technique as disclosed in JP-A 2000-31588 (Kokai), the absorbance inside the device for the light emitted from the light-emitting layer can be suppressed.

SUMMARY OF THE INVENTION

According to an aspect of the invention, there is provided a semiconductor light-emitting device including: a laminated structure including, a first semiconductor layer, a second semiconductor layer, and a light-emitting layer provided between the first semiconductor layer and the second semiconductor layer, the second semiconductor layer and the light-emitting layer being selectively removed and a part of the first semiconductor layer being exposed to a first main surface on a side of the second semiconductor layer; a first electrode provided on the first main surface of the laminated structure and connected to the first semiconductor layer and having a first region including a first metal film provided on the part of the first semiconductor layer and a second region including a second metal film provided on the part of the first semiconductor layer, the second region having a higher reflectance for light emitted from the light-emitting layer than the first metal film and the second region having a higher contact resistance with respect to the first semiconductor layer than the first metal film; a second electrode provided on the first main surface of the laminated structure and connected to the second semiconductor layer; and a dielectric laminated film provided on the first semiconductor layer and the second semiconductor layer being not covered with any one of the first electrode and the second electrode on the first main surface, the dielectric laminated film having a plurality of dielectric films having different refractive indices being laminated.

According to another aspect of the invention, there is provided a method for manufacturing a semiconductor light-emitting device including: laminating a first semiconductor layer, a light-emitting layer, and a second semiconductor layer, on a substrate; removing a part of the second semiconductor layer and the light-emitting layer being configured to expose the first semiconductor layer; forming a first metal film on a first region of the exposed first semiconductor layer; forming a second metal film having a higher reflectance for light emitted from the light-emitting layer than the first metal film and having a higher contact resistance with respect to the first semiconductor layer than the first metal film, on a second region adjacent to the first region of the exposed first semiconductor layer and on the second semiconductor layer; and forming a dielectric laminated film by alternately laminating dielectric films having different refractive indices on the first metal film and the second metal film being not covered with the first electrode and the second electrode.

According to another aspect of the invention, there is provided A method for manufacturing a semiconductor light-emitting device, including: laminating a first semiconductor layer, a light-emitting layer, and a second semiconductor layer, on a substrate; removing a part of the second semiconductor layer and the light-emitting layer being configured to expose the first semiconductor layer; selectively forming a dielectric laminated film by alternately laminating dielectric films having different refractive indices on the first semiconductor layer and the second semiconductor layer; and forming a first metal film on a first region of the first semiconductor layer being not covered with the dielectric laminated film, and forming a second metal film having a higher reflectance for light emitted from the light-emitting layer than the first metal film and having a higher contact resistance with respect to the first semiconductor layer than the first metal film, on a second region of the first semiconductor layer being adjacent to the first region and being covered with the dielectric laminated film.

DETAILED DESCRIPTION OF THE INVENTION

Hereinafter, embodiments of the invention will be described with reference to drawings.

The drawings are schematic or conceptual, and a relation between a thickness and a width of each of parts or a ratio coefficient of sizes of parts or the like is not necessarily the same as the real one. Moreover, even if the same part is shown, occasionally, each of the sizes or the ratio coefficient is shown to be different according to the drawings.

Moreover, in this specification and each of the drawings, the same numerals are appended to the same components as described above with respect to a previous figure, and the detailed description thereof will be appropriately omitted.

First Embodiment

FIG. 1 is a schematic view illustrating the configuration of a semiconductor light-emitting device according to a first embodiment of the invention.

Figure 1A:
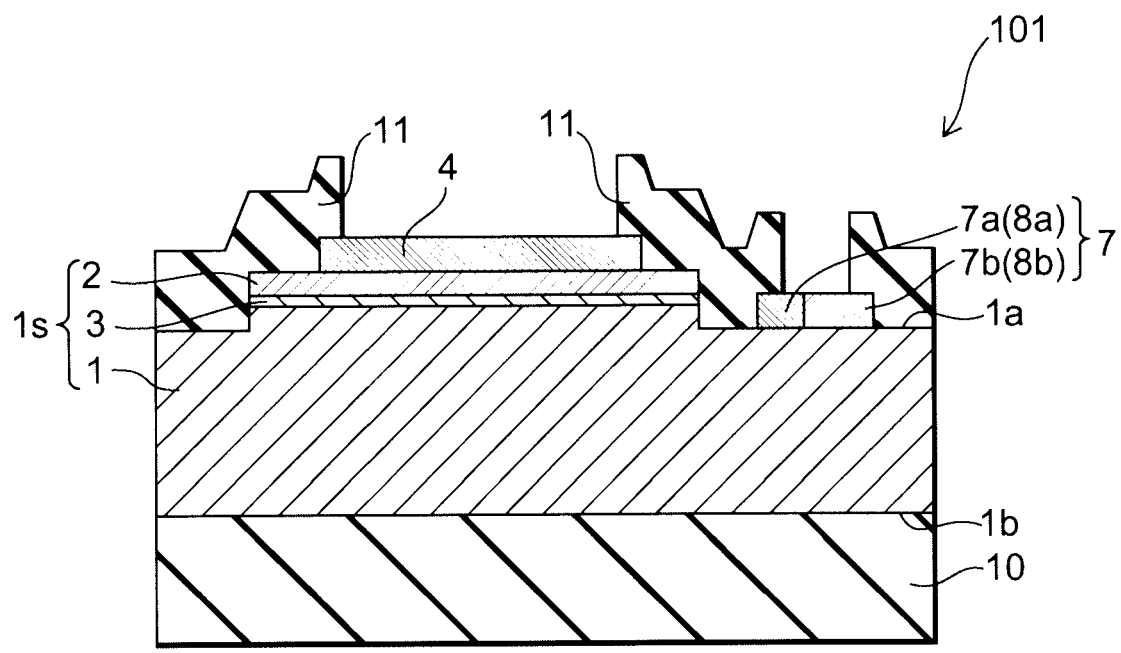
FIGS. 1A and 1B are schematic views illustrating the configuration of a semiconductor light-emitting device according to a first embodiment of the invention.
Figure 1B:
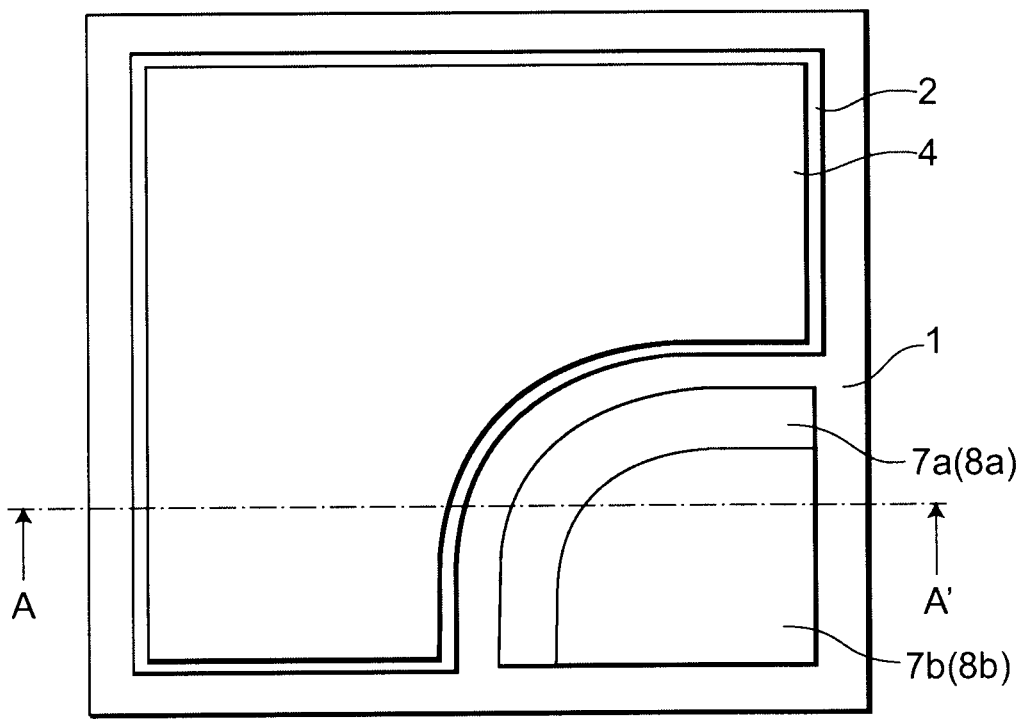

That is, FIG. 1B is a plan view, and FIG. 1A is a cross-sectional view taken along the line A-A' of FIG. 1B.

As shown in FIG. 1A, in the semiconductor light-emitting device 101 according to the first embodiment of the invention, a laminated structure as in which an n-type semiconductor layer (first semiconductor layer) 1, a light-emitting layer 3, and a p-type semiconductor layer (second semiconductor layer) 2 are laminated in this order on a substrate 10 made of, for example, sapphire is formed.

And, on the side of a main surface 1a of this laminated structure 1s, a p-side electrode (second electrode) 4, an n-side electrode (first electrode) 7 and a dielectric laminated film 11 are provided.

The p-side electrode 4 is provided on the side of the main surface 1a of the p-type semiconductor layer 2. The p-side electrode 4 can have a second p-side electrode film 4b serving as a high-efficiency reflection film and a first p-side electrode film 4a made of metal that does not necessarily require the high-efficiency reflection characteristics as described later.

Furthermore, part of the p-type semiconductor layer 2 is etched by etching, and the n-side electrode 7 is provided on the side of the main surface 1a of the exposed n-type semiconductor layer 1. And, the n-side electrode 7 has a second n-side electrode film (second metal film) 7b serving as a high-efficiency reflection film and a first n-side electrode film (first metal film) 7a serving as an ohmic contact region.

And, the dielectric laminated film 11 is provided on the p-type semiconductor layer 2 and the n-type semiconductor layer 1 being not covered with the p-side electrode 4 and the n-side electrode 7. In the dielectric laminated film 11, two or more layers of two or more kinds of dielectric materials having different refractive indices are laminated. However, in the peripheral portion of the device, the dielectric laminated film 11 may be removed, and in the peripheral portion of the device, the dielectric laminated film 11 may be damaged.

For the dielectric laminated film 11, as the two or more kinds of dielectric materials having different refractive indices, five groups of the combination of the laminated film of a first dielectric layer (such as $SiO_2$) and a second dielectric layer (such as $TiO_2$), namely, the laminated film composed of ten dielectric layers in total can be used. In this case, the thickness of each of the first dielectric layer and the second dielectric layer is set to be $\lambda/(4n)$, where n is a refractive index of each of the dielectric layers and $\lambda$ is an emission wavelength from the light-emitting layer 3.

That is, the dielectric laminated film 11 is composed of a first dielectric layer having a first refractive index $n_1$ and a second dielectric layer having a second refractive index $n_2$ that is different from the first refractive index $n_1$ which are alternately laminated, and when an emission wavelength of the light-emitting layer 3 is $\lambda$, a thickness of each of the first dielectric layers is substantially $\lambda/(4n_1)$ and a thickness of each of the second dielectric layers is substantially $\lambda/(4n_2)$.

Thereby, the emitted light from the light-emitting layer 3 can be reflected efficiently and reflected to the semiconductor layer side.

That is, the semiconductor light-emitting device 101 according to this embodiment includes: a laminated structure 1s including, a first semiconductor layer (n-type semiconductor layer 1), a second semiconductor layer (p-type semiconductor layer 2), and a light-emitting layer 3 provided between the first semiconductor layer and the second semiconductor layer; a first electrode (n-side electrode 7) provided on a first main surface 1a of the laminated structure 1s and connected to the first semiconductor layer and having, a first region 8a including a first metal film (first p-side electrode film 7a) provided on the first semiconductor layer, and a second region 8b including a second metal film (second n-side electrode film 7b) that is provided on the first semiconductor layer and that has a higher reflectance for light emitted from the light-emitting layer than the first metal film and that has a higher contact resistance with respect to the first semiconductor layer than the first metal film; a second electrode (p-side electrode 4) provided on the first main surface 1a of the laminated structure 1s and connected to the second semiconductor layer; and a dielectric laminated film 11 provided on the first semiconductor layer and the second semiconductor layer that are not covered with the first electrode and the second electrode on the first main surface 1a, in which a plurality of combinations having a plurality of dielectric films having different refractive indices are laminated.

In the semiconductor light-emitting device 101 according to this embodiment, by providing the second n-side electrode film 7b serving as a high-efficiency reflection film in the n-side electrode 7, the light emitted from the light-emitting layer 3 can be reflected with high efficiency and taken out of the device. That is, the light extraction efficiency of the semiconductor light-emitting device can be improved.

The second n-side electrode film 7b may be a single-layer of silver or aluminum, or may be an alloy layer containing silver or aluminum and metal other than them. The reflection efficiency of a normal single-layer metal film for the visible band tends to lower as its wavelength is shorter, but silver and aluminum have high reflection efficiency characteristics also for light in the ultraviolet band from 370 nm to 400 nm inclusive.

Therefore, when the second n-side electrode film 7b is made of silver or an aluminum alloy in the semiconductor light-emitting device for ultraviolet emission, it is preferable that the second n-side electrode 7b on the semiconductor interface side has a higher component ratio of silver or aluminum.

Moreover, it is preferable that the film thickness of the second n-side electrode film 7b is 100 nm or more for ensuring the light reflection efficiency.

On the other hand, the first n-side electrode film 7a serving as the ohmic contact region has a role of reducing the contact resistance with respect to the n-type semiconductor layer 1 and lowering the device resistance to pass a current.

The material of the first n-side electrode film 7a formed in the region having ohmic characteristics is not particularly limited, but composed of a single-layer or multilayer conductive film used as an ohmic electrode of the n-type semiconductor layer 1. The film thickness of the first n-side electrode film 7a is not particularly limited, but can be selected in the range of 5 nm to 1000 nm.

By performing the design so that the layer structure of the dielectric laminated film 11 has high-efficiency reflection characteristics for the emitted light, the reflection area of the electrode-formed surface can be enlarged drastically while holding the insulation of the p-side electrode 4 and the n-side electrode 7 without making particular ingenuity on the process. That is, the light extraction efficiency of the semiconductor light-emitting device can be improved.

According to the semiconductor light-emitting device 101 having such a configuration, while achieving the n-side electrode 7 ensuring the ohmic contact with the n-type semiconductor layer 1 and having an area required for formation of wire bonding or bump or the like, the semiconductor light-emitting device can be obtained, in which almost all of the region other than the first n-side electrode film 7a in the electrode-formed surface as a reflection region.

In the specific example shown in FIG. 1B, the n-side electrode 7 occupies a corner of the semiconductor light-emitting device having a quadrangular shape, but the shape of the n-side electrode 7 is not limited thereto.

Moreover, in FIG. 1B, the dielectric laminated film 11 is omitted.

Next, a specific example of a laminated structure of the semiconductor layer formed on the substrate 10 will be described.

The semiconductor light-emitting device 101 according to this embodiment is composed of nitride semiconductors formed on the substrate 10 made of, for example, sapphire.

That is, there can be adopted a structure in which a first AlN buffer layer with high carbon concentration (the carbon concentration is $3\times10^{18}$ cm$^{-3}$ to $5\times10^{20}$ cm$^{-3}$) with a thickness of 3 nm to 20 nm, a second AlN buffer layer of high purity (the carbon concentration is $1\times10^{16}$ cm$^{-3}$ to $3\times10^{18}$ cm$^{-3}$) with a thickness of 2 μm, a non-doped GaN buffer layer with a thickness of 3 μm, a Si-doped n-type GaN contact layer (the Si concentration is $1\times10^{18}$ cm$^{-3}$ to $5\times10^{18}$ cm$^{-3}$) with a thickness of 4 μm, a Si-doped n-type $Al_{0.10}Ga_{0.90}N$ cladding layer with a thickness of 0.02 μm (the Si concentration is $1\times10^{18}$ cm$^{-3}$), a light-emitting layer with a thickness of 0.075 μm having a multiple quantum well structure in which a Si-doped n-type $Al_{0.11}Ga_{0.89}N$ barrier layer (the Si concentration is $1.1$-$1.5\times10^{19}$ cm$^{-3}$) and a GaInN light-emitting layer (the wavelength is 380 nm) are laminated alternately in three periods, a final $Al_{0.11}Ga_{0.89}N$ barrier layer of the multiple quantum well (the Si concentration is $1.1$-$1.5\times10^{19}$ cm$^{-3}$) with a thickness of 0.01 μm, a Si-doped n-type $Al_{0.11}Ga_{0.89}N$ layer (the Si concentration is $0.8$-$1.0\times10^{19}$ cm$^{-3}$) with a thickness of 0.01 μm, a non-doped $Al_{0.11}Ga_{0.89}N$ spacer layer with a thickness of 0.02 μm, a Mg-doped p-type $Al_{0.28}Ga_{0.72}N$ cladding layer with a thickness of 0.02 μm (the Mg concentration is $1\times10^{19}$ cm$^{-3}$), a Mg-doped p-type GaN contact layer (the Mg concentration is $1\times10^{19}$ cm$^{-3}$) with a thickness of 0.1 μm, and a high-concentration-Mg-doped p-type GaN contact layer (the Mg concentration is $2\times10^{20}$ cm$^{-3}$) with a thickness of 0.02 μm are sequentially laminated using, for example, metal organic chemical vapor deposition on the substrate 10 whose surface is a sapphire c plane.

Here, the n-type semiconductor layer 1 illustrated in FIG. 1A can include the first AlN buffer layer with high carbon concentration, the second AlN buffer layer of high purity, the non-doped GaN buffer layer, the Si-doped n-type GaN contact layer, and the Si-doped n-type $Al_{0.10}Ga_{0.90}N$ cladding layer.

Moreover, the light-emitting layer 3 illustrated in FIG. 1A can include, the light-emitting layer having a multiple quantum well structure in which the Si-doped n-type $Al_{0.11}Ga_{0.89}N$ barrier layer and the GaInN light-emitting layer (the wavelength is 380 nm) are laminated alternately in three periods, and the final $Al_{0.11}Ga_{0.89}N$ barrier layer of the multiple quantum well.

And, the p-type semiconductor layer 2 illustrated in FIG. 1A can include the Mg-doped p-type $Al_{0.28}Ga_{0.72}N$ cladding layer, the Mg-doped p-type GaN contact layer, and the high-concentration-Mg-doped p-type GaN contact layer.

By setting the Mg concentration of the high-concentration-Mg-doped p-type GaN contact layer to be in the order of $1\times10^{20}$ cm$^{-3}$, which is slightly high, the ohmic contact with the p-side electrode can be improved. However, in the case of a semiconductor light-emitting diode, differently from a semiconductor laser diode, the distance between the above contact layer and the light-emitting layer is short, and therefore, degradation of the characteristic due to Mg diffusion is feared. Accordingly, by utilizing that the contact area between the p-side electrode 4 and the above contact layer is large and that the current density during operation is low, the above Mg concentration can be suppressed to be in the order of $1\times10^{19}$ cm$^{-3}$ without largely damaging electrical characteristics to prevent the diffusion of Mg and improve light emission characteristics.

The first AlN buffer layer with high carbon concentration functions to relax the difference of the crystal types from the substrate, and particularly, reduces screw dislocation.

Moreover, in the second AlN buffer layer with high purity, its surface is planarized at the atomic level. Therefore, defects of the non-doped GaN buffer layer grown thereon are reduced, and to this end, it is preferable that the film thickness of the second AlN buffer layer with high purity is thicker than 1 μm. Moreover, for preventing warpage due to strain, it is desirable that the thickness of the second AlN buffer layer of high purity is 4 μm or less. The second AlN buffer layer with high purity is not limited to AlN, but $Al_xGa_{1-x}N$ ($0.8 \leq x \leq 1$) is possible to compensate warpage of the wafer.

Moreover, the non-doped GaN buffer layer serves to reduce defects by 3-dimensional island growth on the second AlN buffer layer with high purity. For the planarization of the growth surface, it is necessary that the average film thickness of the non-doped GaN buffer layer is 2 μm or more. From the viewpoints of reproducibility and lowering of warpage, it is appropriate that the total film thickness of the non-doped GaN buffer layer is 4 to 10 μm.

By adopting these buffer layers, in comparison to a conventional low-temperature growth AlN buffer layer, the defects can be reduced by about 1/10. By this technique, despite high-concentration Si-doping to the n-type GaN contact layer or light emission in the ultraviolet band, the semiconductor light-emitting device with high efficiency can be fabricated. Moreover, by reducing the crystal defects in the buffer layers, light absorption in the buffer layers can also be suppressed.

And, according to the semiconductor light-emitting device 101 of this embodiment, the second n-side electrode film 7b having high reflectance is provided in the n-side electrode 7, and furthermore, the dielectric laminated film 11 is provided, and thereby, the light emitted from the light-emitting layer 3 can be reflected with high efficiency and taken out of the device.

Comparative Example

Figure 2A:
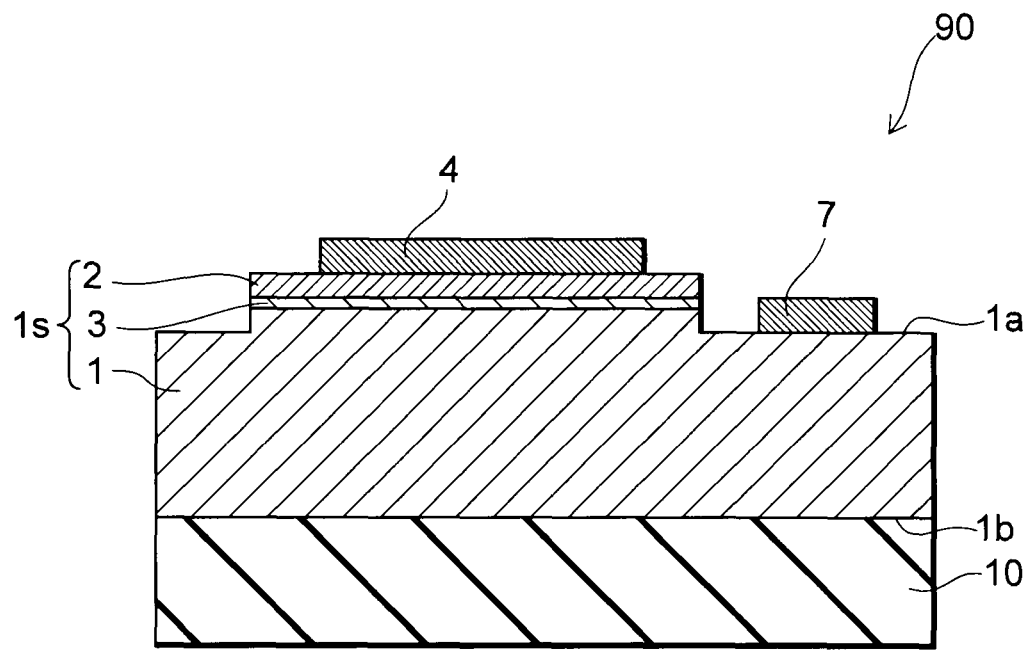
FIGS. 2A and 2B are schematic cross-sectional views illustrating the configuration of a semiconductor light-emitting device of comparative example.
Figure 2B:
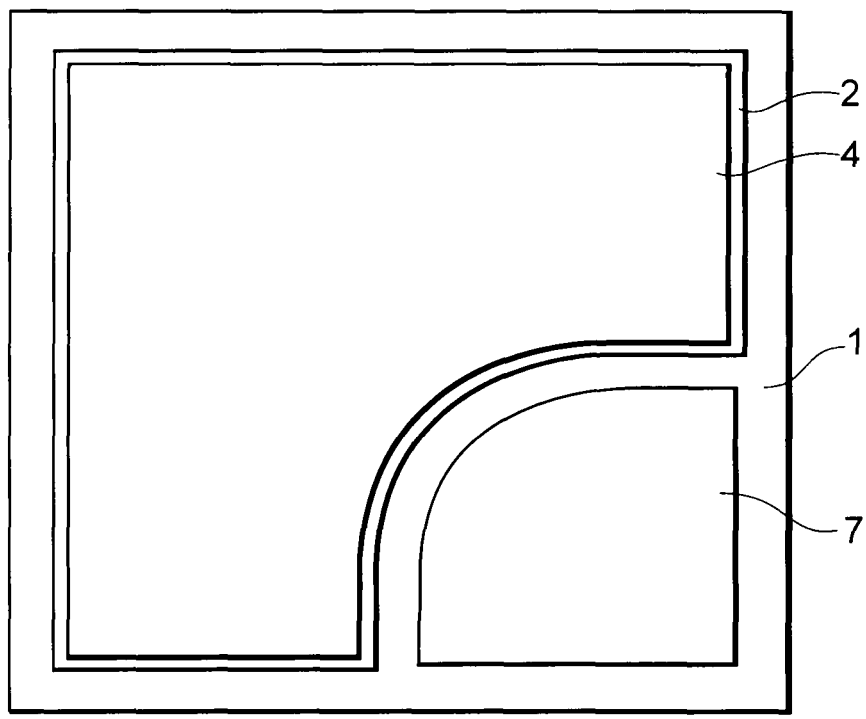

FIGS. 2A and 2B are schematic cross-sectional views illustrating the configuration of a semiconductor light-emitting device of comparative example.

As shown in FIGS. 2A and 2B, in the semiconductor light-emitting device 90 of the comparative example, the n-side electrode 7 is made of a single metal layer. And, the dielectric laminated film 11 is not formed. That is, instead of the dielectric laminated film 11, as a single-layer dielectric film, which is not shown, made of, for example, $SiO_2$ of 400 nm is formed.

Hereinafter, a method for manufacturing the semiconductor light-emitting device 90 of the comparative example will be described.

First, for forming the p-side electrode 4, a patterned lift-off resist is formed on the semiconductor layer, and part of the p-side electrode 4 made of Ag is formed with a film thickness of 200 nm on the p-type contact layer using a vacuum deposition apparatus, and sintered in a nitrogen atmosphere at 350° C. after the lift-off.

Similarly, a patterned lift-off resist is formed on the semiconductor layer, and on the n-type contact layer, a Ti/Pt/Au layer serving as the n-side electrode 7 is formed with a film thickness of 500 nm. Similarly, a patterned lift-off resist is formed on the semiconductor layer, and a Pt/Au layer serving as another part of the p-side electrode 4 is formed with a film thickness of 500 nm so as to cover the region in which the Ag layer serving as part of the p-side electrode 4 is formed.

Thus, the electrodes of the semiconductor light-emitting device 90 of Comparative example are composed.

In the semiconductor light-emitting device 90 of Comparative example, the entire surface of the n-side electrode 7 is formed from a metal for ohmic contact. In the case of using such a metal, the reflectance is not necessarily sufficiently high. Furthermore, in the ohmic contact region, reaction (alloying) is easily caused between the n-side electrode 7 and the n-type semiconductor layer 1, and this is also a factor of lowering the reflectance for the light. Moreover, in the case of mounting the main surface side having the electrodes formed on a submount or the like, the emitted light incident to the region in the main surface on which the p-side electrode 4 is not formed is absorbed by the mount material. Hence, there is room for improvement in terms of the extraction efficiency for the light emitted from the light-emitting layer 3.

By contrast, as described previously, in the semiconductor light-emitting device 101 according to this embodiment, by forming part of the n-side electrode 7 from the second n-side electrode film 7b having high reflectance and adopting the dielectric laminated film 11 having high reflection characteristics, the almost entire surface of the main surface 1a of the semiconductor layer in which the electrodes are formed is set to be a reflection structure, and thereby, the light extraction efficiency can be improved.

In the semiconductor light-emitting device 101 according to this embodiment, the current flowing between the p-side electrode 4 and the n-side electrode 7 tends to flow through the closest portion therebetween.

Accordingly, as in the specific example shown in FIGS. 1A and 1B, by placing the first n-side electrode film 7a nearer to the p-side electrode 4 than the second n-side electrode film 7b, the current can be passed more reliably between the p-side electrode 4 and the n-side electrode 7 even if the area of the first n-side electrode film 7a serving as an ohmic contact region is small.

As described above, the first n-side electrode film 7a can be provided in a portion of the n-side region 7 facing the p-side electrode 4.

That is, the portion of the n-side electrode 7 facing the p-side electrode 4 that is a region on which the current is relatively concentrated during energization is formed from the first n-side electrode film 7a having low contact resistance, and thereby, influence on electrical characteristics exerted by forming a high-efficiency reflection film (second n-side electrode film 7b) that does not necessarily have low contact resistance in the n-side electrode 7 can be suppressed to the minimum.

With regard to the current path from the second electrode 4 to the first n-side electrode film 7a of the n-side electrode, the current tends to concentrate on the region with the shortest distance between the second electrode 4 and the first n-side electrode film 7a, and hence, for relaxing the electric field concentration, it is preferable that the region with the above shortest distance out of the region in which the second electrode 4 faces the first n-side electrode film 7a is designed to be as long as possible.

Moreover, in plan view, as the length of the region in which the second electrode 4 faces the first n-side electrode film 7a increases, the number of current paths from the second electrode 4 to the first n-side electrode film 7a increases, and hence, the electric field concentration is relaxed, and the degradation of the second electrode 4 is suppressed. By considering these effects, the area and shape of the second n-side electrode film 7b and the first n-side electrode film 7a and the area and shape of the entire n-side electrode 7 can be appropriately determined.

According to the semiconductor light-emitting device 101 of this embodiment, part of the n-side electrode is made of a high-efficiency reflection film and the dielectric laminated film 11 having high reflection characteristics is adopted, and thereby, the almost entire surface of the main surface 1a of the laminated structure 1s in which the electrodes are formed is allowed to have a reflection structure, and almost all of the emitted light repeating reflection inside the semiconductor layer can be reflected to the substrate side. Hence, the light comes not to be absorbed by the mounting material, and improvement of the light extraction efficiency can be expected. Part of the n-side electrode 7 facing the p-side electrode 4 that is a region on which the current relatively concentrates during energization is formed from an electrode structure having low contact resistance, and thereby, the influence on the electrical characteristics exerted by forming a high-efficiency reflection film in the n-side electrode 7 can be suppressed to the minimum.

In the semiconductor light-emitting device 101 according to this embodiment, by using crystal on the single crystal AlN buffer, high-concentration-Si doping can be performed in the n-type GaN contact layer, and the contact resistance with respect to the first n-side electrode film 7a serving as an ohmic contact region of the n-side electrode 7 can be drastically reduced, and current spreading in the first n-side electrode film 7a can be suppressed and the current concentrates more on a region near to the p-side electrode, and hence, the n-side electrode 7 can be designed so that the ohmic contact area is decreased, and the high-efficiency reflection film area is increased, and additionally, high emission efficiency can be realized even in the shorter wavelength region than 400 nm, in which the efficiency normally lowers by reducing the crystal defects.

Moreover, when an amorphous or polycrystalline AlN layer is provided for relaxing the difference of crystal form on the sapphire substrate, the buffer layer itself becomes an absorber of the light, and hence, the light extraction efficiency of the light-emitting device comes to lower. By contrast, on the sapphire substrate 10, through a single crystal AlN buffer layer with high carbon concentration and a single crystal AlN buffer layer with high purity, the p-type first semiconductor layer 1, the light-emitting layer 3 and the n-type second semiconductor layer are formed, and thereby, the buffer layer is difficult to become an absorber of the light, and the crystal defects can be drastically reduced, and hence, the absorber in the crystal can be drastically reduced. In this case, the emitted light can repeat the reflection many times in the crystal, and the light extraction efficiency to the horizontal direction can be enhanced, and the light can be reflected efficiently to the high-efficiency reflection region of the n-side electrode 7. By these effects, improvement of emission intensity, high through-put, and low cost can be realized.

Figure 3:
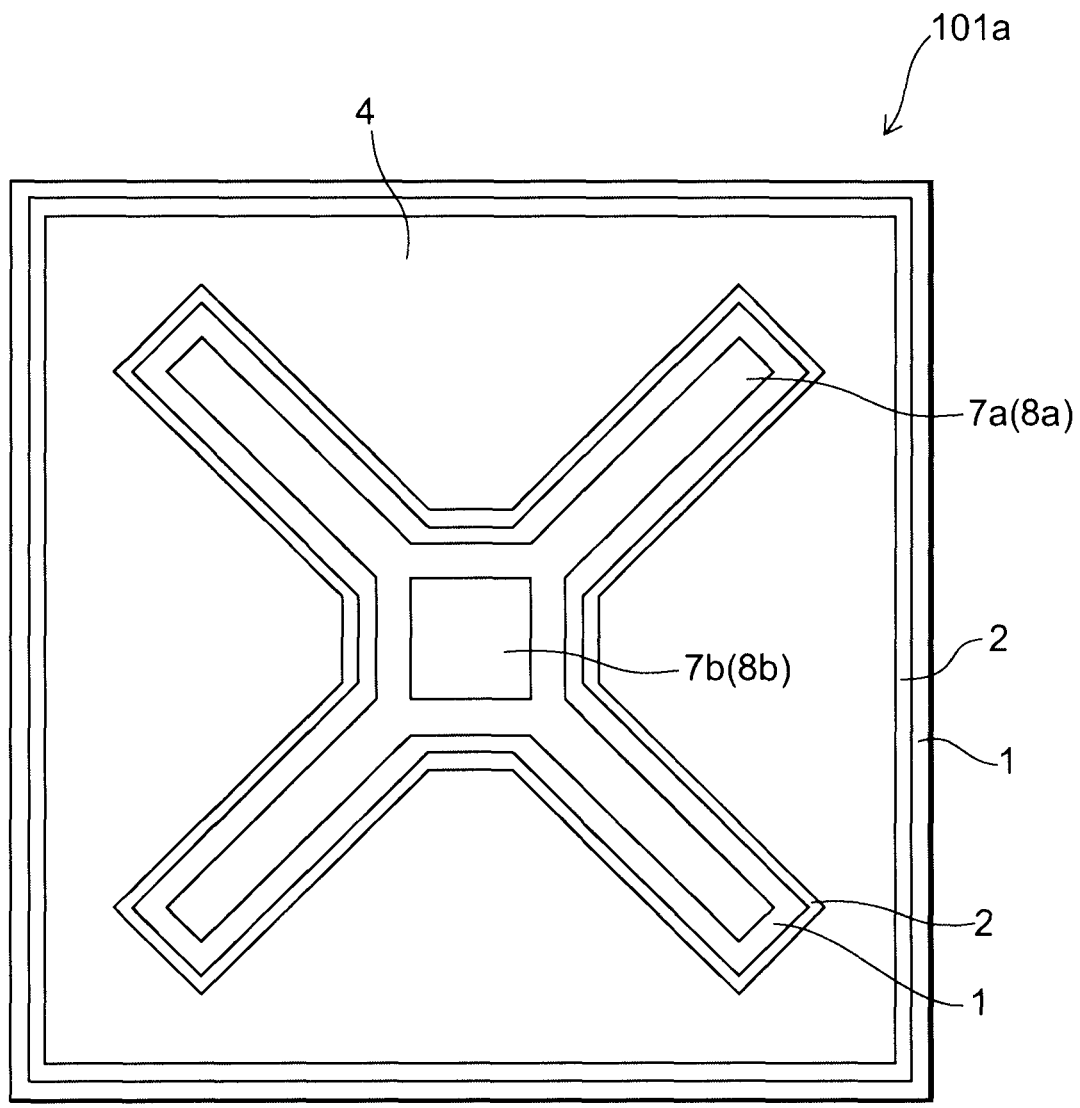
FIG. 3 is a schematic plan view showing a modified example of the semiconductor light-emitting device according to the first embodiment of the invention.

FIG. 3 is a schematic plan view showing a modified example of the semiconductor light-emitting device according to the first embodiment of the invention.

As shown in FIG. 3, in a semiconductor light-emitting device 101a of the modified example according to the first embodiment of the invention, the n-side electrode 7 is surrounded by the p-side electrode 4 and has portions extending to four directions.

In the n-side electrode 7 like this, the portions extending to four directions and the portion facing the p-side electrode 4 are formed from the first n-side electrode film 7a serving as an ohmic contact region. Moreover, the central portion of the n-side electrode 7 is formed from the second n-side electrode film 7b having high reflectance.

According to the semiconductor light-emitting device 101a having such a configuration, the ohmic contact is ensured in the portion facing the p-side electrode 4, and the current can be flowed evenly over the entire device efficiently, and the region for wire bonding or bump is ensured in the central portion of the n-side electrode 7, and light can be reflected with high reflectance in this portion.

Figure 4:
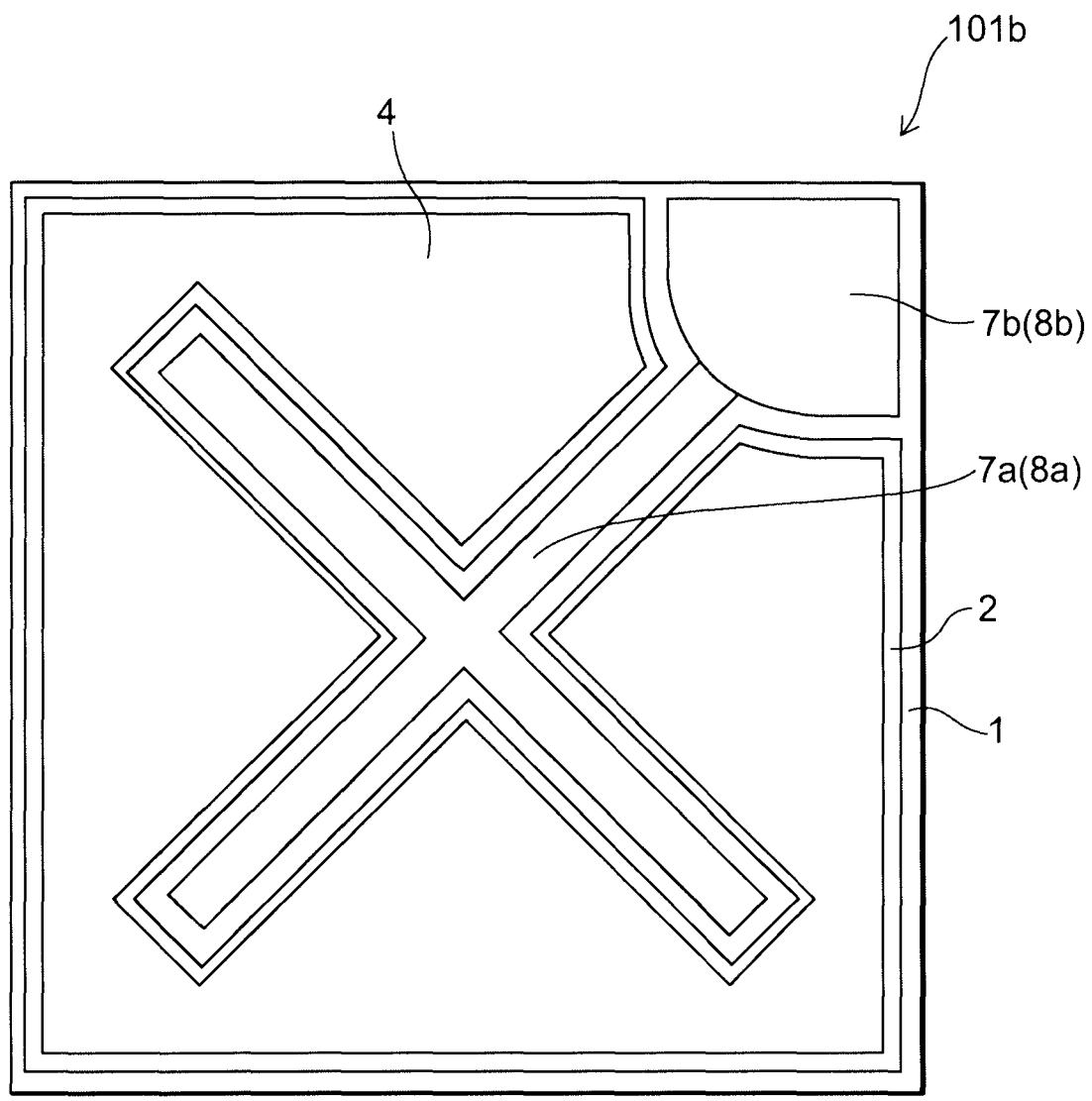
FIG. 4 is a schematic plan view showing a modified example of the semiconductor light-emitting device according to the first embodiment of the invention.

FIG. 4 is a schematic plan view showing a modified example of the semiconductor light-emitting device according to the first embodiment of the invention.

As shown in FIG. 4, in the semiconductor light-emitting device 101b of another modified example according to the first embodiment of the invention, the region for wire bonding or bump out of the n-side electrode 7 is provided at a corner of the device. The n-side electrode 7 has portions extending to four directions so as to cut into the p-side electrode 4.

In the n-side electrode 7 having such a configuration, the portion extending in the p-side electrode is formed from the first n-side electrode film 7a, and the corner portion for wire bonding or bump is formed from the second n-side electrode film 7b.

According to the semiconductor light-emitting device 101b having such a configuration, the current can be evenly flowed efficiently throughout entire device, and the light emitted from the light-emitting layer can be reflected with high reflectance at the second n-side electrode film 7b to be taken out.

As shown in FIGS. 1A, 1B, 3, and 4, the n-side electrode region through which the current injected from the outside of the semiconductor light-emitting device into the p-side electrode 4 and flowing through the semiconductor layer to the n-side electrode 7 is taken out to the outside of the semiconductor light-emitting device has no other choice than to be designed to be large in order to form wire bonding or bump for the contact between the semiconductor light-emitting device and the external terminal. However, its entire region is not required to have ohmic characteristics, and most of the region thereof may be the n-side electrode 7 having high-efficiency reflection characteristics.

In this case, if the n-side electrode region having ohmic characteristics outside this region can be ensured as in the semiconductor light-emitting device 101b, the entire region for taking out the light to the outside of the semiconductor light-emitting device can be turned into the high-efficiency reflection film.

It is noted that the size of the pad required for bonding in the n-side electrode 7 is, for example, approximately 50 μm to 150 μm.

On the other hand, the dielectric laminated film 11 has a higher reflectance and a wider margin with respect to the film thickness or the wavelength as the refractive index ratio of the combined dielectric materials is larger or as the number of combinations (number of pairs) of the layers having different refractive indices is larger.

Figure 5A:
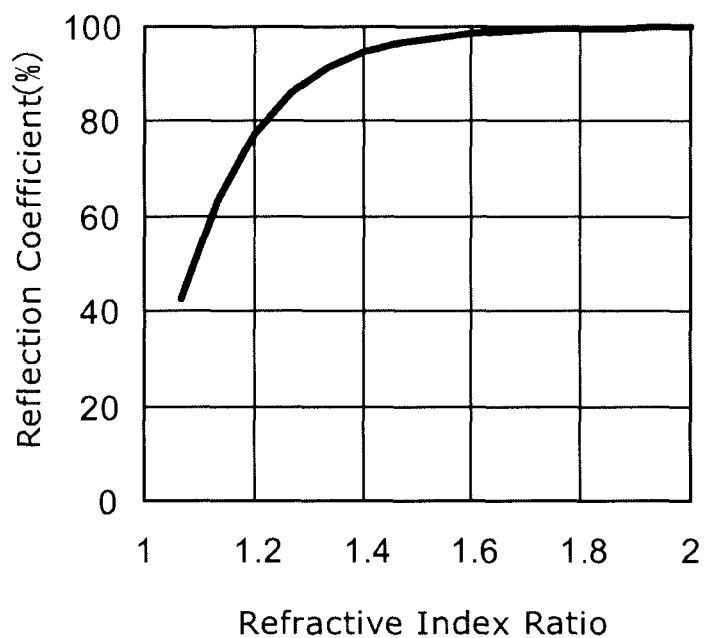
FIGS. 5A and 5B are graphic views illustrating characteristics of the semiconductor light-emitting device according to the first embodiment of the invention.
Figure 5B:
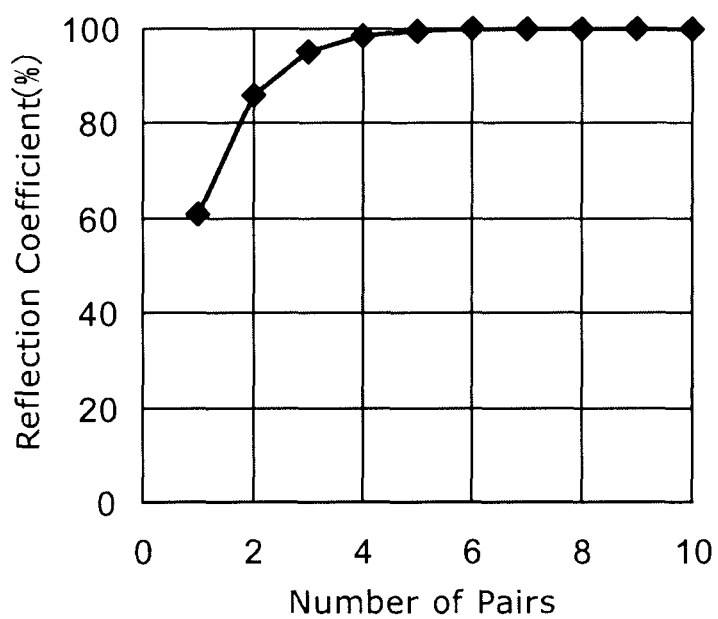

FIGS. 5A and 5B are graphic views illustrating characteristics of the semiconductor light-emitting device according to the first embodiment of the invention.

That is, FIGS. 5A and 5B illustrate simulation results relating to the reflectance of the emitted light incident perpendicularly to the dielectric laminated film 11 from the GaN layer, and FIG. 5A illustrates refractive index ratio dependency of the reflectance, and FIG. 5B illustrates pair number dependency of the reflectance. The horizontal axis of FIG. 5A represents the refractive index ratio of two kinds of combined dielectric materials in the dielectric laminated film 11, and the horizontal axis of FIG. 5B represents the number of pairs of two kinds of combined dielectric materials in the dielectric laminated film 11, and the vertical axes of FIGS. 5A and 5B represent the reflectance.

In the simulation, using a physical property value of the material of the dielectric laminated film 11 of the semiconductor light-emitting device 101 described previously, each of the parameters is varied.

As shown in FIGS. 5A and 5B, in each of the conditions of the refractive index ratio and the number of the pairs, the reflectance near to 100% can be obtained by appropriately selecting the conditions.

For example, as shown in FIG. 5A, for setting the reflectance to be 95% or more, it is desirable that the refractive index ratio is 1.4 or more.

Moreover, as shown in FIG. 5B, for setting the reflectance to be 95% or more, it is desirable that the number of the pairs is 3 or more.

As the angle of incident with respect to the dielectric laminated film 11 from the GaN layer is more inclined from the verticality, the reflectance increases, and the light is totally reflected at a certain threshold angle.

Considering these properties, the dielectric laminated film 11 functioning as a reflection film having higher performance than a metal reflection film is adopted by selecting the design condition, and hence improvement of the light extraction efficiency is expected. In the semiconductor light-emitting device 101 according to this embodiment, the design reflectance of the dielectric laminated film 11 is 99.7%.

For the dielectric laminated film 11, oxide, nitride, oxynitride or the like of silicon (Si), aluminum (Al), zirconium (Zr), titanium (Ti), niobium (Nb), Tantalum (Ta), magnesium (Mg), hafnium (Hf), cerium (Ce), zinc (Zn), or the like can be used. It is preferable that the total film thickness of the dielectric films to be laminated is 50 nm or more for ensuring insulation and 1000 nm or less for suppressing cracks of the dielectric films. In particular, for suppressing the stress between heterogeneous materials due to heating during operating the device, it is preferable that the first layer in the semiconductor layer side of the dielectric laminated film 11 is a material having a linear expansion coefficient near to that of the semiconductor layer. For example, when the semiconductor layer is made of GaN, it is preferable that as the first layer in the semiconductor layer side of the dielectric laminated film 11, for example, SiN is used.

In the dielectric laminated film 11, laminating different kinds of dielectric materials enables the stress applied to the inside to be relaxed, and hence, even if the total film thickness increases, damage such as break or crack is difficult to be caused in comparison to the case of a single-layer. Moreover, the stress with respect to the semiconductor layer can also be relaxed, and hence, the reliability is improved. In particular, laminating the dielectric materials having tensile stress and compressive stress promotes the stress-relaxing effect.

As described above, in the semiconductor light-emitting device 101 according to this embodiment, part of the n-side electrode 7 is formed from the second n-side electrode film 7b having high reflectance, and furthermore, the dielectric laminated film 11 having high reflection characteristics is adopted, and thereby, the almost entire surface of the main surface 1a of the semiconductor layer in which the electrodes are formed is allowed to have a reflection structure. Thereby, in performing flip chip mount, almost all of the emitted light repeating the reflection inside the semiconductor layer can be reflected to the substrate side, and hence, the light comes not to be absorbed by the mounting material, and improvement of light extraction efficiency can be expected.

The semiconductor light-emitting device 101 according to this embodiment is made of the semiconductor layer including at least the n-type semiconductor layer, the p-type semiconductor layer, and the light-emitting layer sandwiched between them, and the material of the semiconductor layer is not particularly limited, but gallium nitride compound semiconductor such as $Al_xGa_{1-x-y}In_yN$ (x≥0, y≥0, x+y≤0) is used. The method for forming these semiconductor layers is not particularly limited, but techniques such as metal organic chemical vapor deposition and molecular beam epitaxial growth can be used.

Moreover, in the semiconductor light-emitting device according to this embodiment, the substrate material is not particularly limited, but a general substrate such as sapphire, SiC, GaN, GaAs, Si can be used. The substrate may be finally removed.

Second Embodiment

Figure 6:
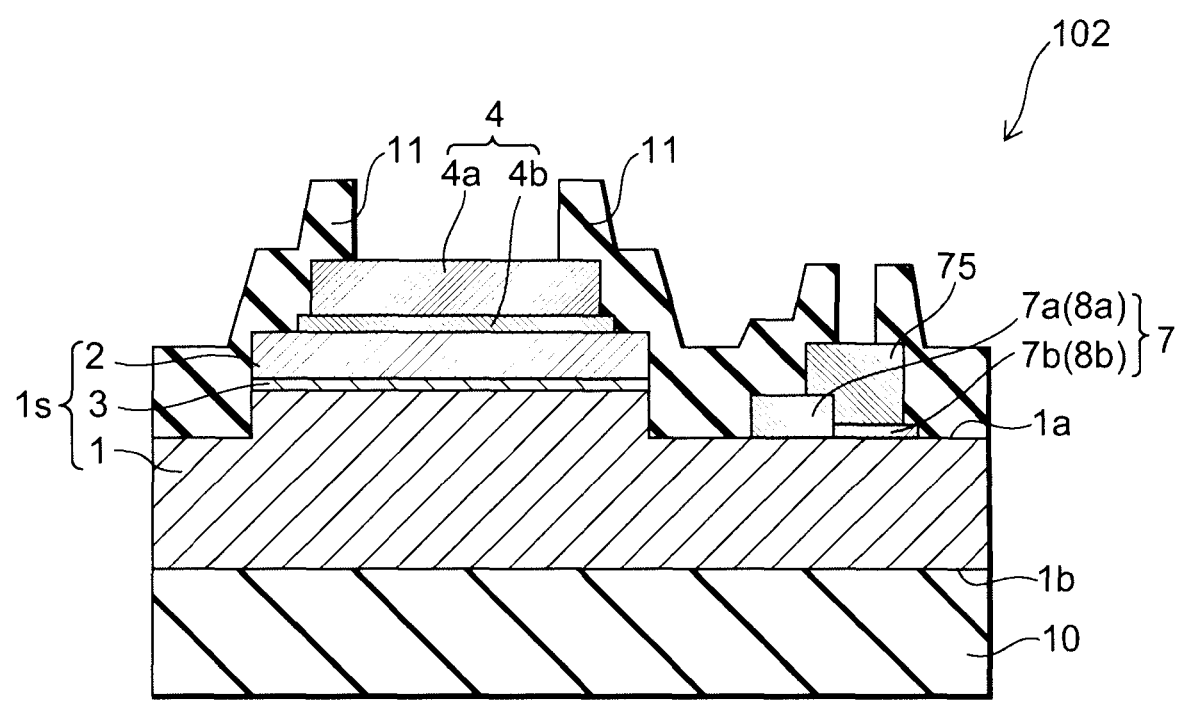
FIG. 6 is a schematic cross-sectional view illustrating the configuration of a semiconductor light-emitting device according to a second embodiment of the invention.

FIG. 6 is a schematic cross-sectional view illustrating the configuration of a semiconductor light-emitting device according to a second embodiment of the invention.

As shown in FIG. 6, in the semiconductor light-emitting device 102 according to the second embodiment of the invention, an n-side pad (first pad) 75 is provided on the n-side electrode 7, and the p-side electrode 4 has a second p-side electrode film (fourth metal film) 4b provided on the p-side semiconductor 2 and serving as a high-efficiency reflection film, and a first p-side electrode film (third metal film) 4a provided on the second p-side electrode film 4b and being made of a metal not necessarily requiring the high-efficiency reflection characteristics. The other configurations can be the same as the semiconductor light-emitting device 101 illustrated in FIGS. 1A and 1B, and hence, the description thereof will be omitted.

That is, the p-side electrode 4 has the first p-side electrode film 4a and the second p-side electrode film 4b provided between the first p-side electrode film 4a and the second semiconductor layer 2 and having a higher reflectance for the light emitted from the light-emitting layer 3 than the first p-side electrode film 4a.

As described above, in the semiconductor light-emitting device 102 according to this embodiment, the n-side pad 75 is provided on the n-side electrode 7, and hence, the electrode area required for bonding or bump formation can be obtained, and the electrical characteristics become stable. Furthermore, the natural oxidation of the second n-side electrode film 7b can be prevented, and life of the device is improved.

Because the second p-side electrode film 4b that is a high-efficiency reflection film is provided on the side of the p-type semiconductor layer 2 of the p-side electrode 4, the reflectance is further improved. And, on the second p-side electrode film 4b, the first p-side electrode film 4a that does not require the high efficiency reflection characteristics and can prevent the second p-side electrode film 4b from being oxidized or sulfurated by blocking the second p-side electrode film 4b from the outside air, and thereby, high reliability can be obtained.

The second p-side electrode film 4b can include at least any one of silver, aluminum, and an alloy containing any one thereof. That is, the second p-side electrode film 4b may be a single-layer of silver or aluminum, or may be an alloy layer containing silver or aluminum and a metal other than them.

The second p-side electrode film 4b can be made of the same material as the second n-side electrode film 7b.

Moreover, the first p-side electrode film 4a is made of a metal not containing silver and aluminum and is in electrical contact with the second p-side electrode film 4b. The material of the first p-side electrode film 4a is not particularly limited, but may be a single-layer film or multilayer film of metal, an alloy layer of metal, a single-layer film or multilayer film of conductive oxide film, or a combination thereof. The film thickness of the first p-side electrode film 4a is not particularly limited, but can be selected in the range of, for example, 100 nm to 1000 nm.

The reflection efficiency of a normal single-layer metal film for the visible light band has tendency of lowering in the ultraviolet band of 400 nm or less as the wavelength becomes shorter, however silver and aluminum have high reflection efficiency characteristics also for the light in the ultraviolet band of 370 nm or more 400 nm or less. Therefore, when the second p-side electrode film 4b is made of an alloy of silver or aluminum in the semiconductor light-emitting device of the ultraviolet emission, it is preferable that the second p-side electrode film 4b on the semiconductor interface side has a larger component ratio of at least any one of silver and aluminum. It is preferable that the film thickness of the second p-side electrode film 4b is 100 nm or more for ensuring the reflection efficiency for light.

When at least any one of silver, aluminum, and an alloy containing any one thereof is used for the second p-side electrode film 4b, as the distance between the second p-side electrode film 4b and the n-side electrode 7 increases, the risks of insulation fault and breakdown voltage failure due to migration of silver or aluminum, or the alloy of any one thereof are reduced. When the p-side electrode 4 facing the n-side electrode 7 in the vicinity of the center of the device is formed to the end of the p-type contact layer as far as the process condition such as exposure accuracy allows, the light extraction efficiency increases. With regard to the current path from the second p-side electrode film 4b to the first n-side electrode film 7a of the n-side electrode 7, the current tends to concentrate on the region with the shortest distance between the second p-side electrode film 4b and the first n-side electrode film 7a, and hence, for relaxing the electric field concentration, it is preferable that the region with the above shortest distance out of the region in which the second p-side electrode film 4b faces the first n-side electrode film 7a is designed to be as long as possible.

Moreover, in plan view, as the length of the region in which the second p-side electrode film 4b faces the first n-side electrode film 7a becomes larger, the number of current paths from the second p-side electrode film 4b to the first n-side electrode film 7a increases, and hence, the electric field concentration is relaxed, and the degradation of the second p-side electrode film 4b is suppressed. By considering these effects, the area and shape of the second p-side electrode film 4b and the distance between the second p-side electrode film 4b and the first n-side electrode film 7a can be appropriately determined.

On the other hand, it is preferable that the pad of the n-side electrode 7 covers the entirety of the second n-side electrode film 7b to block the second n-side electrode film 7b from the outside air. Moreover, at least part of the pad is in electrical contact with the first n-side electrode film 7a. The film thickness of the pad is not particularly limited, but can be selected in the range of, for example, 100 nm to 5000 nm. Forming the n-side pad 75 provides an electrode area required for bonding or bump formation and additionally, can prevent natural oxidation of the second p-side electrode film 7b to improve the device lifetime.

Next, one example of a method for forming the n-side electrode 7, the p-side electrode 4, and the dielectric laminated film 11 on the semiconductor layer in the semiconductor light-emitting device 102 according to this embodiment will be described.

Figure 7A:
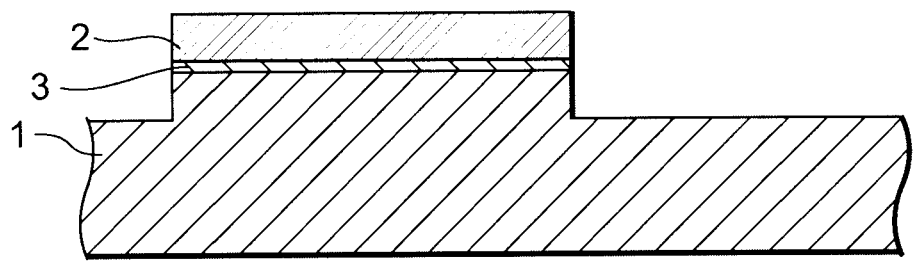
FIGS. 7A to 7C are schematic cross-sectional views by step sequence illustrating a method for manufacturing the semiconductor light-emitting device according to the second embodiment of the invention.
Figure 7B:
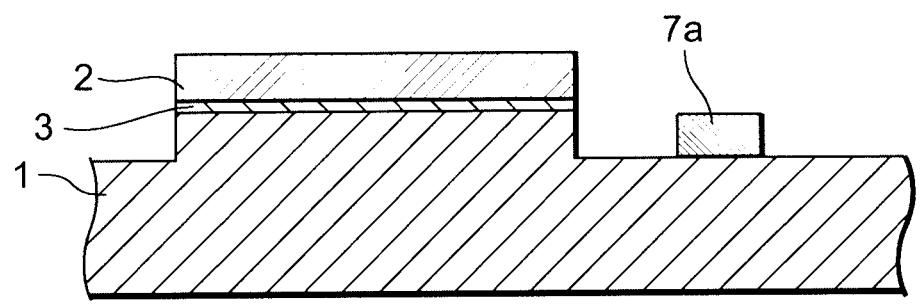
Figure 7C:
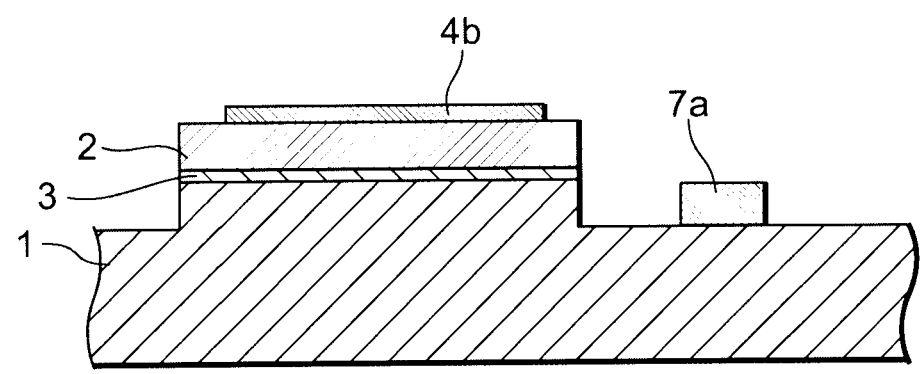

FIGS. 7A to 7C are schematic cross-sectional views by step sequence illustrating the process for manufacturing the semiconductor light-emitting device according to the second embodiment of the invention.

Figure 8A:
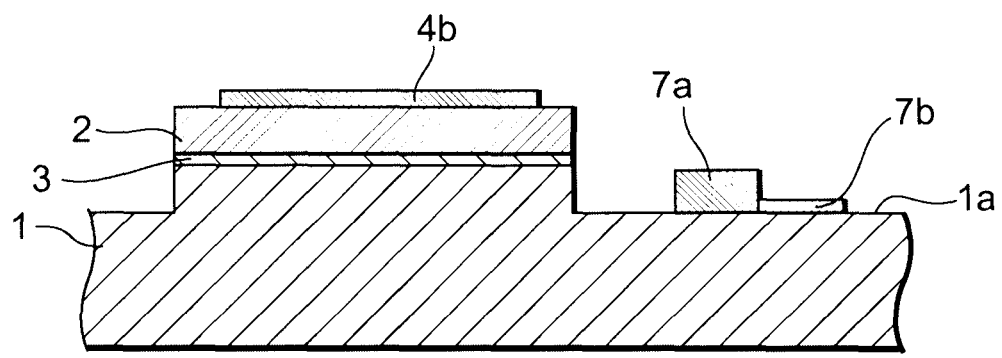
FIGS. 8A to 8C are schematic cross-sectional views by step sequence following FIGS. 7A to 7C.
Figure 8B:
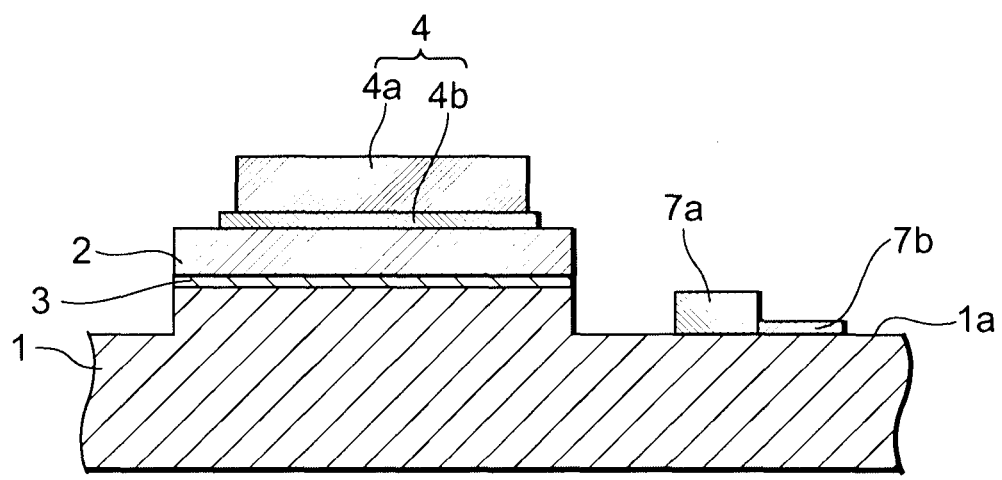
Figure 8C:
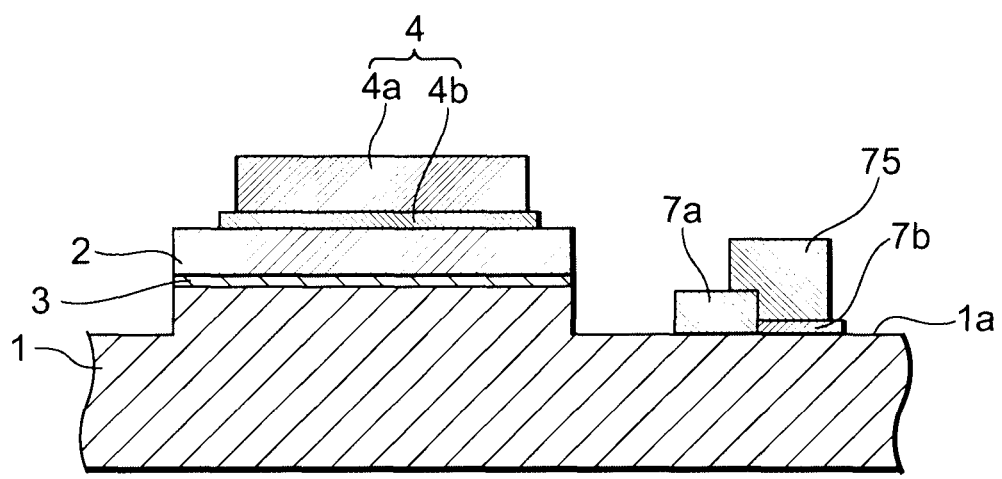

FIGS. 8A to 8C are schematic cross-sectional views by step sequence following FIGS. 7A to 7C.

First, as shown in FIG. 7A, in part of the region of the p-type semiconductor layer 2, until the above n-type contact layer is exposed, the p-type semiconductor layer 2 and the light-emitting layer 3 are removed by dry etching using a mask.

Next, as shown in FIG. 7B, the n-side electrode region having ohmic characteristics, namely the first n-side electrode film 7a is formed. That is, a patterned lift-off resist, which is not shown, is formed on the exposed n-type contact layer, and using, for example, a vacuum deposition apparatus, the first n-side electrode film 7a made of, for example, Ti/Al/Ni/Au serving as the ohmic contact region is formed with a film thickness of 500 nm, and sintered in a nitrogen atmosphere at 550° C.

Next, as shown in FIG. 7C, to form the p-side electrode 4, a patterned lift-off resist is formed on the p-type contact layer, and using, for example, a vacuum deposition apparatus, the film serving as the second p-side electrode film 4b made of Ag, for example, is formed with a film thickness of 200 nm, and sintered in a nitrogen atmosphere at 350° C. after the lift off.

Subsequently, as shown in FIG. 8A, the n-side electrode region having high-efficiency reflection characteristics is formed. That is, a lift-off resist is formed with an opening on a region on the n-type contact layer located on the opposite side of the p-side electrode 4 across the first n-side electrode film 7a that is an n-side electrode region having ohmic characteristics (not shown).

Here, considering the alignment accuracy of the pattern, part of the first n-side electrode film 7a that is an n-side electrode having ohmic characteristics in the side facing the p-side electrode 4 may be opened.

Conversely, in order that the n-side electrode having high efficiency reflection characteristics, namely, the second n-side electrode film 7b does not climb up the n-side electrode having ohmic characteristics, namely, the first n-side electrode film 7a, the both electrodes may be designed with a slight spacing therebetween in considering the alignment accuracy of the pattern.

Also, the n-side electrode having high efficiency reflection characteristics, namely, the second n-side electrode film 7b may be designed so as to cover the part or the entirety of the n-side electrode having ohmic characteristics, namely, the first n-side electrode film 7a.

And, a vacuum deposition apparatus is used to form, for example, the laminated layer of Al (thickness of approximately 0.2 to 0.5 µm)/Ni (thickness of approximately 10 to 50 µm)/Au (thickness of approximately 0.05 to 1 µm), and then the lift off is performed to form the second n-side electrode film 7b serving as a high-efficiency reflection film. In the laminated film, Al layer serves as the high-efficiency reflection film. Moreover, Au serves to protect the high-efficiency reflection film from degradation by natural oxidation or chemical treatment or the like during the device fabrication process. And, for adhesiveness improvement and alloying prevention of Al and Au, Ni is sandwiched between them.

Next, as shown in FIG. 8B, a patterned lift-off resist, which is not shown, is formed on the semiconductor layer, and the first p-side electrode film 4a illustratively made of a laminated film of Pt/Au is formed with a film thickness of 500 nm on the region provided with Ag to form the p-side electrode 4.

Furthermore, as shown in FIG. 8C, similarly, a patterned lift-off resist, which is not shown, is formed likewise on the semiconductor layer, and a laminated film of, for example, Ti/Pt/Au is formed with a thickness of 500 nm so as to cover the second n-side electrode film of the n-side electrode 7 having high-efficiency reflection characteristics and the first n-side electrode film 7a of the n-side electrode 7 having ohmic characteristics to form the n-side pad 75.

A vacuum deposition apparatus is used to form, for example, five groups of the combinations of the laminated film of $SiO_2$ and $TiO_2$, namely, the laminated film composed of ten dielectric layers in total on the semiconductor layer. The thickness of each of the $SiO_2$ film and the $TiO_2$ film is set to be $\lambda/(4\ n)$ in which n is a refractive index of each of the dielectric layers and $\lambda$ is an emission wavelength from the light-emitting layer 3.

Furthermore, thereon, a patterned resist, which is not shown, is formed, and ammonium fluoride treatment removes the dielectric laminated film so that the p-side electrode 4 and the n-side electrode 7 are exposed to form the dielectric laminated film 11 illustrated in FIG. 6.

Next, this is cut by cleavage or diamond blade or the like to be a discrete LED device, and thereby, the semiconductor light-emitting device 102 according to this embodiment is fabricated.

In the semiconductor light-emitting devices 101, 102 according to the first and second embodiments, as the area of the first n-side electrode film 7a having ohmic characteristics composing the n-side electrode 7 is larger, the operation voltage tends to decrease, because the ohmic contact region increases. However, because the current path during operation tends to concentrate on the n-side electrode facing the p-side electrode 4, namely, on the first n-side electrode film 7a, if the area of the first n-side electrode film 7a is increased to a certain extent, the decreasing rate is saturated.

On the other hand, as the area of the first n-side electrode film 7a having ohmic characteristics composing the n-side electrode 7 is smaller, the n-side electrode having high-efficiency reflection characteristics, namely, the second n-side electrode film 7b can be designed to have a large area, and hence, the light extraction efficiency is expected to increase.

Moreover, as the area of the first n-side electrode film 7a having an ohmic characteristic is smaller, the probability that the light reflected in the semiconductor light-emitting device is absorbed decreases, and hence, the light extraction efficiency is expected to increase.

Considering these, the area ratio and shape of the first n-side electrode film 7a of the n-side electrode having ohmic characteristics and the second n-side electrode 7b of the n-side electrode having high-efficiency reflection characteristics can be appropriately determined.

That is, in the semiconductor light-emitting device 102 according to this embodiment, the portion of the n-side electrode 7 facing the second p-side electrode film 4b of the p-side electrode 4 on which the current is relatively concentrated during energization is formed from the first n-side electrode film having low contact resistance, and thereby, influence on electrical characteristics exerted by forming the high-efficiency reflective film that does not necessarily have low contact resistance in the n-side electrode 7 can be suppressed to the minimum.

With regard to the current path from the second p-side electrode film 4b to the first n-side electrode film 7a of the n-side electrode 7, the current tends to concentrate on the region with the shortest distance between the second p-side electrode film 4b and the first n-side electrode film 7a, and hence, for relaxing the electric field concentration, it is preferable that the region with the above shortest distance out of the region in which the second p-side electrode film 4b faces the first n-side electrode film 7a is designed to be as long as possible.

Moreover, in plan view, as the length of the region in which the second p-side electrode film 4b faces the first n-side electrode film 7a becomes larger, the number of current paths from the second p-side electrode film 4b to the first n-side electrode film 7a increases, and hence, the electric field concentration is relaxed, and the degradation of the second p-side electrode film 4b is suppressed. By considering these effects, the area and shape of the second n-side electrode film 7b and the first n-side electrode film 7a and the area and shape of the entire n-side electrode 7 can be freely determined.

Third Embodiment

Figure 9:
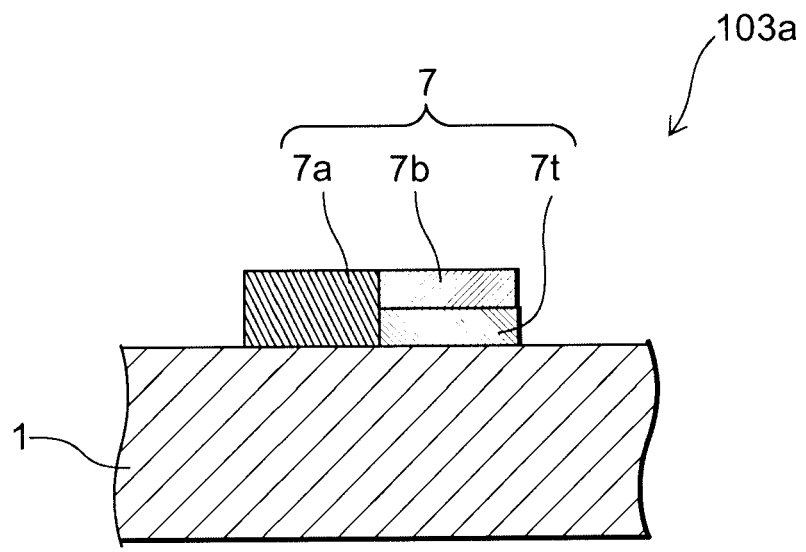
FIG. 9 is a schematic cross-sectional view illustrating the configuration of a semiconductor light-emitting device according to a third embodiment of the invention.

FIG. 9 is a schematic cross-sectional view illustrating the configuration of the semiconductor light-emitting device according to a third embodiment of the invention.

As shown in FIG. 9, in the semiconductor light-emitting device 103a according to the third embodiment of the invention, an n-side transparent electrode (transparent electrode) 7t is provided between the n-type electrode layer 1 and the second n-side electrode 7b. Other than this, this semiconductor light-emitting device can be the same as the semiconductor light-emitting devices according to the first and second embodiments, and hence, the description will be omitted. In this figure, the substrate 10 illustrated in FIG. 1, the laminated structure 1s and the p-side electrode 4 are omitted.

The n-side transparent electrode 7t contains at least one of nickel, indium tin oxide, and zinc oxide, and is in electrical contact with the n-type contact layer and the second n-side electrode film 7b. The transparent electrode refers to a material having a larger band gap than the transmitted emission wavelength or a metal film having a film thickness that is sufficiently smaller than the inverse number of the absorption coefficient at the transmitted emission wavelength.

The n-side transparent electrode 7t plays a role of transmitting the light from the light-emitting layer 3 that is reflected in the semiconductor light-emitting device and reflecting the light at the second n-side electrode 7b, a role of having contact with the n-type semiconductor layer 1 with good electrical characteristics, and a role of preventing silver or aluminum used in the first n-side electrode film 7a from reacting with the n-type semiconductor layer 1 or from diffusing into the n-type semiconductor layer 1, and hence, it is preferable that the n-side transparent electrode 7t has substantially the same shape as the second n-side electrode film 7b. The film thickness of the n-side transparent 7t is not particularly limited, but can be selected in the range of, for example, 1 nm to 500 nm.

The semiconductor light-emitting device 103a according to this embodiment having such a configuration can satisfy both of the reflection characteristic and the electrical characteristics by providing the transparent electrode in the n-side electrode 7 and high reliability can be obtained.

Figure 10:
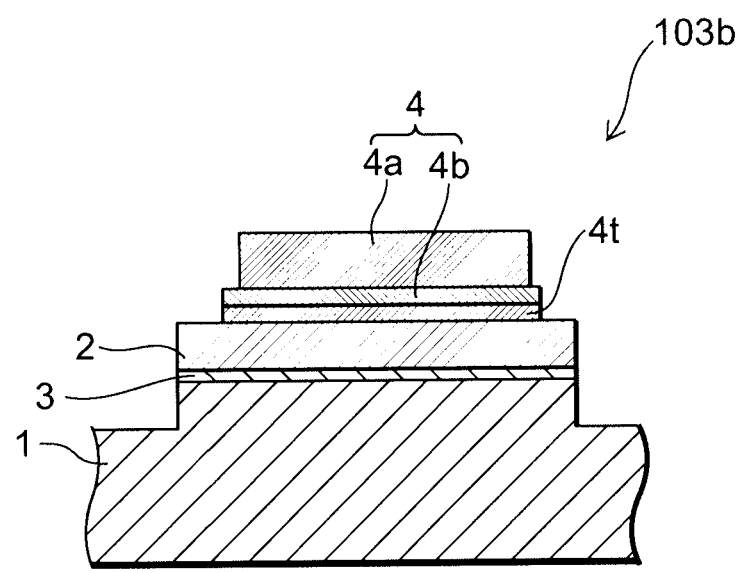
FIG. 10 is a schematic cross-sectional view illustrating the configuration of another semiconductor light-emitting device according to the third embodiment of the invention.

FIG. 10 is a schematic cross-sectional view illustrating the configuration of another semiconductor light-emitting device according to the third embodiment of the invention.

As shown in FIG. 10, in another semiconductor light-emitting device 103b according to the third embodiment of the invention, between the p-side semiconductor layer 2 and the p-side electrode 4, a p-side transparent electrode (transparent electrode) 4t is provided. Other than this, this semiconductor light-emitting device can be the same as the semiconductor light-emitting device according to the first and second embodiments, and hence, the description thereof will be omitted. In the figure, the substrate 10 and n-side electrode 7 illustrated in FIG. 1A are omitted.

The specific example illustrated in FIG. 10 is the case that the p-side electrode 4 has the second p-side electrode layer 4b, and in this case, between the p-type semiconductor layer 2 and the second p-side electrode film 4b, the p-side transparent electrode 4t is provided.

Moreover, in the specific example illustrated in FIG. 10, the p-side transparent electrode 4t is provided over the entire surface of the p-side electrode 4 (second p-side electrode film 4b), but the invention is not limited thereto, but between at least part of the p-side electrode 4 (second p-side electrode film 4b) and the p-type semiconductor layer 2, the p-side transparent electrode 4t can be provided.

The p-side transparent electrode 4t contains at least one of nickel, indium tin oxide, and zinc oxide, and is in electrical contact with the p-type contact layer and the p-side electrode 4 (the second p-side electrode film 4b).

The p-side transparent electrode 4t plays a role of transmitting the light from the light-emitting layer 3 and reflecting the light at the p-side electrode 4 (second p-side electrode film 4b), a role of having contact with the p-type semiconductor layer 2 with good electric characteristics, and a role of preventing silver or aluminum used in the second p-side electrode film 4b from reacting with the p-type semiconductor layer 2 or from diffusing into the p-type semiconductor layer 2, and hence, it is preferable that the p-side transparent electrode 4t has substantially the same shape as the p-side electrode 4 (second p-side electrode film 4b). The film thickness of the p-side transparent electrode 4t is not particularly limited, but can be selected in the range of, for example, 1 nm to 500 nm.

The semiconductor light-emitting device 103b according to this embodiment having such a configuration can satisfy both of the reflection characteristic and the electric characteristics by providing the transparent electrode in the p-side electrode 4 and high reliability can be obtained.

In the semiconductor light-emitting device according to this embodiment, the transparent electrodes may be provided in both of the n-side electrode 7 and the p-side electrode 4. Thereby, the semiconductor light-emitting device having higher light output, more stable electric characteristics and higher reliability can be realized.

That is, the semiconductor light-emitting device according to this embodiment can further comprise the transparent electrode(s) provided in at least part of at least any one between the n-type semiconductor layer and the n-side electrode 7 and between the p-type semiconductor layer 2 and the p-side electrode 4.

In any one of the semiconductor light-emitting devices 101, 101a, 101b, and 102 described previously, the transparent electrode(s) (at least any one of the n-side transparent electrode 7t and the p-side transparent electrode 4t) can be provided.

Fourth Embodiment

Figure 11:
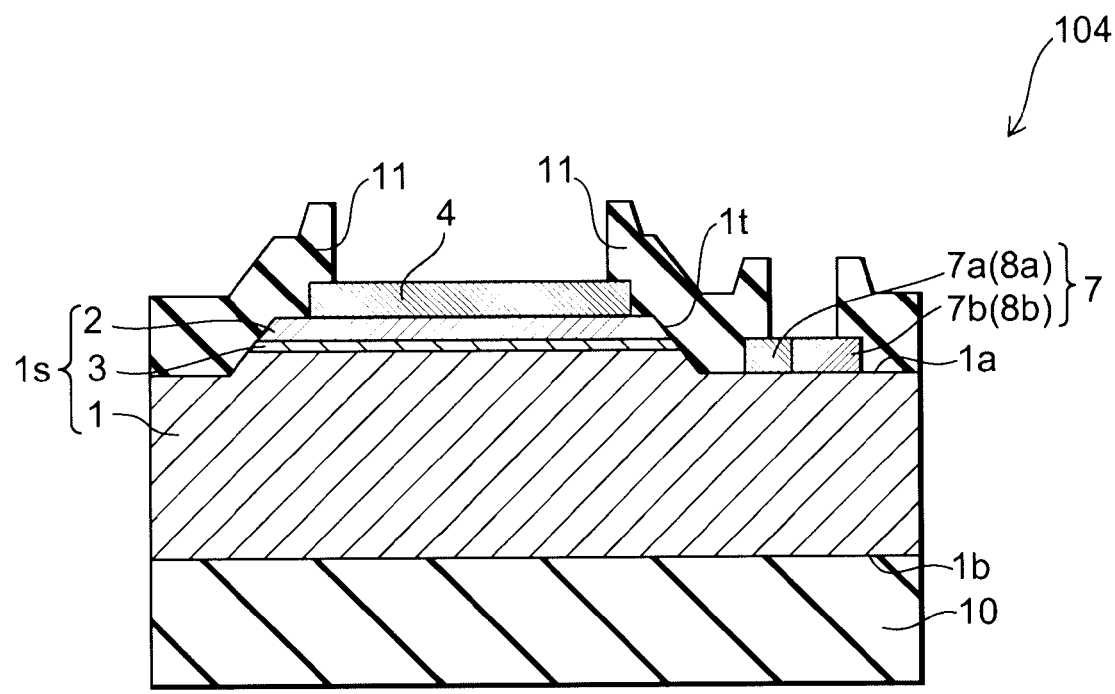
FIG. 11 is a schematic cross-sectional view illustrating the configuration of a semiconductor light-emitting device according to a fourth embodiment of the invention.

FIG. 11 is a schematic cross-sectional view illustrating the configuration of a semiconductor light-emitting device according to a fourth embodiment of the invention.

As shown in FIG. 11, in the semiconductor light-emitting device 104 according to the fourth embodiment of the invention, the semiconductor layers sandwiching the light-emitting layer 3, namely, the laminated structure 1s has a taper-shaped portion 1t that is a gradient, and therewith, the dielectric laminated film 11 obliquely coats the taper-shaped portion 1t. That is, the laminated structure 1s has the inclined taper-shaped portion 1t with respect to the layer surface of the first and second semiconductor layers 1 and 2.

Other than this, the semiconductor light-emitting device 104 can be the same as the semiconductor light-emitting device 101 according to the first embodiment, and hence, the description thereof will be omitted.

In the laminated structure 1s composed of the n-type semiconductor layer 1, the light-emitting layer 3 and the p-type semiconductor layer 2, to provide the n-side electrode 7 and the p-side electrode 4 on the same side of the main surface 1a, a step is provided between the p-type semiconductor layer 2 and the light-emitting layer 3 and the n-type semiconductor layer 1. In this case, the dielectric laminated film 11 is also provided on this step portion, however the thickness of the dielectric laminated film 11 becomes small on this step portion, and thereby, the reflection characteristics of the dielectric laminated film 11 is affected.

In this case, in the semiconductor light-emitting device 104 according to this embodiment, by forming the step portion with a tapered shape, this influence is suppressed to the extent possible and the high reflectance can be maintained.

That is, the emitted light incident to the cross section of the semiconductor layer sandwiching the light-emitting layer 3 is affected by the film thickness of the dielectric laminated film 11 formed in the vertical direction to the cross section of the semiconductor layer, and hence, becomes affected by the dielectric laminated film 11 displaced to the direction in which the film is thinner than the designed film thickness thereof in the above step portion.

In this case, by forming the step portion with a tapered shape, the influence is suppressed and high reflectance can be maintained. As the angle of the taper is smaller, that is, the slope of the taper-shaped portion 1t is looser, the dielectric laminated film in the semiconductor layer section functions as designed.

Figure 12:
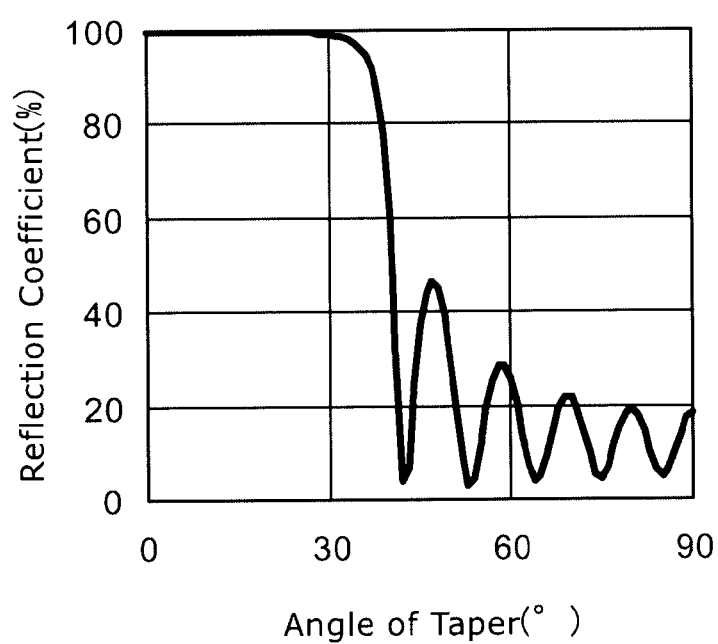
FIG. 12 is a graphic view illustrating a characteristic of the semiconductor light-emitting device according to the fourth embodiment of the invention.

FIG. 12 is a graphic view illustrating the characteristics of the semiconductor light-emitting device according to the fourth embodiment of the invention.

That is, FIG. 12 illustrates a calculation result of the relation between the angle of the taper and the reflectance of the dielectric laminated film 11, and the horizontal axis represents the angle of the taper and the vertical axis represents the reflectance of the dielectric laminated film 11. Here, the angle of the taper is an angle made by the main surface 1a of the laminated structure 1s and the surface of the taper-shaped portion 1t, and as the angle of the taper is smaller, the gradient of the slope of the taper-shaped portion 1t becomes loose, and when the angle of the taper is 90°, the step portion of the n-type semiconductor layer 1 and the p-type semiconductor layer 2 has a stair-like side surface. And, FIG. 12 illustrates the calculation result in which the design condition described in the semiconductor light-emitting device 101 according to the first embodiment is used.

As shown in FIG. 12, when the angle of the taper is approximately 40° or less, the high reflection characteristic is shown, but when the angle of the taper is larger than 40°, the high reflection characteristic as designed comes not to be shown, because the film thickness of the dielectric laminated film 11 is too small.

The margin of the high reflection characteristic with respect to the angle of this taper becomes wide with increasing refractive index ratio of the two kinds of dielectric materials to be laminated.

Moreover, providing the taper-shaped portion 1t can prevent the dielectric laminated film 11 from being disconnected by the step in the cross section of the semiconductor layer sandwiching the light-emitting layer 3.

The angle of the taper of the taper-shaped portion 1t can be appropriately determined based on the device area, emission characteristics, processing accuracy, or the like of the semiconductor light-emitting device.

Fifth Embodiment

Figure 13:
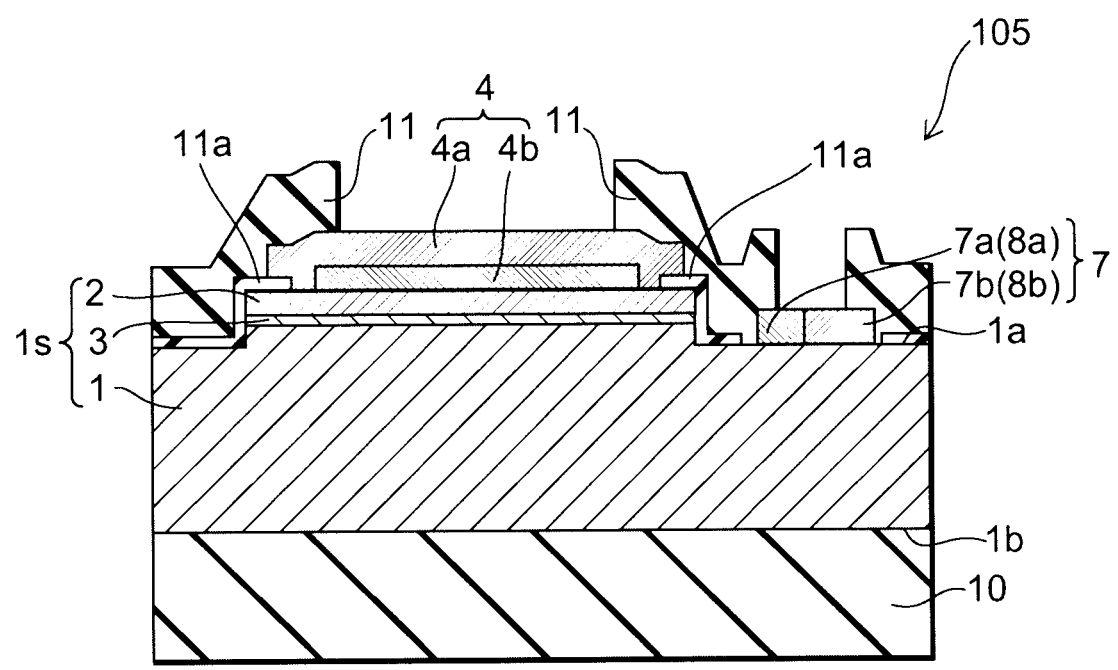
FIG. 13 is a schematic cross-sectional view illustrating the configuration of a semiconductor light-emitting device according to a fifth embodiment of the invention.

FIG. 13 is a schematic cross-sectional view illustrating the configuration of a semiconductor light-emitting device according to a fifth embodiment of the invention.

Figure 14A:
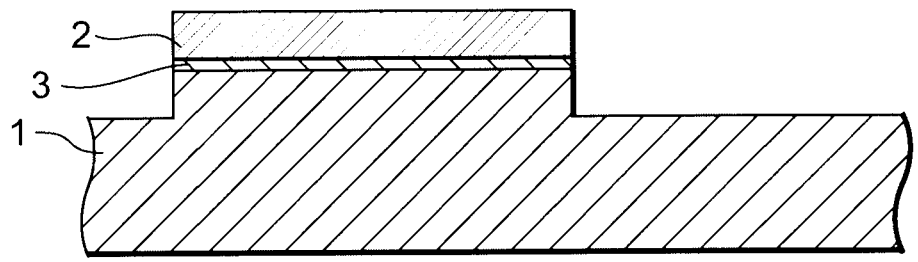
FIGS. 14A to 14C are schematic cross-sectional views by step sequence illustrating a method for manufacturing the semiconductor light-emitting device according to the fifth embodiment of the invention.
Figure 14B:
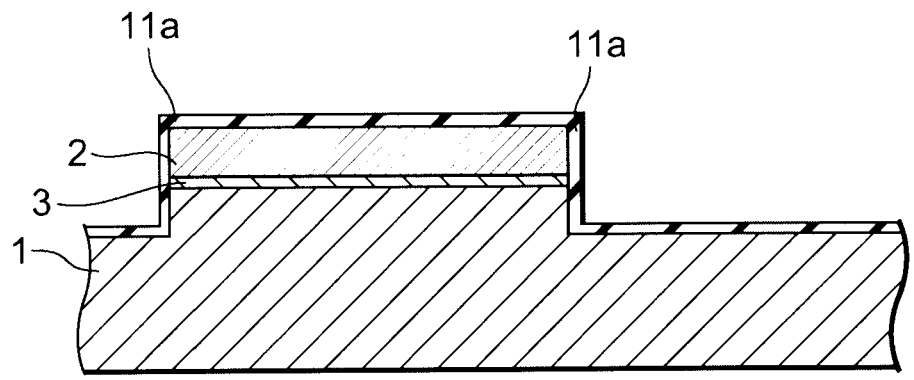
Figure 14C:
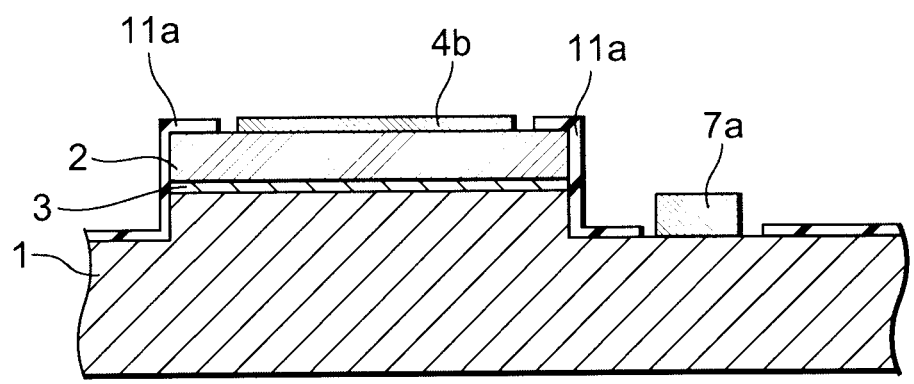

FIGS. 14A to 14C are schematic cross-sectional views by step sequence illustrating a method for manufacturing the semiconductor light-emitting device according to the fifth embodiment of the invention.

Figure 15A:
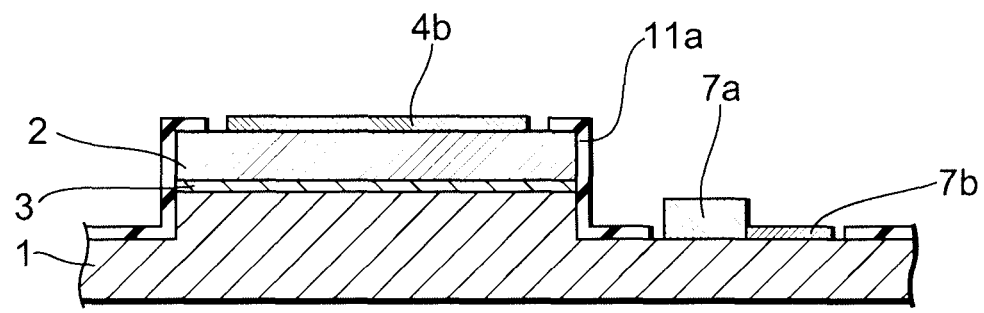
FIGS. 15A to 15C are schematic cross-sectional views by step sequence following FIGS. 14A to 14C.
Figure 15B:
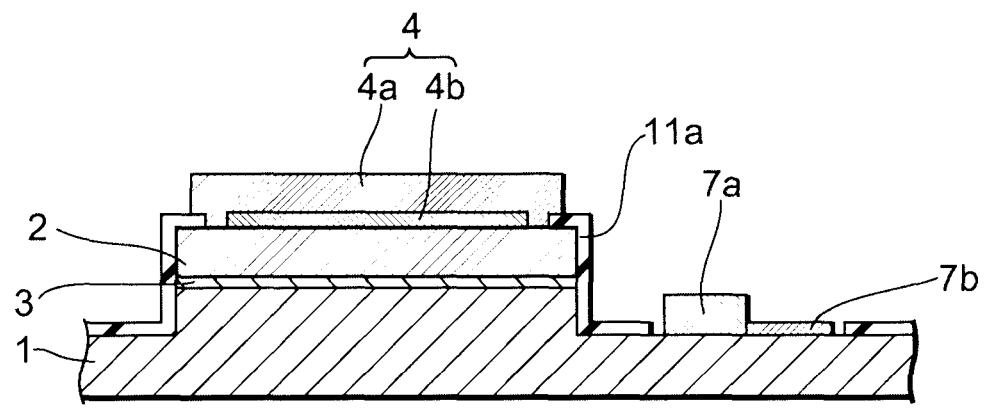
Figure 15C:
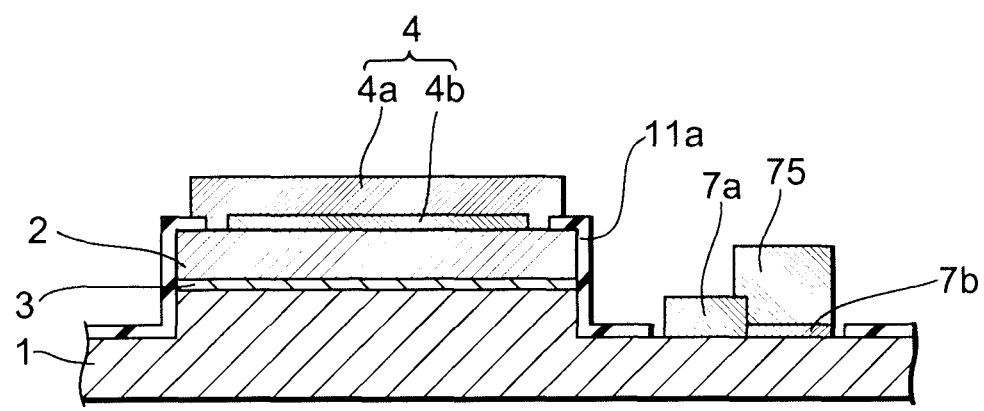

FIGS. 15A to 15C are schematic cross-sectional views by step sequence following FIGS. 14A to 14C.

Figure 16:
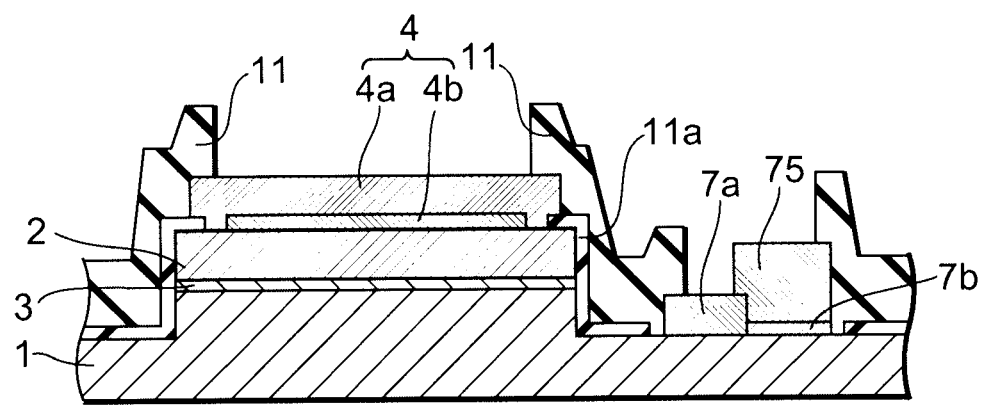
FIG. 16 is a schematic cross-sectional view by step sequence following FIGS. 15A to 15C.

FIG. 16 is a schematic cross-sectional view by step sequence following FIGS. 15A to 15C.

As shown in FIG. 13, in the semiconductor light-emitting device 105 according to the fifth embodiment of the invention, the first p-side electrode film 4a is in contact with the p-type semiconductor layer 2 (p-type contact layer) being not covered with the second p-side electrode film 4b, and a dielectric film 11a is provided on the region of the p-type contact layer other than the region being in contact with these electrodes. The first p-side electrode film 4a is provided to cover the second p-side electrode film 4b and to be in contact with part of the dielectric film 11a. The dielectric laminated film 11 described previously is provided so as to cover the dielectric film 11a and to expose part of the first p-side electrode film 4a, the first n-side electrode film 7a and the second n-side electrode film 7b.

That is, the semiconductor light-emitting device 105 further comprises the dielectric film 11a provided between the dielectric laminated film 11 and at least part of the n-side semiconductor layer 1 and the p-side semiconductor layer 2 being not covered with the n-side electrode 7 and the p-side electrode 4.

The dielectric film 11a has a projecting portion, and on the projecting portion, part of at least any one of the n-side electrode 7 and the p-side electrode 4 is provided. In this specific example, on the projecting portion, the first p-side electrode film 4a that is part of the p-side electrode 4 is provided, and the projecting portion is coated with the first p-side electrode film 4a.

Other than this, the semiconductor light-emitting device 105 can be the same as the semiconductor light-emitting device 102 according to the second embodiment, and the description thereof will be omitted.

In the semiconductor light-emitting device 105 according to this embodiment, the first p-side electrode film 4a coats the second p-side electrode film 4b, the p-type contact layer exposed between the second p-side electrode film 4b and the dielectric film 11a, and part of the dielectric film 11a.

Thereby, the second p-side electrode film 4b is coated with the first p-side electrode film 4a, and, is isolated from the outside air or the dielectric film 11a, and hence, is difficult to be exposed to moisture or ion impurities. As a result, migration, oxidation and sulfuration reaction of the second p-side electrode film 4b can be suppressed.

Moreover, the first p-side electrode film 4a is formed immediately beside the end of the second p-side electrode film 4b on the side facing the n-side electrode 7, and the current path is formed immediately beside the second p-side electrode film 4b, and hence, the current concentration on the second p-side electrode film 4b is relaxed.

At the same time, in the vicinity of the end of the dielectric film 11a facing the end of the second p-side electrode film 4b, the region sandwiched between the p-type semiconductor layer 2 and the first p-side electrode film 4a is formed, and hence, a weak electric field is applied between the p-type semiconductor layer 2 and the first p-side electrode film 4a across the dielectric film 11a. As a result, the structure in which the electric field becomes gradually weak from the second p-side electrode film 4b to the dielectric film 11a can be formed, and hence, the electric field concentration in this region can be relaxed.

Furthermore, particular ingenuity is not required for the manufacturing process, and the semiconductor light-emitting device can be formed by the same processes and the same number of the processes as conventional ones. By these effects, reduction of leak current of the semiconductor light-emitting device, improvement of insulating characteristics, improvement of breakdown voltage characteristics, improvement of emission intensity, enlargement of the life, high through-put, and low cost can be realized.

It is preferable that the electric characteristics between the first p-side electrode film 4a and the p-type contact layer serving as the uppermost layer of the p-type semiconductor layer 2 have worse ohmic characteristics than those between the second p-side electrode film 4b and the p-type contact layer, and the contact resistance is larger. Thereby, the current can be efficiently injected into the light-emitting layer 3 located immediately below the second p-side electrode film 4b, and the light emitted from immediately below the second p-side electrode film 4b can be reflected to the substrate side with high efficiency, and hence, the light extraction efficiency can be improved.

As described previously, the first p-side electrode film 4a coats the second p-side electrode film 4b, the p-type contact layer exposed between the second p-side electrode film 4b and the dielectric film 11a, and part of the dielectric film 11a, and in particular, it is preferable that the entire region of the dielectric film 11a on the side facing the n-side electrode 7 is coated.

And, it is preferable that the length that the first p-side electrode film 4a coats the dielectric film 11a is in the range of 0.5 μm to 10 μm in consideration of the pattern alignment accuracy on the manufacturing process and the area securement of the second p-side electrode film 4b functioning as the reflection film.

Hereinafter, a specific example of the method for producing the semiconductor light-emitting device 105 according to this embodiment will be described. First, as shown in FIG. 14A, in the region of part of the p-type semiconductor layer 2, until the n-type contact layer is exposed to the surface, the p-type semiconductor layer 2 and the light-emitting layer 3 are removed by dry etching using a mask.

Next, as shown in FIG. 14B, using a thermal CVD apparatus, $SiO_2$ film serving as the dielectric film 11a is formed on the semiconductor with a film thickness of 100 nm.

Next, as shown in FIG. 14C, the n-side electrode region having ohmic characteristics, namely, the first n-side electrode film 7a is formed. That is, a patterned lift-off resist, which is not shown, is formed on the semiconductor layer, and part of the $SiO_2$ film on the exposed n-type contact layer, is removed by ammonium fluoride treatment. In the region in which the $SiO_2$ film is removed, using a vacuum deposition apparatus, the first n-side electrode film 7a made of, for example, Ti/Al/Ni/Au serving as the ohmic contact region is formed with a film thickness of 500 nm, and sintered in a nitrogen atmosphere at 550° C.

Subsequently, to form the p-side electrode 4, a patterned lift-off resist, which is not shown, is formed on the semiconductor layer, and part of the $SiO_2$ film on the p-type contact layer is removed by ammonium fluoride treatment.

In this case, the treatment time of the ammonium fluoride is adjusted so that the p-type contact layer is exposed between Ag film of the second p-side electrode film 4b to be described later and the $SiO_2$ film of the dielectric film 11a. In one specific example, in the case where the etching rate is 400 nm/min, the total of the time for removing the $SiO_2$ film of the region in which Ag film is formed and the time of overetching for exposing the p-type contact layer located immediately beside the above region by a width of 1 μm is approximately 3 minutes.

In the region where the $SiO_2$ film is removed, using a vacuum deposition apparatus, as the second p-side electrode film 4b, for example, a Ag layer is formed with a film thickness of 200 nm, and sintered in a nitrogen atmosphere at 350° C. after the lift-off.

Next, as shown in FIG. 15A, the n-side electrode region having high-efficiency reflection characteristics is formed. That is, a lift-off resist is formed with an opening on the region of the n-type contact layer opposite to the p-side electrode 4 of the first n-side electrode film 7a that is the n-side electrode region having ohmic characteristics. Part of the $SiO_2$ film on the n-type contact layer is removed by the ammonium fluoride treatment, and using a vacuum deposition apparatus, for example, a film made of Al/Ni/Au is formed, and then, the lift-off is performed, and thereby, the second n-side electrode film 7b serving as a high-efficiency reflection film is formed.

Next, as shown in FIG. 15B, a patterned lift-off resist, which is not shown, is formed on the semiconductor layer, and the first p-side electrode film 4a made of, for example, Pt/Au is formed with a film thickness of 500 nm so as to coat the entire region provided with Ag is formed, the entire region of the p-type contact layer exposed to the surface that exists immediately beside the Ag region, and part of the $SiO_2$ film of the dielectric film 11a. Thereby, the p-side electrode 4 is formed.

Furthermore, as shown in FIG. 15C, a patterned lift-off resist, which is not shown, is formed likewise on the semiconductor layer, a layer made of, for example, Ti/Pt/Au is formed with a thickness of 500 nm so as to coat the second n-side electrode film 7b of the n-side electrode 7 having high-efficiency reflection characteristics and the first n-side electrode film 7a of the n-side electrode 7 having ohmic characteristics, and thereby, the n-side pad 75 is formed.

And, as shown in FIG. 16, using a vacuum deposition apparatus, the total of ten layers of five pairs of combinations of $SiO_2$ and $TiO_2$ serving as the dielectric laminated film 11 are formed on the semiconductor. The thickness of each of the films is represented to be $\lambda/(4n)$ in which n is a refractive index of each of the dielectric layers and $\lambda$ is an emission wavelength from the light-emitting layer 3. Thereon, a patterned resist is formed, and the dielectric material is removed by ammonium fluoride treatment so that the p-side electrode 4 and the n-side electrode 7 are exposed, and thereby, the dielectric laminated film 11 is formed. The dielectric laminated film 11 may be formed by a lift-off method so that the p-side electrode 4 and the n-side electrode 7 are exposed.

As described above, the semiconductor light-emitting device 105 according to this embodiment can be fabricated.

The semiconductor light-emitting device 105 according to this embodiment has a configuration in which the dielectric film 11a can be formed on the semiconductor layer before forming the first n-side electrode film 7a and the second p-side electrode film 4b, and hence, contamination attaching to the interface of the electrode and the semiconductor layer can be drastically reduced during the electrode-forming process, and thus, reliability, yield, electrical characteristics, or optical characteristics can be improved.

In the semiconductor light-emitting device 105, it is preferable that for the side portion being in contact with the p-type contact layer of the first p-side electrode film 4a, platinum (Pt) or rhodium (Rh) having high environment resistance and relatively high reflectance is used so that the side portion functions as the protective film of the second p-side electrode film 4b or the reflection film with respect to the emitted light.

When the length that the first p-side electrode film 4a coats the dielectric film 11a is large, this is advantageous on obtaining the relaxation structure of the electric field through the dielectric film 11a, but the risk of short-circuiting with the n-side electrode 7 becomes high. On the other hand, when the length is short, the risk of short-circuiting with n-side electrode 7 becomes low.

There is little influence on the reflectance of the dielectric laminated film 11 by the dielectric film 11a, and if a plurality of pairs of dielectric materials having different refractive indices are laminated in the dielectric laminated film 11, the designed reflectance can be sufficiently increased. In the semiconductor light-emitting device 105 according to this embodiment, the designed reflectance of the region with the dielectric film 11a and the dielectric laminated film 11 superposed is, for example, 99.5%.

The second n-side electrode film 7b may be formed on the dielectric film 11a without removing the $SiO_2$ film.

Sixth Embodiment

Figure 17:
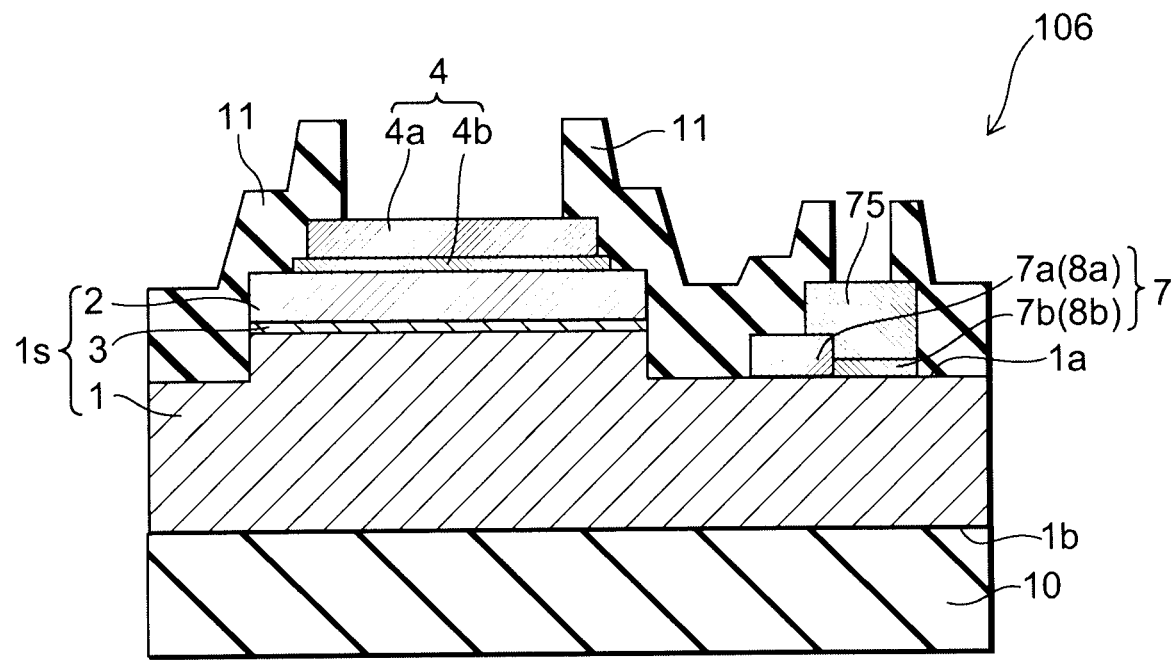
FIG. 17 is a schematic cross-sectional view illustrating the configuration of a semiconductor light-emitting device according to a sixth embodiment of the invention.

FIG. 17 is a schematic cross-sectional view illustrating the configuration of a semiconductor light-emitting device according to a sixth embodiment of the invention.

Figure 18A:
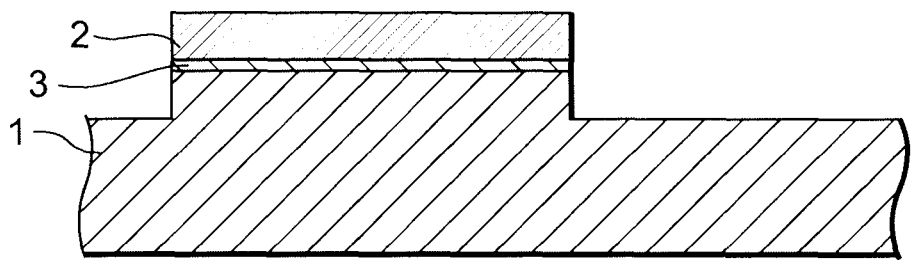
FIGS. 18A to 18C are schematic cross-sectional views by step sequence illustrating a method for manufacturing the semiconductor light-emitting device according to the sixth embodiment of the invention.
Figure 18B:
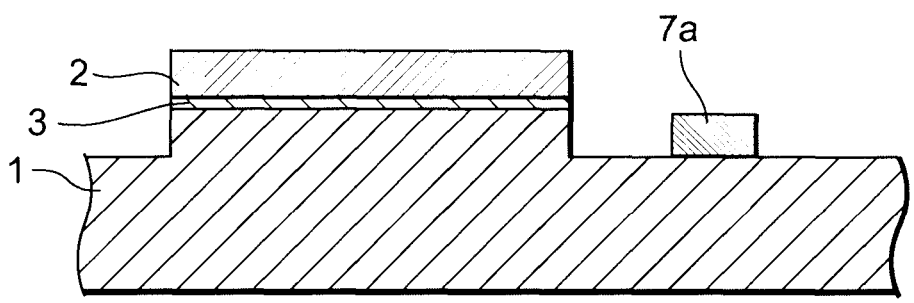
Figure 18C:
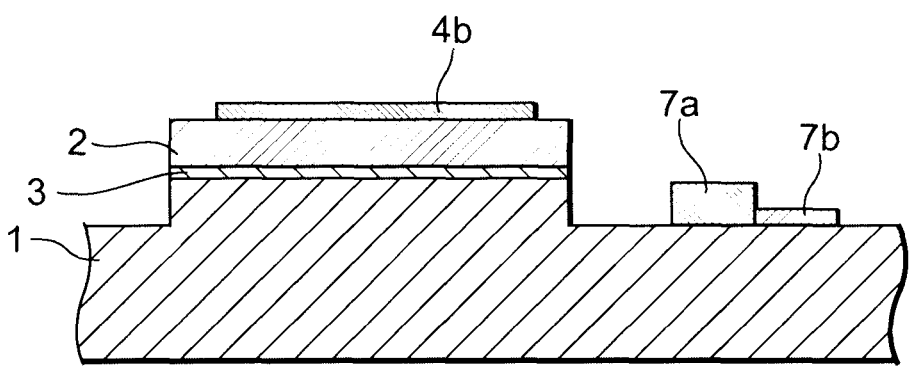

FIGS. 18A to 18C are schematic cross-sectional views by step sequence illustrating a method for manufacturing the semiconductor light-emitting device according to the sixth embodiment of the invention.

Figure 19A:
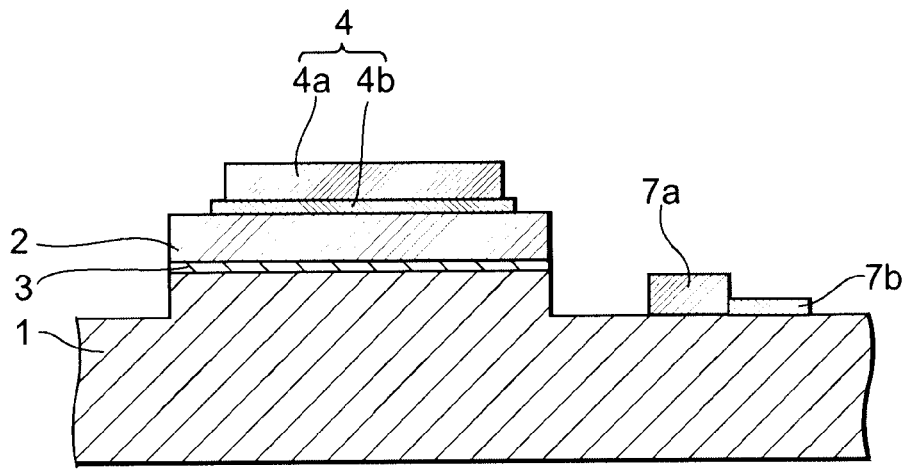
FIGS. 19A to 19C are schematic cross-sectional views by step sequence following FIGS. 18A to 18C.
Figure 19B:
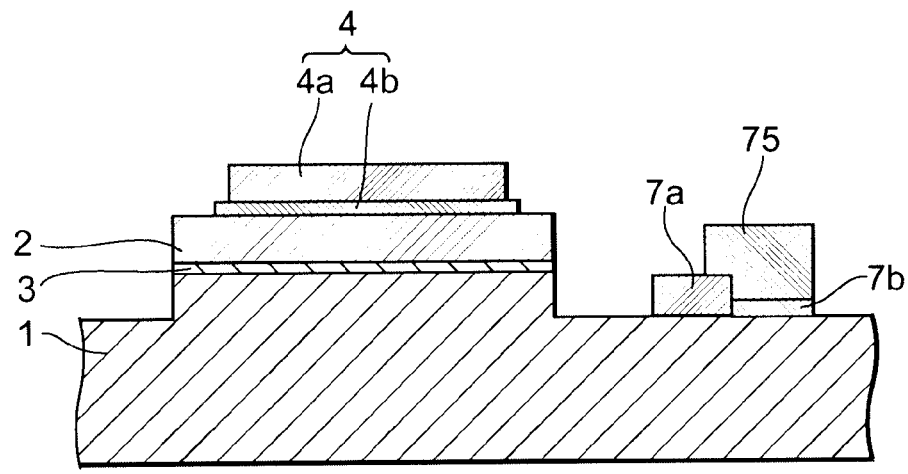
Figure 19C:
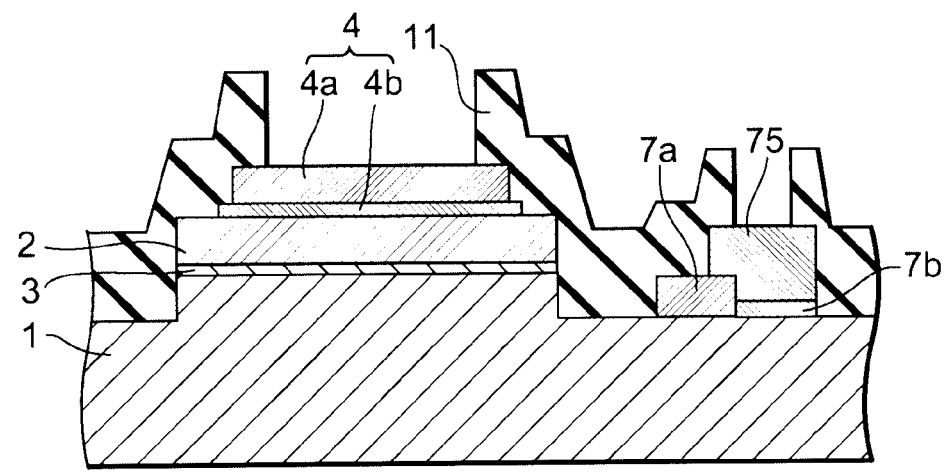

FIGS. 19A to 19C are schematic cross-sectional views by step sequence following FIGS. 18A to 18C.

As shown in FIG. 17, the configuration of the semiconductor light-emitting device 106 according to the sixth embodiment of the invention has the same as the configuration of the semiconductor light-emitting device 102 according to the second embodiment. However, in the semiconductor light-emitting device 106 according to this embodiment, the second p-side electrode film 4b is composed of the same material as the second n-side electrode film 7b.

In this case, the second p-side electrode film 4b having high-efficiency reflection characteristics of the p-side electrode 4 and the second n-side electrode film 7b having high-efficiency reflection characteristics can be formed simultaneously.

Hereinafter, the method for manufacturing the semiconductor light-emitting device 106 according to this embodiment will be described.

First, as shown in FIG. 18A, in the region of part of the p-type semiconductor layer 2, until the n-type contact layer is exposed to the surface, the p-type semiconductor layer 2 and the light-emitting layer 3 are removed by dry etching using a mask.

Next, as shown in FIG. 18B, to form the first n-side electrode film 7a of the n-side electrode region having ohmic characteristics, a patterned lift-off resist, which is not shown, is formed on the semiconductor layer. And, on the n-type contact layer, the first n-side electrode film 7a made of, for example, Ti/Al/Ni/Au is formed with a film thickness of 500 nm, and sintered in a nitrogen atmosphere at 550° C.

Subsequently, the p-side electrode 4 and the n-side electrode region having high-efficiency reflection characteristics are formed simultaneously.

That is, a lift-off resist is formed with an opening on the region of the n-type contact layer opposite to the p-type contact layer with respect to the first n-side electrode film 7a that is an n-side electrode region having ohmic characteristics and part of the p-type contact layer.

Here, considering the alignment accuracy of the pattern, part of the n-side electrode (first n-side electrode film 7a) having ohmic characteristics in the side facing the p-side electrode 4 may be opened.

Conversely, in order that the n-side electrode (second n-side electrode film 7b) having high efficiency reflection characteristics does not climb up the n-side electrode (first n-side electrode film 7a) having ohmic characteristics, the both electrodes may be designed with a slight spacing therebetween in considering the alignment accuracy of the pattern.

Furthermore, the n-side electrode (second n-side electrode film 7b) having high-efficiency reflection characteristics may be designed so as to cover the part or the entirety of the n-side electrode (first n-side electrode film 7a) having ohmic characteristics.

As shown in FIG. 18C, using a vacuum deposition apparatus, the second p-side electrode film 4b and the second n-side electrode film 7b made of, for example, Ag are formed with a thickness of 200 nm simultaneously, and sintered in a nitrogen atmosphere at 350° C.

Furthermore, as shown in FIG. 19A, a patterned lift-off resist is formed likewise on the semiconductor layer, and on the region where the second p-side electrode film 4b made of Ag is formed, the p-side electrode 4 illustratively made of Pt/Au is formed with a film thickness of 500 nm.

Next, as shown in FIG. 19B, a patterned lift-off resist is formed likewise on the semiconductor layer, and the n-side pad 75 illustratively made of Ti/Pt/Au is formed with a thickness of 500 nm so as to coat the second n-side electrode film 7b having high-efficiency reflection characteristics and part of the first n-side electrode film 7a having ohmic characteristics.

As shown in FIG. 19C, using a vacuum deposition apparatus, the total of ten layers of five pairs of combinations of $SiO_2$ and $TiO_2$ are formed on the semiconductor. The thickness of each of the films is represented by $\lambda/(4n)$ in which n is a refractive index of each of the dielectric layers and $\lambda$ is an emission wavelength from the light-emitting layer 3. Thereon, a patterned resist, which is not shown, is formed, and the dielectric material is removed by ammonium fluoride treatment so that the p-side electrode 4 and the n-side electrode 7 are exposed, and thereby, the dielectric laminated film 11 is formed. The dielectric laminated film 11 may be formed by a lift-off method so that the p-side electrode 4 and the n-side electrode 7 are exposed.

As described above, the semiconductor light-emitting device 106 according to this embodiment can be fabricated.

In the semiconductor light-emitting device 106 according to this embodiment, the second p-side electrode film 4b having high-efficiency reflection characteristics of the p-side electrode 4 and the second n-side electrode film 7b having high-efficiency reflection characteristics are composed of the same material, and can be formed simultaneously.

Thereby, the number of processes can be reduced, and the light generated in the light-emitting layer can be taken out to the outside efficiently, and hence the semiconductor light-emitting device with high through-put and low cost and the manufacturing method thereof can be provided.

Seventh Embodiment

Figure 20:
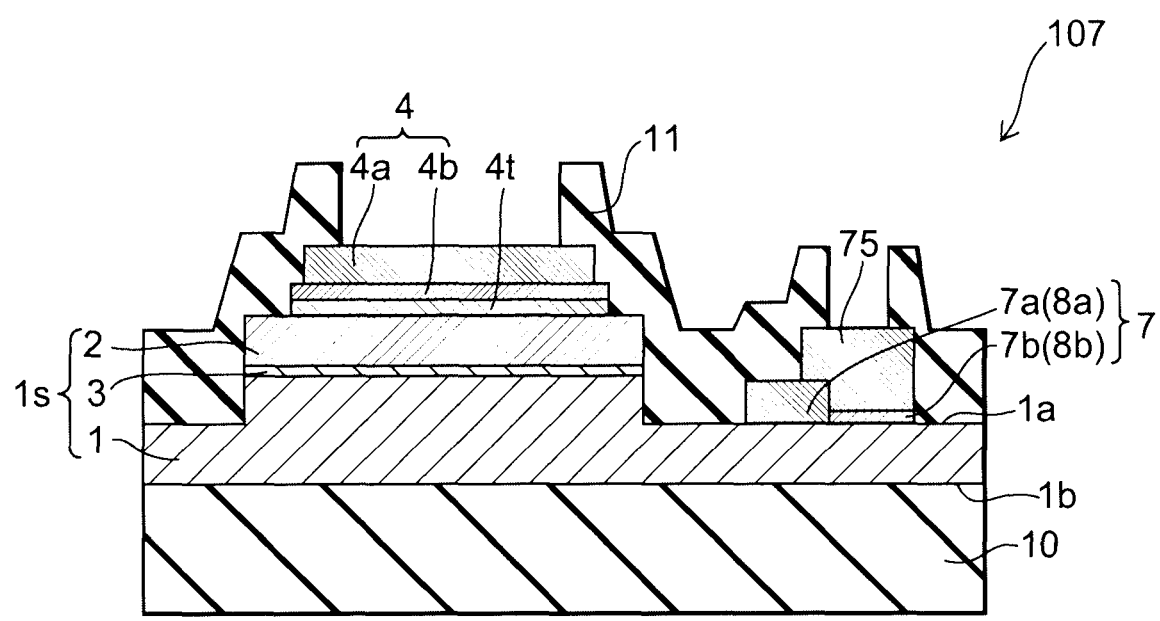
FIG. 20 is a schematic cross-sectional view illustrating the configuration of a semiconductor light-emitting device according to a seventh embodiment of the invention.

FIG. 20 is a schematic cross-sectional view illustrating the configuration of a semiconductor light-emitting device according to a seventh embodiment of the invention.

Figure 21A:
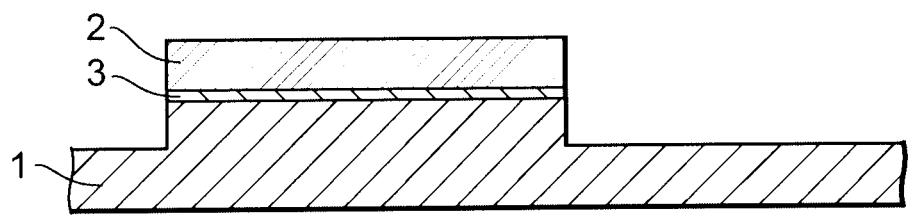
FIGS. 21A to 21C are schematic cross-sectional views by step sequence illustrating a method for manufacturing the semiconductor light-emitting device according to the seventh embodiment of the invention.
Figure 21B:
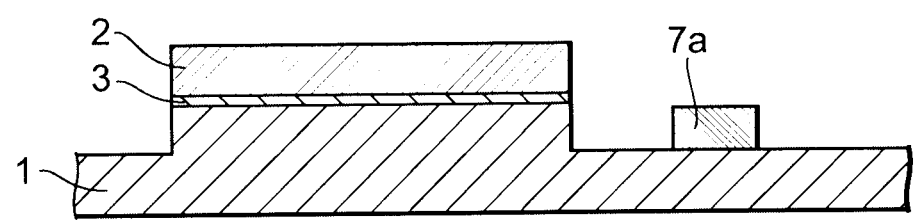
Figure 21C:
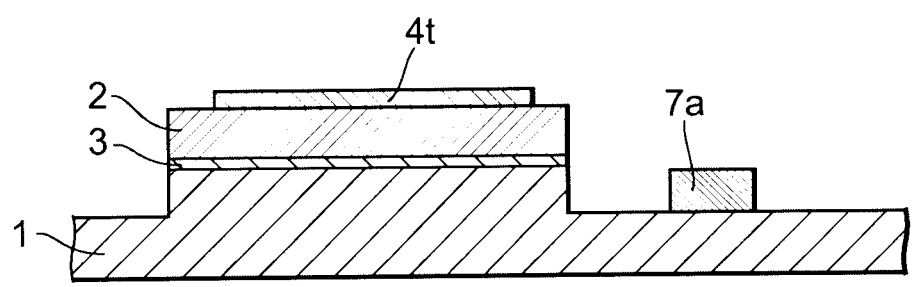

FIGS. 21A to 21C are schematic cross-sectional views by step sequence illustrating a method for manufacturing the semiconductor light-emitting device according to the seventh embodiment of the invention.

Figure 22A:
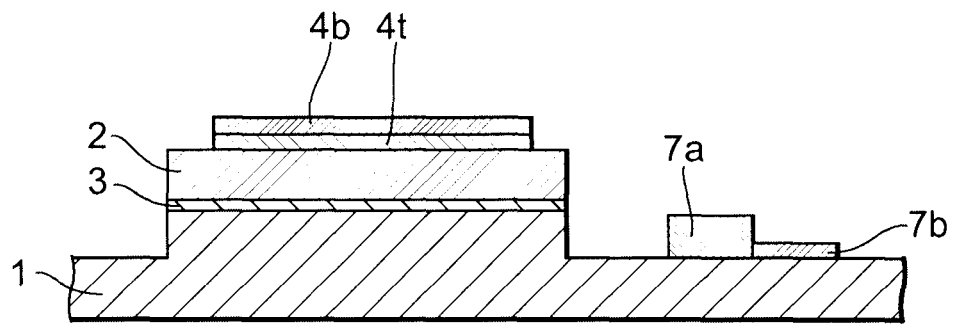
FIGS. 22A to 22C are schematic cross-sectional views by step sequence following FIGS. 21A to 21C.
Figure 22B:
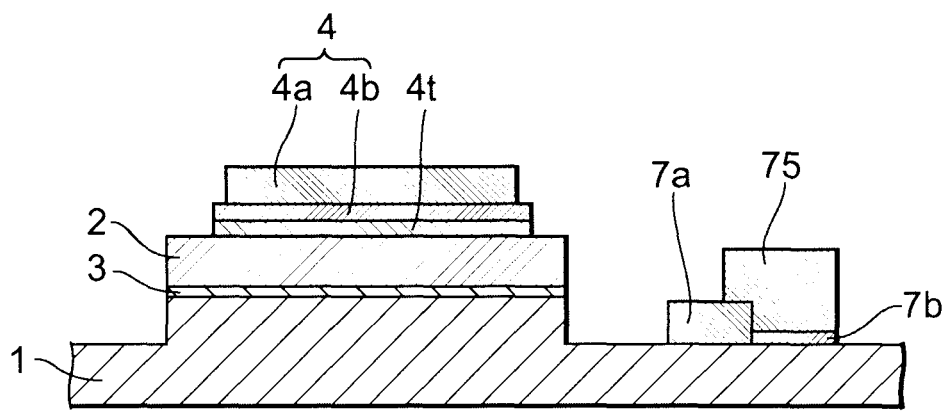
Figure 22C:
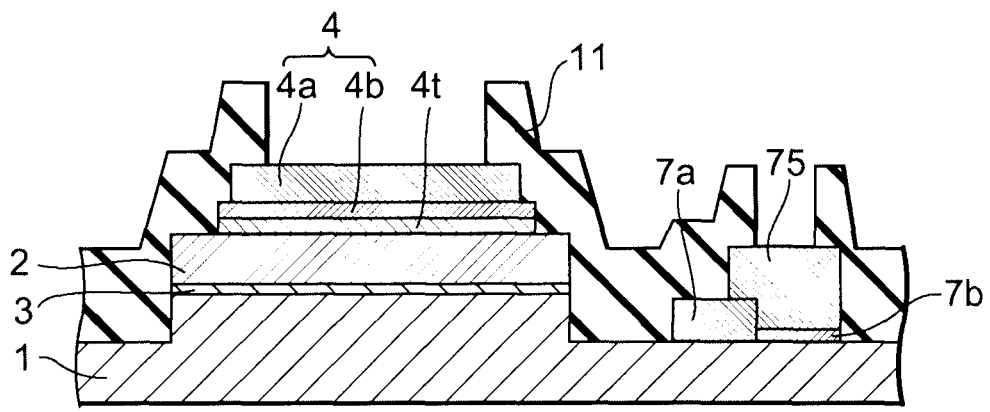

FIGS. 22A to 22C are schematic cross-sectional views by step sequence following FIGS. 21A to 21C.

As shown in FIG. 20, the semiconductor light-emitting device 107 according to the seventh embodiment of the invention is a specific example of the semiconductor device 103b according to the third embodiment. That is, the semiconductor light-emitting device 106 is provided with the p-side transparent electrode 4t between the p-side electrode 4 and the p-type semiconductor layer 2 in the semiconductor light-emitting device 102 according to the second embodiment. Other than this, the semiconductor light-emitting device 107 is the same as the semiconductor light-emitting device 102, and hence the description thereof will be omitted. Moreover, because the configuration and the effect of the p-side transparent electrode 4t have been described with respect to the third embodiment, the description thereof will be omitted.

Moreover, in the semiconductor light-emitting device 107, the second p-side electrode film 4b and the second n-side electrode film 7b having high-efficiency reflection characteristics are formed simultaneously.

Hereinafter, the method for manufacturing the semiconductor light-emitting device 107 according to this embodiment will be described.

First, as shown in FIG. 21A, in the region of part of the p-type semiconductor layer 2, until the n-type contact layer is exposed to the surface, the p-type semiconductor layer 2 and the light-emitting layer 3 are removed by dry etching using a mask.

Next, as shown in FIG. 21B, in order that the first n-side electrode film 7a of the n-side electrode region having ohmic characteristics is formed, a patterned lift-off resist, which is not shown, is formed on the semiconductor layer. And then, on the n-type contact layer, the first n-side electrode film 7a made of, for example, Ti/Al/Ni/Au is formed with a film thickness of 500 nm, and sintered in a nitrogen atmosphere at 550° C.

As shown in FIG. 21C, to form the p-side transparent electrode 45 of the p-side electrode 4, a patterned lift-off resist, which is not shown, is formed on the semiconductor layer. And then, on the p-type contact layer, using a vacuum deposition apparatus, for example, an indium tin oxide (ITO) layer serving as the p-side transparent electrode 4t is formed with a film thickness of 100 nm.

To form the high-efficiency reflection regions of the p-side electrode 4 and the n-side electrode 7 (second p-side electrode film 4b and the second n-side electrode film 7b), a lift-off resist is formed with an opening on the region of the n-type contact layer opposite to the transparent electrode 4t on the p-type contact layer with respect to the first n-side electrode film 7a that is an n-side electrode region having ohmic characteristics and on the transparent electrode 4t.

Here, considering the alignment accuracy of the pattern, part on the n-side electrode (first n-side electrode film 7a) having ohmic characteristics in the side facing the p-type contact layer may be opened.

Conversely, in order that the n-side electrode (second n-side electrode film 7b) having high-efficiency reflection characteristics does not climb up the n-side electrode (first n-side electrode film 7a) having ohmic characteristics, the both electrodes may be designed with a slight spacing therebetween in considering the alignment accuracy of the pattern.

Furthermore, the n-side electrode (second n-side electrode film 7b) having high-efficiency reflection characteristics may be designed so as to cover the part or the entirety of the n-side electrode (first n-side electrode film 7a) having ohmic characteristics.

As shown in FIG. 22A, using a vacuum deposition apparatus, the second p-side electrode film 4b and the second n-side electrode film 7b made of, for example, Al/Ni/Au are formed with a film thickness of 300 nm.

Next, as shown in FIG. 22B, a patterned lift-off resist is formed likewise on the semiconductor layer, and, for example, a Ti/Pt/Au layer is formed with a film thickness of 500 nm so as to coat the second p-side electrode film 4b, the entire high-efficiency reflection region of the n-side electrode 7, and the part of the n-side electrode 7 having ohmic characteristics. Thereby, the first p-side electrode film 4a and the n-side pad 75 of the n-side electrode 7 are formed.

As shown in FIG. 22C, using a vacuum deposition apparatus, the total of ten layers of five pairs of combinations of $SiO_2$ and $TiO_2$ are formed on the semiconductor. The thickness of each of the films is represented by $\lambda/(4n)$ in which n is a refractive index of each of the dielectric layers and $\lambda$ is an emission wavelength from the light-emitting layer 3. Thereon, a patterned resist is formed, and the dielectric material is removed by ammonium fluoride treatment so that the p-side electrode 4 and the n-side electrode 7 are exposed, and thereby, the dielectric laminated film 11 is formed. The dielectric laminated film 11 may be formed by a lift-off method so that the p-side electrode 4 and the n-side electrode 7 are exposed.

As described above, the semiconductor light-emitting device 107 according to this embodiment can be fabricated.

In the semiconductor light-emitting device 107 according to this embodiment, the high-efficiency reflection films of the p-side electrode 4 and the n-side electrode 7 (second p-side electrode film 4b and second n-side electrode film 7b) can be formed simultaneously. Moreover, the first p-side electrode film 4a of the p-side electrode 4 and the n-side pad 75 of the n-side electrode 7 can be formed simultaneously.

Thereby, the number of steps can be reduced, and the light generated in the light-emitting layer can be taken out to the outside efficiently, and the semiconductor light-emitting device with high through-put and low cost and the manufacturing method thereof can be provided.

Eighth Embodiment

Figure 23:
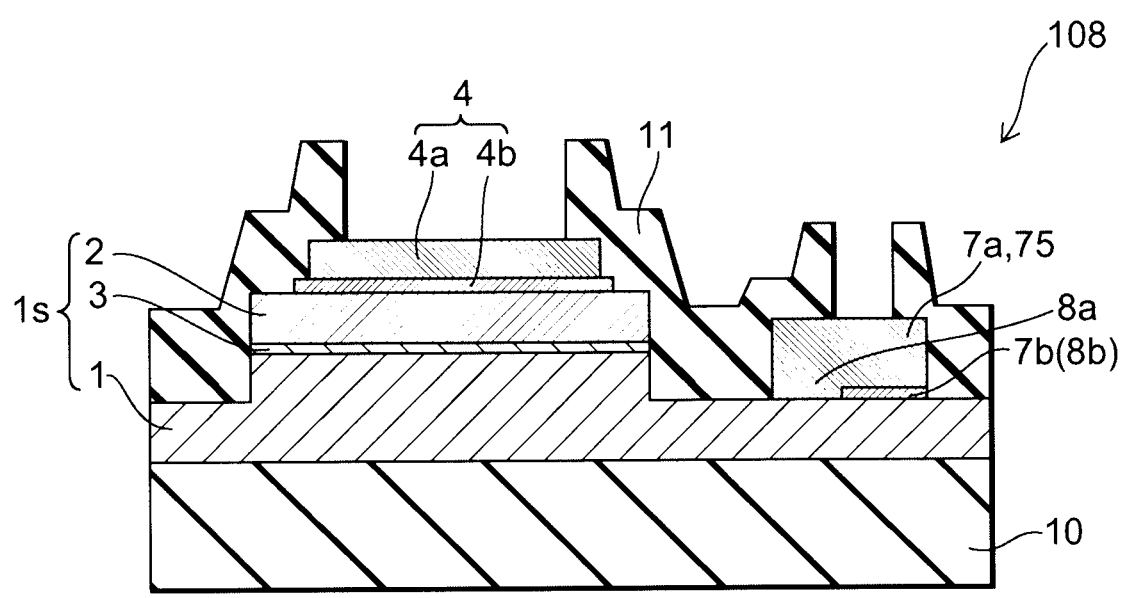
FIG. 23 is a schematic cross-sectional view illustrating the configuration of a semiconductor light-emitting device according to an eighth embodiment of the invention.

FIG. 23 is a schematic cross-sectional view illustrating the configuration of the semiconductor light-emitting device according to an eighth embodiment of the invention.

Figure 24A:
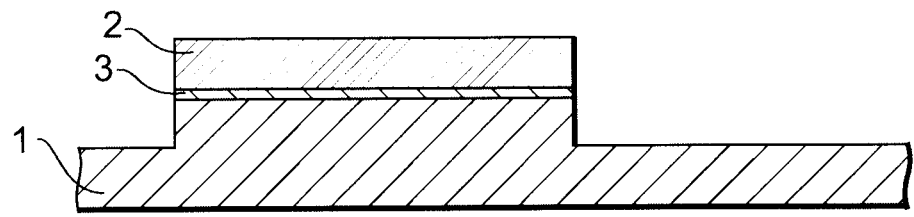
FIGS. 24A to 24C are schematic cross-sectional views by step sequence illustrating a method for manufacturing the semiconductor light-emitting device according to the eighth embodiment of the invention.
Figure 24B:
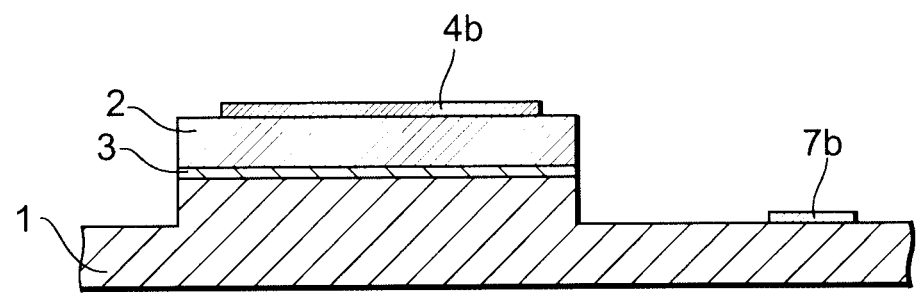
Figure 24C:
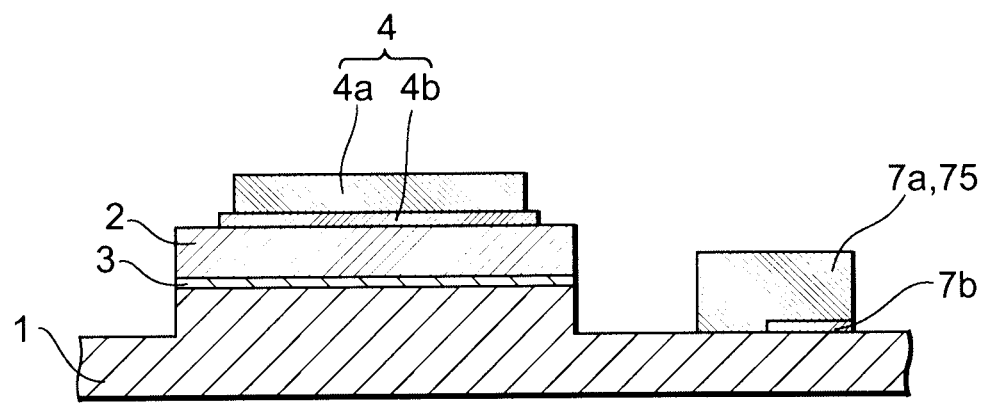

FIGS. 24A to 24C are schematic cross-sectional views by step sequence illustrating a method for producing the semiconductor light-emitting device according to the eighth embodiment of the invention.

Figure 25:
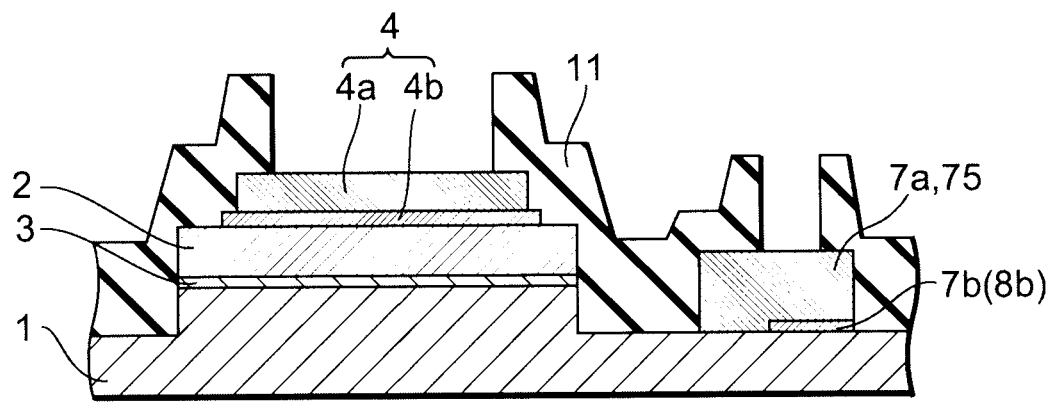
FIG. 25 is a schematic cross-sectional view by step sequence following FIGS. 24A to 24C.

FIG. 25 is a schematic cross-sectional view by step sequence following FIGS. 24A to 24C.

As shown in FIG. 23, in the semiconductor light-emitting device 108 according to the eighth embodiment of the invention, the first n-side electrode film 7a and the n-side pad 75 in the semiconductor light-emitting device 102 according to the second embodiment are used together. Other than this, the semiconductor light-emitting device 108 can be the same as the semiconductor light-emitting device 102, and hence, the description thereof will be omitted.

In the semiconductor light-emitting device 108, the second p-side electrode film 4b and the second n-side electrode film 7b having high-efficiency reflection characteristics are formed simultaneously, and the first p-side electrode film 4a and the first n-side electrode film 7a and the n-side pad 75 can be formed simultaneously.

Hereinafter, the method for manufacturing the semiconductor light-emitting device 108 according to this embodiment will be described.

First, as shown in FIG. 24A, in the region of part of the p-type semiconductor layer 2, until the n-type contact layer is exposed to the surface, the p-type semiconductor layer 2 and the light-emitting layer 3 are removed by dry etching using a mask.

Next, as shown in FIG. 24B, to form the high-efficiency reflection regions of the p-side electrode 4 and the n-side electrode 7, a lift-off resist is formed with an opening on the regions of parts of the n-type contact layer and the p-type contact layer, and using a vacuum deposition apparatus, the second p-side electrode film 4b and the second n-side electrode film 7b made of, for example, Ag are formed with a film thickness of 200 nm simultaneously, and sintered in a nitrogen atmosphere at 350° C.

Furthermore, as shown in FIG. 24C, to form the first p-side electrode film 4a of the p-side electrode 4 and the combination of the first n-side electrode film 7a of the n-side electrode 7 having ohmic characteristics and the n-side pad 75 of the n-side electrode 7, a lift-off resist is formed with an opening on the region of the n-type contact layer in the side facing the p-type contact layer with respect to the second n-side electrode film 7b that is the n-side electrode region having high efficiency reflection characteristics and the regions on the entirety of the first n-side electrode film 7b and on the second p-side electrode film 4b. Using a vacuum deposition apparatus, the first p-side electrode film 4a and combination of the first n-side electrode film 7a and the n-side pad 75 made of, for example, Ti/Pt/Au are formed with a film thickness of 500 nm.

And, as shown in FIG. 25, using a vacuum deposition apparatus, the total of ten layers of five pairs of combinations of $SiO_2$ and $TiO_2$ are formed on the semiconductor. The thickness of each of the films is represented by $\lambda/(4n)$ in which n is a refractive index of each of the dielectric layers and $\lambda$ is an emission wavelength from the light-emitting layer 3. Thereon, a patterned resist is formed, and the dielectric material is removed by ammonium fluoride treatment so that the p-side electrode 4 and the n-side electrode 7 are exposed, and thereby, the dielectric laminated film 11 is formed. The dielectric laminated film 11 may be formed by a lift-off method so that the p-side electrode 4 and the n-side electrode 7 are exposed.

As described above, the semiconductor light-emitting device 108 according to this embodiment can be fabricated.

In the semiconductor light-emitting device 108 according to this embodiment, the high-efficiency reflection films of the p-side electrode 4 and the n-side electrode 7 (second n-side electrode film 7b) can be formed simultaneously. Moreover, the first p-side electrode film 4a of the p-side electrode 4 and the combination of the first n-side electrode film and the n-side pad 75 of the n-side electrode 7 can be formed simultaneously.

Thereby, the number of processes can be reduced, and the light generated in the light-emitting layer can be taken out to the outside efficiently, and the semiconductor light-emitting device with high through-put and low cost and the manufacturing method thereof can be provided.

Ninth Embodiment

Figure 26:
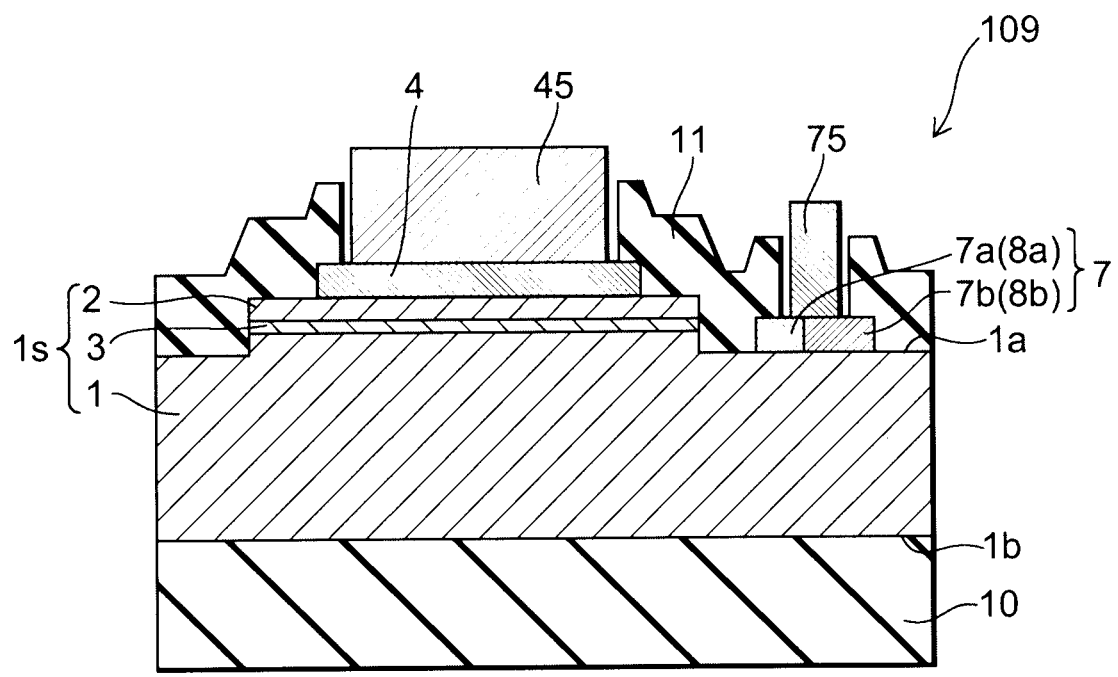
FIG. 26 is a schematic cross-sectional view illustrating the configuration of a semiconductor light-emitting device according to a ninth embodiment of the invention.

FIG. 26 is a schematic cross-sectional view illustrating the configuration of a semiconductor light-emitting device according to a ninth embodiment of the invention.

As shown in FIG. 26, the semiconductor light-emitting device 109 according to the ninth embodiment of the invention is provided with a p-side pad 45 on the p-side electrode 4 in the semiconductor light-emitting device 101 according to the first embodiment. Moreover, the n-side pad 75 is provided in the n-side electrode 7. Other than these, the semiconductor light-emitting device 109 can be the same as the semiconductor light-emitting device 101 according to the first embodiment, and hence, the description will be omitted.

That is, in the semiconductor light-emitting device 109, the p-side pad 45 is provided so as to coat part or all on the p-side electrode 4. For the p-side pad 45, for example, a film of Au with a thickness of 200 nm can be used.

Thereby, bondability is improved. Furthermore, heat-release from the semiconductor light-emitting device can be improved.

The p-side pad 45 can also be used as a gold bump, and AuSn bump can be formed instead of Au.

Moreover, the p-side pad 45 may be provided so as to cover at least part of the dielectric laminated film 11 as well as part or entirety on the p-side electrode 4. Moreover, the p-side pad 45 and the n-side pad 75 provided on the n-side electrode 7 can be formed simultaneously.

Moreover, in the case of separately providing the p-side 45 on the p-side electrode 4 for, bondability improvement of wire bonding, die share strength improvement in forming bold bump, flip chip mount, and so forth, the film thickness of the p-side pad 45 is not particularly limited, but can be selected in the range of, for example, 100 nm to 10000 nm.

As described above, in the semiconductor light-emitting device 109 according to this embodiment, providing the p-side pad 45 (and n-side pad 75) improves the bondability in the manufacturing process, and can provide the semiconductor light-emitting device in which the heat-release is improved and the light generated in the light-emitting layer can be taken out to the outside efficiently.

Tenth Embodiment

Figure 27:
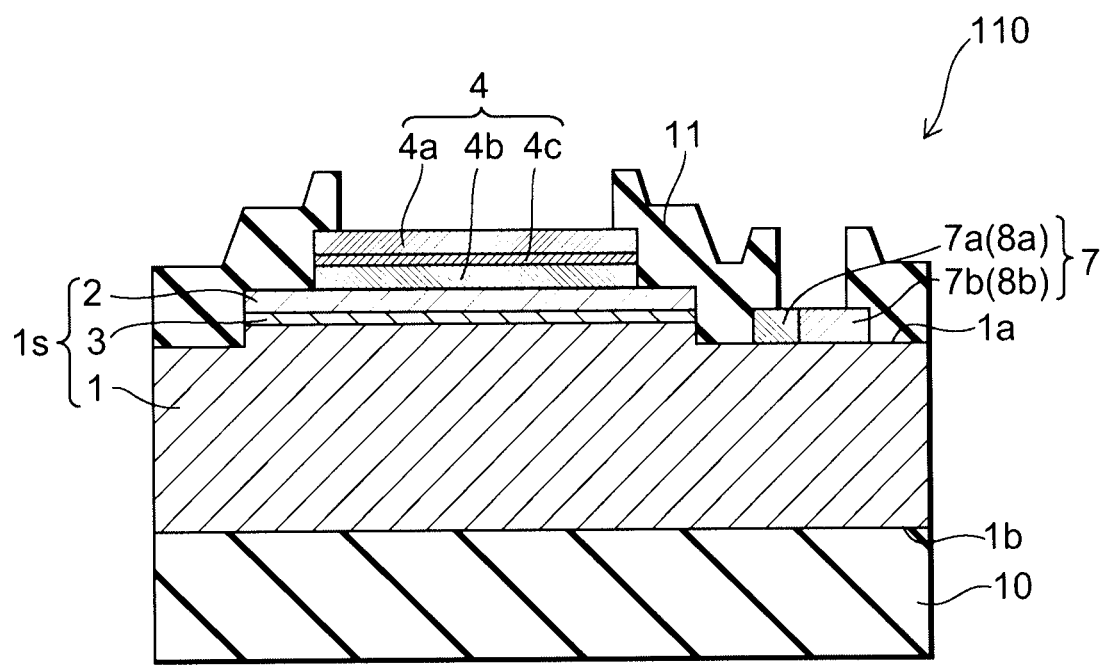
FIG. 27 is a schematic cross-sectional view illustrating the configuration of a semiconductor light-emitting device according to a tenth embodiment of the invention.

FIG. 27 is a schematic cross-sectional view illustrating the configuration of the semiconductor light-emitting device according to a tenth embodiment of the invention.

As shown in FIG. 27, the semiconductor light-emitting device 110 according to the tenth embodiment of the invention includes the p-side electrode 4 having the first p-side electrode film 4a and the second p-side electrode film 4b described previously and further includes a third p-side electrode film (fifth metal film) 4c provided between the first p-side electrode film 4a and the second p-side electrode film 4b by which the material composing the first p-side electrode film 4a is prevented from diffusing to the second p-side electrode film 4b, in the semiconductor light-emitting device 101 according to the first embodiment. Other than this, the semiconductor light-emitting device 110 can be the same as the semiconductor light-emitting device 101 according to the first embodiment, and hence, the description thereof will be omitted.

The third p-side electrode film 4c is provided between the second p-side electrode film 4b and the first p-side electrode film 4a, and has a function of preventing the first p-side electrode film 4a from diffusing to or reacting with the second p-side electrode film 4b. For the third p-side electrode film 4c, a material that does not react with silver or does not actively diffuse to silver can be used.

The third p-side electrode film 4c can be based on a single-layer film or laminated film of high melting point metal that can be used as the diffusion prevention layer such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), osmium (Os), iridium (Ir), or platinum (Pt).

For the third p-side electrode film 4c, in order that there is no problem if the material slightly diffuses to the second p-side electrode film 4b, it is further preferable that as the metal having a high work function by which p-GaN contact layer and the ohmic property can be easily obtained, iron (Fe), cobalt (Co), nickel (Ni), rhodium (Rh), tungsten (W), rhenium (Re), osmium (Os), iridium (Ir), or platinum (Pt) is used.

It is preferable that the thickness of the third p-side electrode film 4c is 5 nm to 200 nm in which the film state can be held in the case of a single-layer. In the case of a laminated film, the film thickness is not particularly limited, but can be selected in the range of, for example, 10 nm to 10000 nm.

As described above, according to the semiconductor light-emitting device 110 according to this embodiment, the third p-side electrode film 4c can suppress diffusion or reaction between the first p-side electrode film 4a and the second p-side electrode film 4b, and hence the semiconductor light-emitting device with the further higher electric characteristic and reliability can be provided and the light generated in the light-emitting layer can be taken out to the outside efficiently.

Eleventh Embodiment

Figure 28:
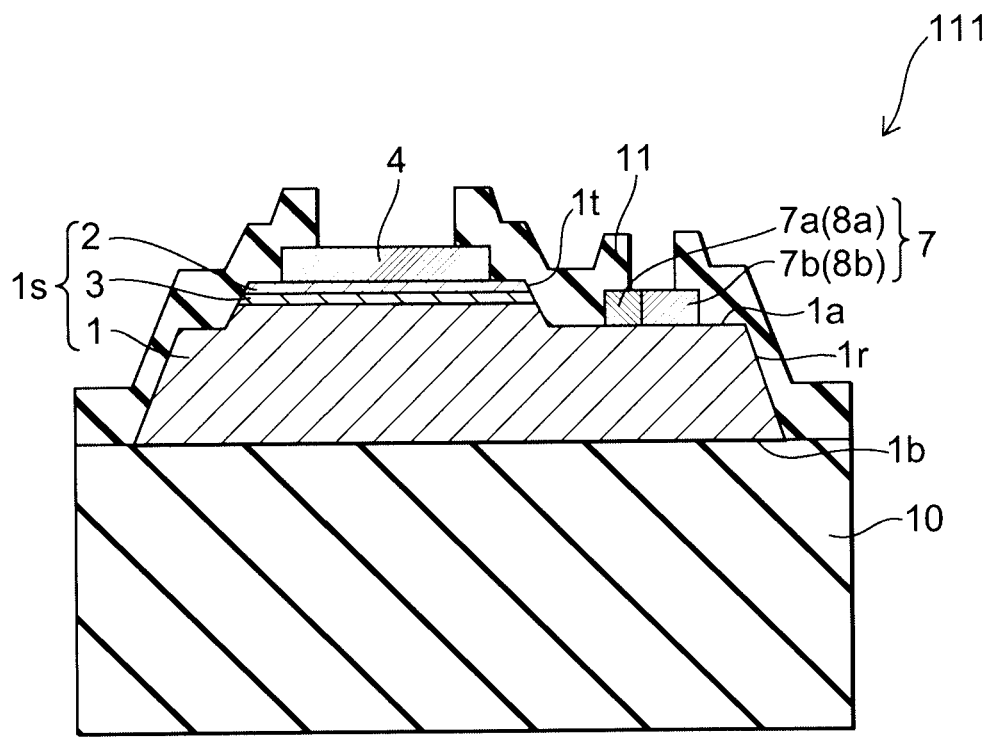
FIG. 28 is a schematic cross-sectional view illustrating the configuration of a semiconductor light-emitting device according to an eleventh embodiment of the invention.

FIG. 28 is a schematic cross-sectional view illustrating the configuration of a semiconductor light-emitting device according to an eleventh embodiment of the invention.

As shown in FIG. 28, in the semiconductor light-emitting device 111 according to the eleventh embodiment of the invention, the n-type semiconductor layer 1 also has a taper-shaped portion 1r in the semiconductor light-emitting device 104 according to the fourth embodiment. And, therewith, the dielectric laminated film 11 obliquely coats the taper-shaped portion 1t of the laminated structure 1s and the taper-shaped portion 1r of the n-type semiconductor layer 1. Other than this, the semiconductor light-emitting device 111 can be the same as the semiconductor light-emitting device 104, and hence, the description thereof will be omitted.

In the semiconductor light-emitting device 111, the light emitted in the light-emitting layer 3 repeats reflection at the interface of semiconductor—substrate having a large refractive index and the main surface 1a in which the electrodes are formed, and is easily trapped in the semiconductor layer. Some of the light is taken out of the device end face. However, in the semiconductor light-emitting device of square or rectangle fabricated on a sapphire substrate, because all of the four sides are not cleaved surfaces, reproducibility of the device end face shape is bad because of breaking the device, variations of the light extraction efficiency of each of the devices and further the light output thereof are caused.

In this case, according to the semiconductor light-emitting device 111 according to this embodiment, forming the device end face side of the semiconductor layer by wet etching or dry etching improves the reproducibility of the light path in the device end face side. Furthermore, by covering the device end face side of the semiconductor layer with the dielectric laminated film 11, the emitted light is reflected to the substrate side, and thereby the light can be taken out efficiently.

As described above, in the semiconductor light-emitting device 111 according to this embodiment, the light generated in the light-emitting layer can be taken out to the outside further stably and more efficiently.

Twelfth Embodiment

Figure 29:
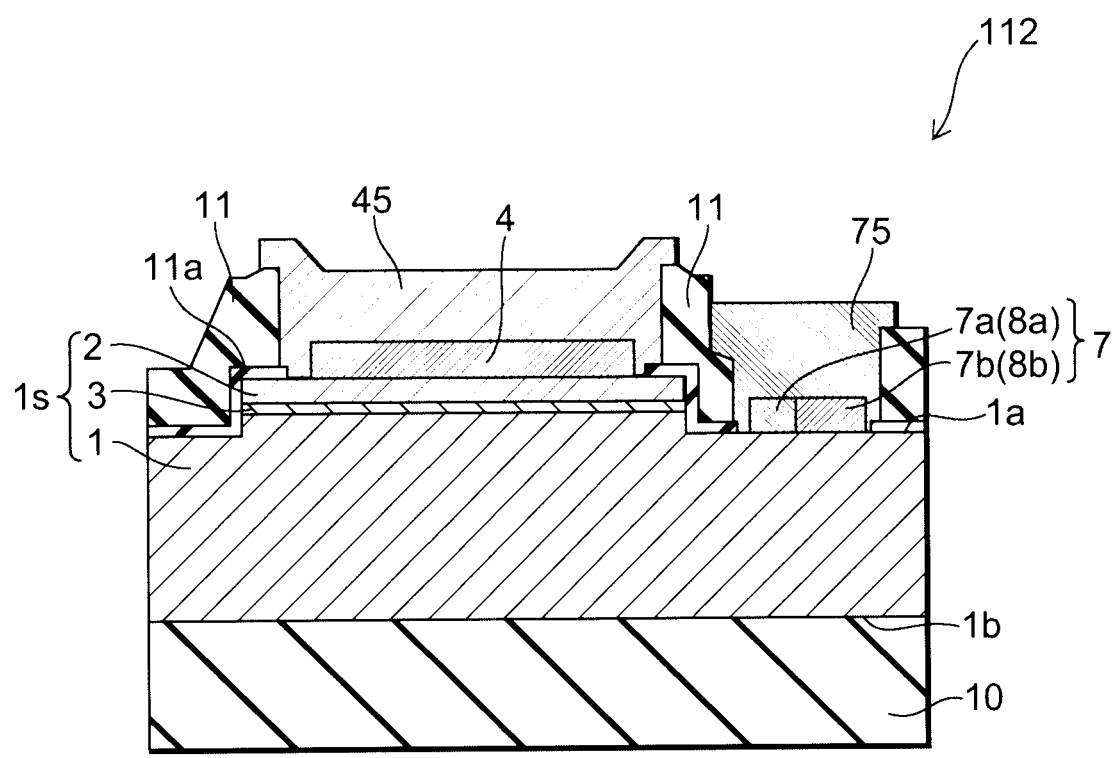
FIG. 29 is a schematic cross-sectional view illustrating the configuration of a semiconductor light-emitting device according to a twelfth embodiment of the invention.

FIG. 29 is a schematic cross-sectional view illustrating the configuration of the semiconductor light-emitting device according to a twelfth embodiment of the invention.

Figure 30A:
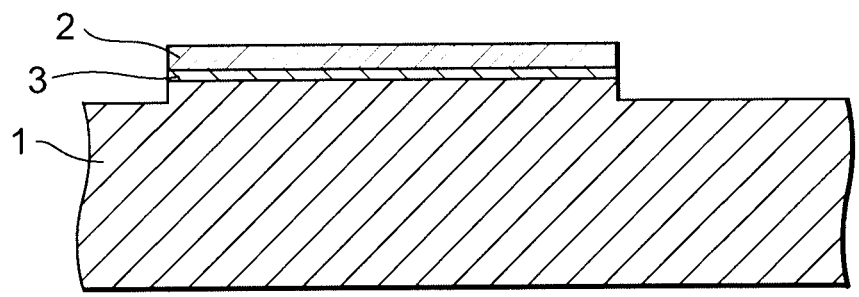
FIGS. 30A to 30C are schematic cross-sectional views by step sequence illustrating a method for manufacturing the semiconductor light-emitting device according to the twelfth embodiment of the invention.
Figure 30B:
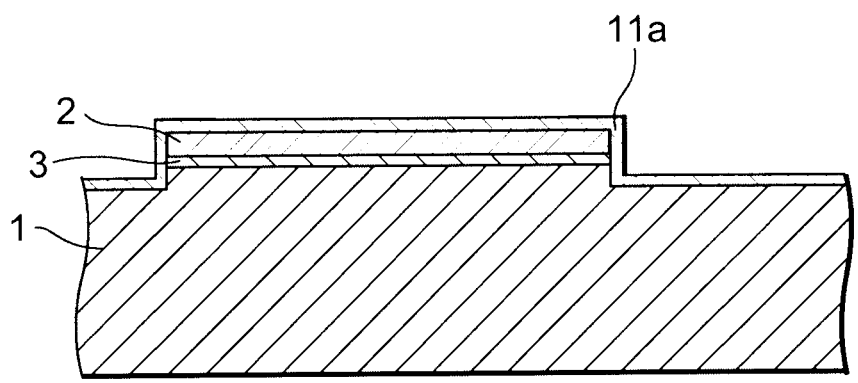
Figure 30C:
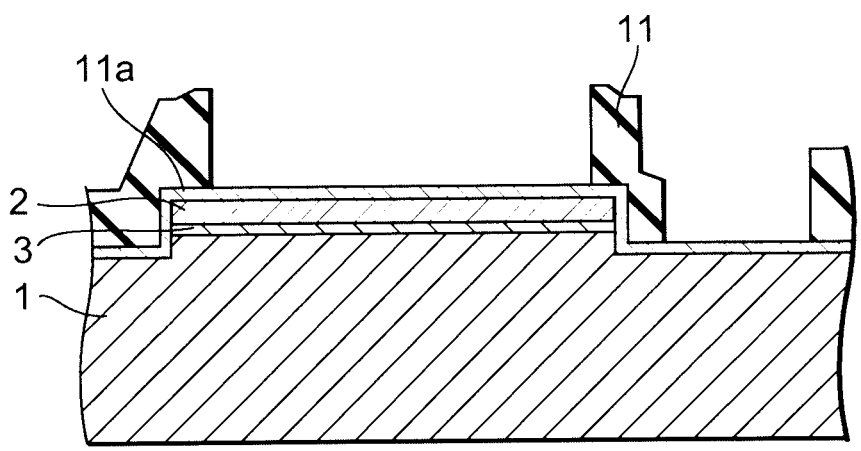

FIGS. 30A to 30C are schematic cross-sectional views by step sequence illustrating a method for manufacturing the semiconductor light-emitting device according to the twelfth embodiment of the invention.

Figure 31A:
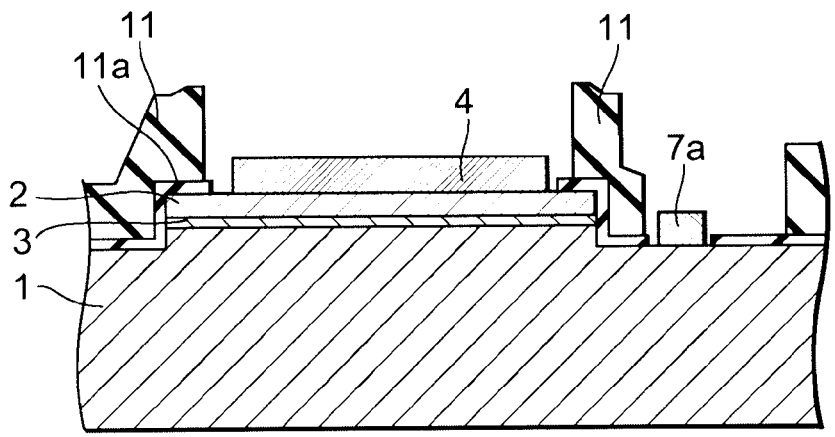
FIGS. 31A to 31C are schematic cross-sectional views by step sequence following FIGS. 30A to 30C.
Figure 31B:
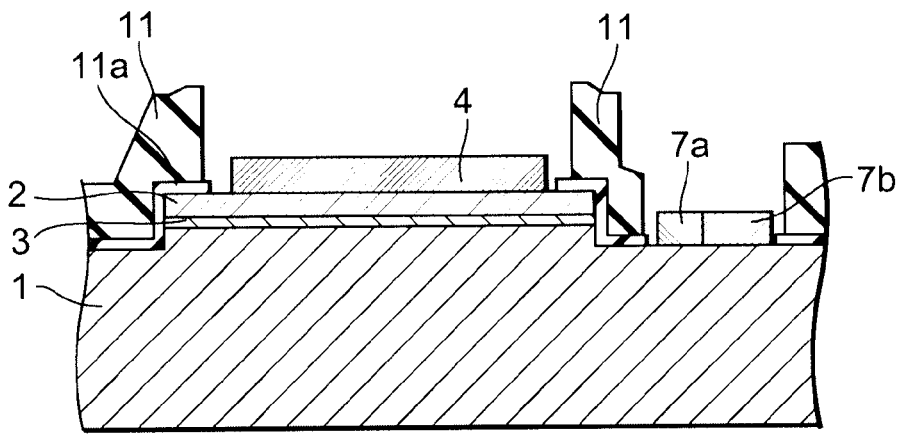
Figure 31C:
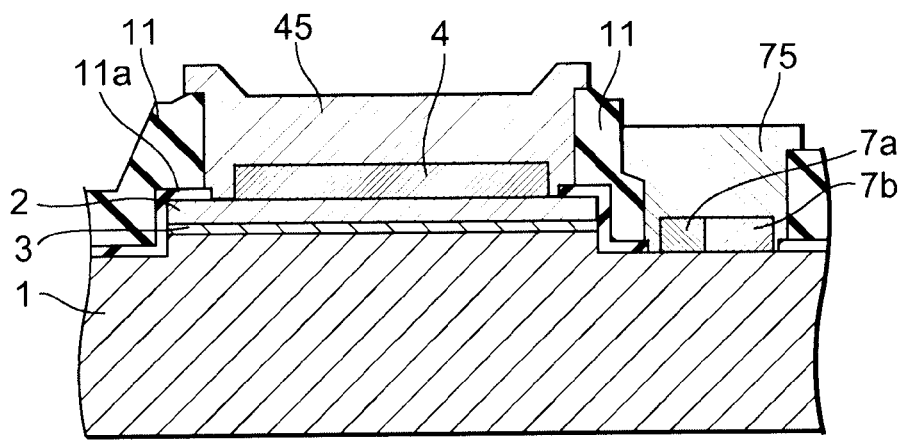

FIG. 31A to 31C are schematic cross-sectional views by step sequence following FIGS. 30A to 30C.

As shown in FIG. 29, the semiconductor light-emitting device 112 according to the twelfth embodiment of the invention is provided with the dielectric film 11a described in the fifth embodiment and further provided with the n-side pad 75 described in the second embodiment and the p-side pad 45 described in the ninth embodiment in the semiconductor light-emitting device 101 according to the first embodiment. However, ingenuity is made in the shapes of the dielectric film 11a and the dielectric laminated film 11 and the n-side pad 75 and the p-side pad 45, and thereby, as described later, the manufacture thereof becomes simpler and the process consistency is high.

That is, the semiconductor light-emitting device 112 further comprises the dielectric film 11a provided between the dielectric laminated film 11 and at least part of the n-side semiconductor layer 1 and the p-side semiconductor layer 2 being not covered with the n-side electrode 7 and the p-side electrode 4.

Moreover, part of the dielectric film 11a has a projecting portion that is not covered with the dielectric laminated film 11, and on the projecting portion, at least part of a conductive film connected to at least any one of the first and second electrodes is provided. In this specific example, on the projecting portion, the n-side pad 75 connected to the n-side electrode 7 and the p-side pad 45 connected to the p-side electrode 4 are provided, and the projecting portion is coated with the n-side pad 75 connected to the n-side electrode 7 and the p-side pad 45 connected to the p-side electrode 4.

Other than this, the semiconductor light-emitting device 112 can be the same as the semiconductor light-emitting device 101, and the description thereof will be omitted.

The n-side pad 75 and the p-side pad 45 can include at least any one selected from the group consisting of Ru, Pt, and Pd, having high reflectance for the blue light or the light in the near-ultraviolet region. Thereby, the semiconductor light-emitting device in which the reflectance is enhanced particularly for the blue light or the light in the near-ultraviolet region can be realized.

However, the invention is not limited thereto, but for the n-side pad 75 and the p-side pad 45, an optional conductive material can be used. A laminated film of the conductive film can also be used.

The semiconductor light-emitting device 112 according to this embodiment is manufactured, for example, as follows.

First, as shown in FIG. 30A, in the region of part of the p-type semiconductor layer 2, until the n-type contact layer is exposed to the surface, the p-type semiconductor layer 2 and the light-emitting layer 3 are removed by dry etching by using a mask.

Next, as shown in FIG. 30B, using a thermal CVD apparatus, the dielectric film 11a made of SiO$_2$ is formed on the semiconductor layer with a film thickness of 100 nm. As described above, using a thermal CVD method, the dielectric film 11a following the shape of step of the laminated structure is can be easily provided.

Next, as shown in FIG. 30C, on the SiO$_2$ serving as the dielectric film 11a, the dielectric laminated film 11 having a predetermined shape is formed. In this case, for the material of the dielectric laminated film 11 and the forming method thereof, the methods described previously can be used.

Next, as shown in FIG. 31A, after the SiO$_2$ of the dielectric film 11a is partially removed by ammonium fluoride treatment, similarly, the second p-side electrode film 4b is formed in a predetermined shape on the p-type semiconductor layer 2 in the region in which the SiO$_2$ is removed, and the first n-side electrode 7a is formed in a predetermined shape on part of the n-type semiconductor layer 1 in the region in which the SiO$_2$ is removed. For the material of the second p-side electrode film 4b and the first n-side electrode film 7a and the forming method thereof, the methods described previously can be used.

Moreover, as shown in FIG. 31B, on part of the n-type semiconductor layer 1 in the region in which the SiO$_2$ is removed, the second n-side electrode film 7b is formed in a predetermined shape. For the material of the second n-side electrode film 7b and the forming method thereof, the methods described previously can be used.

As shown in FIG. 31C, on the p-type electrode layer 2 being not covered with the p-side electrode 4, the dielectric film 11a and the dielectric laminated film 11, a Ru film serving as the p-side pad 45 is formed. And, on the n-type semiconductor layer 1 being not covered with the n-side electrode film 7a and the second n-side electrode film 7b and on the dielectric film 11a and on the dielectric laminated film 11, a Ru film serving as the n-side pad 75 is formed. In this case, by a lift-off method, the formed Ru films can be processed to be in a shape of the p-side pad 45 and the n-side pad 75. For the film to the p-side pad 45 and the n-side pad 75, a metal such as Pt or Pd as well as Ru can be used, and a conductive film except therefor can be used.

As described above, the semiconductor light-emitting device 112 according to this embodiment can be formed.

The semiconductor light-emitting device 112 according to this embodiment can provide the semiconductor light-emitting device in which bondability in the manufacturing process and the heat-release are improved and the light generated in the light-emitting layer can be taken out to the outside, because the n-side pad 75 and the p-side pad 45 are further provided. Moreover, the formation of the p-side pad 45 and the n-side pad 75 made of, for example, Ru film can be formed at one time, and the processes can be omitted.

Furthermore, because the dielectric laminated film 11 is processed before forming the n-side electrode 7 (first n-side electrode film 7a and second n-side electrode film 7b) and the p-side electrode 4, the process consistency is high and the manufacture thereof is easy.

That is, the dielectric laminated film 11 is formed by, for example, a lift-off method, and then, the dielectric film 11a is processed by, for example, a wet etching method or a dry etching method. And, on the exposed first and second semiconductor layers, the n-side electrode 7 and the p-side electrode 4 are formed by, for example, a lift-off method, respectively. Thereby, the process consistency is improved and the process margin is enlarged.

Thirteenth Embodiment

Figure 32:
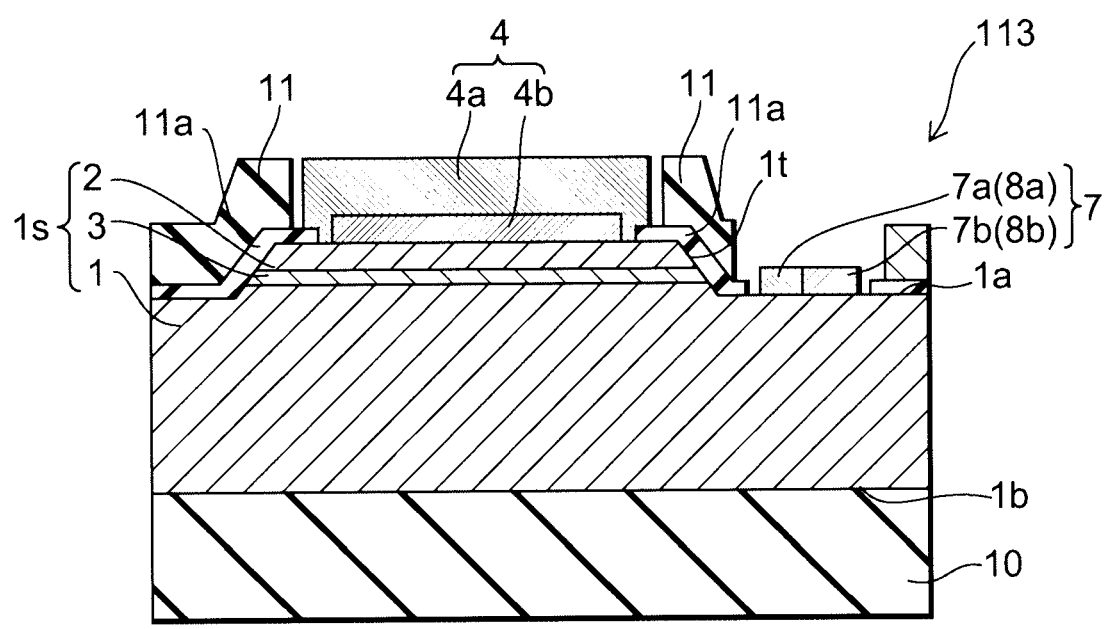
FIG. 32 is a schematic cross-sectional view illustrating the configuration of a semiconductor light-emitting device according to a thirteenth embodiment of the invention.

FIG. 32 is a schematic cross-sectional view illustrating the configuration of the semiconductor light-emitting device according to a thirteenth embodiment of the invention.

Figure 33A:
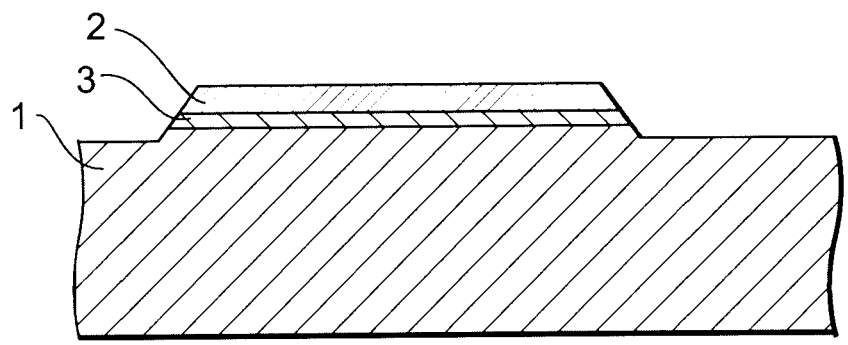
FIGS. 33A to 33C are schematic cross-sectional views by step sequence illustrating a method for manufacturing the semiconductor light-emitting device according to the thirteenth embodiment of the invention.
Figure 33B:
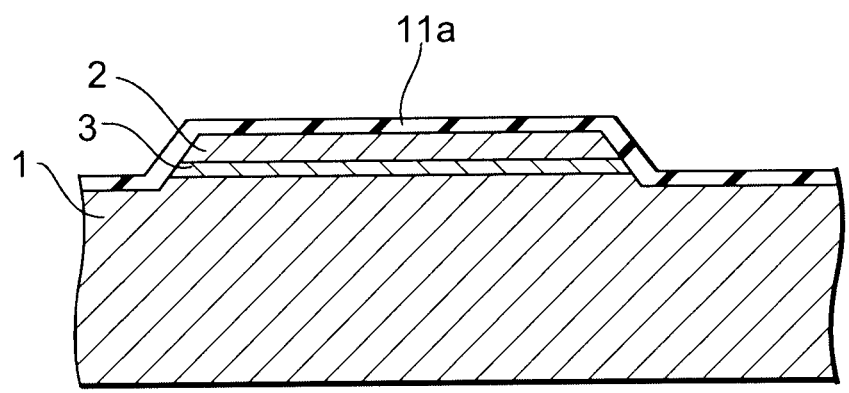
Figure 33C:
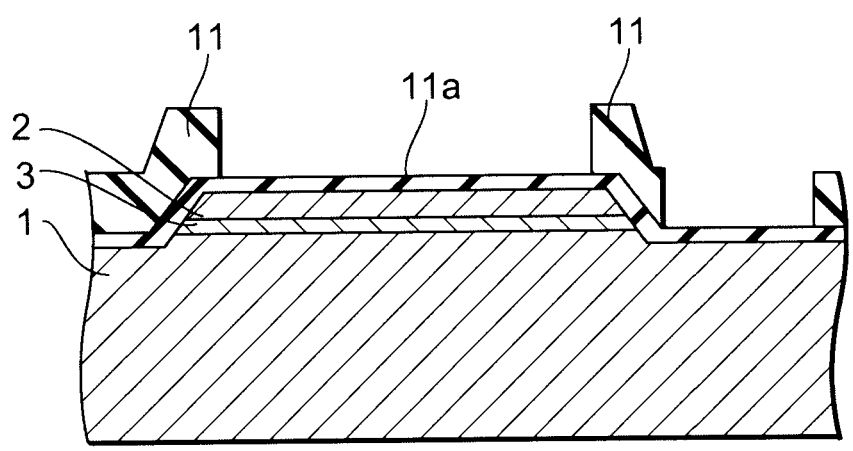

FIGS. 33A to 33C are schematic cross-sectional views by step sequence illustrating a method for manufacturing the semiconductor light-emitting device according to the thirteenth embodiment of the invention.

Figure 34A:
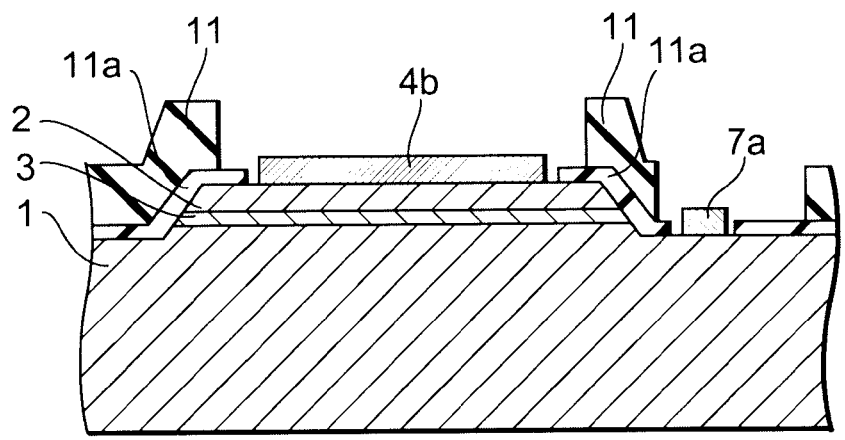
FIGS. 34A to 34C are schematic cross-sectional views by step sequence following FIGS. 33A to 33C.
Figure 34B:
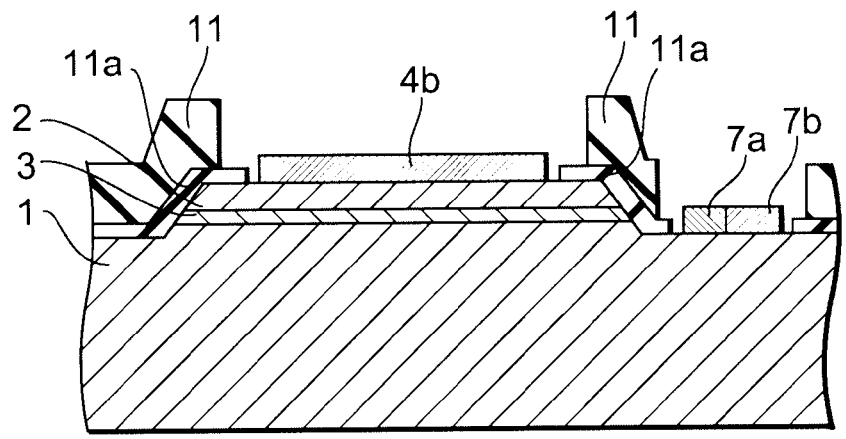
Figure 34C:
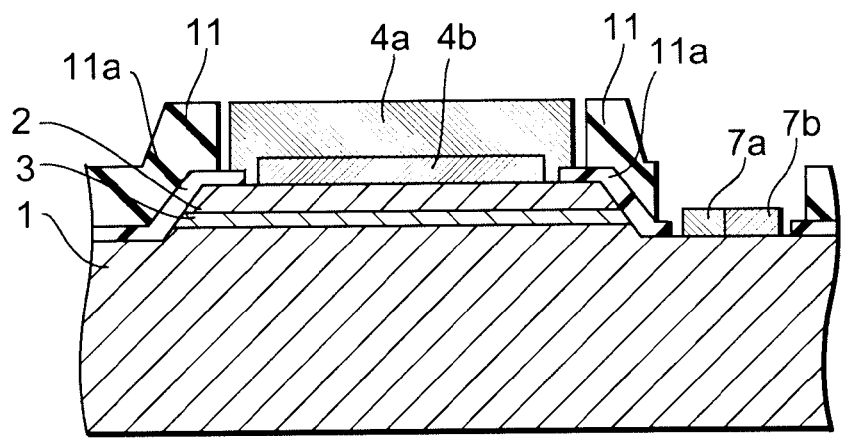

FIG. 34A to 34C are schematic cross-sectional views by step sequence following FIGS. 33A to 33C.

As shown in FIG. 32, the semiconductor light-emitting device 113 according to the thirteenth embodiment of the invention is provided with the dielectric film 11a described in the fifth embodiment and further provided with the taper-shaped portion 1t of the laminated structure 1s described in the fourth embodiment in the semiconductor light-emitting device 101 according to the first embodiment. However, ingenuity is made in the shapes of the dielectric film 11a, the dielectric laminated film 11, the first and second n-side electrode films 7a, 7b, and the first and second p-side electrode films 4a, 4b, and as described later, the manufacture thereof is simpler.

That is, the semiconductor light-emitting device 113 further comprises the dielectric film 11a provided between the dielectric laminated film 11 and at least part of the n-side semiconductor layer 1 and the p-side semiconductor layer 2 being not covered with the n-side electrode 7 and the p-side electrode 4.

Moreover, the dielectric film 11a has a projecting portion that is not covered with the dielectric laminated film 11, and on the projecting portion, at least part of at least any one of the n-side electrode 7 and the p-side electrode 4 is provided. In this specific example, on the projecting portion, the first p-side electrode film 4a that is part of the p-side electrode 4 is provided, and the projecting portion is coated with the first p-side electrode film 4a that is part of the p-side electrode 4.

Other than this, the semiconductor light-emitting device 113 can be the same as the semiconductor light-emitting device 101, and hence, the description thereof will be omitted.

The semiconductor light-emitting device 113 according to this embodiment is manufactured by, for example, the following method.

First, as shown in FIG. 33A, in the region of part of the p-type semiconductor layer 2, until the n-type contact layer is exposed to the surface, the p-type semiconductor layer 2 and the light-emitting layer 3 are removed by dry etching by using a mask.

Next, as shown in FIG. 33B, using a thermal CVD apparatus, the dielectric film 11a made of SiO$_2$ is formed on the semiconductor layer with a film thickness of 100 nm. As described above, using a thermal CVD method, the dielectric film 11a following the shape of the taper-shaped portion 1t of the laminated structure 1s can be easily provided.

Next, as shown in FIG. 33C, on the SiO$_2$ serving the dielectric film 11a, the dielectric laminated film 11 having a predetermined shape is formed. In this case, for the material of the dielectric laminated film 11, a laminated film of TiO/(SiO/TiO)$_4$ can be used. For the film formation of this laminated film, as described previously, a vacuum deposition method can be used, and for the processing of the shape, a lift-off method can be used.

In the laminated film made of TiO/(SiO/TiO)$_4$ serving as the dielectric laminated film 11, the thickness of each of the films is represented by $\lambda/(4n)$ in which n is a refractive index of each of the dielectric layers and $\lambda$ is an emission wavelength from the light-emitting layer 3.

Next, as shown in FIG. 34A, after the SiO$_2$ serving as the dielectric film 11a is partially removed by ammonium fluoride treatment, the second p-side electrode film 4b is formed in a predetermined shape on the p-type semiconductor layer 2 in the region in which the SiO$_2$ is removed, and the first n-side electrode 7a is formed in a predetermined shape on part of the n-type semiconductor layer 1 in the region in which the SiO$_2$ is removed. For the material of the second p-side electrode film 4b and the first n-side electrode film 7a, the previously described material can be used, and for the forming method thereof, the lift-off method described previously can be used.

As shown in FIG. 34B, on part of the n-type semiconductor layer 1 in the region in which the SiO$_2$ is removed, the second n-side electrode film 7b is formed in a predetermined shape. For the material of the second n-side electrode film 7b, the previously described material can be used, and for the forming method thereof, the lift-off method described previously can be used.

Moreover, as shown in FIG. 34C, the first p-side electrode 4a is formed so as to cover the entire surface of the second p-side electrode film 4b and the p-type semiconductor layer 2 being not covered with the second p-side electrode film 4b. For the material of the first p-side electrode film 4a, the previously described material can be used, and for the forming method thereof, the lift-off method described previously can be used.

As described above, the semiconductor light-emitting device 113 according to this embodiment can be formed.

In the semiconductor light-emitting device 113 according to this embodiment, the laminated structure 1s has the taper-shaped portion 1t and hence the reflection characteristics are further higher.

Furthermore, the dielectric laminated film 11 is processed before forming the n-side electrode 7 (first n-side electrode film 7a and second n-side electrode film 7b) and the p-side electrode 4, the process consistency is high and the production thereof is easy.

That is, the dielectric laminated film 11 is formed by, for example, a lift-off method, and then, the dielectric film 11a is processed by, for example, a wet etching method or a dry etching method. And, on the exposed first and second semiconductor layers, the n-side electrode 7 and the p-side electrode 4 are formed by, for example, a lift-off method, respectively. Thereby, the process consistency is improved and the process margin is enlarged.

As described above, the semiconductor light-emitting device 113 according to this embodiment can provide the semiconductor light-emitting device by which the light generated in the light-emitting layer is taken out to the outside efficiency and that can be easily manufactured and the manufacturing method thereof.

In the semiconductor light-emitting device 113 according to this embodiment, after the process illustrated in FIG. 34C, the p-side pad 45 and the n-side pad 75 described in the twelfth embodiment may be provided. In this case, the structure is such that the dielectric film 11a has a projecting portion that is not covered with the dielectric laminated film 11, and on the projecting portion, at least part of the conductive film connected to at least any one of the first and second electrodes is provided.

Fourteenth Embodiment

Figure 35:
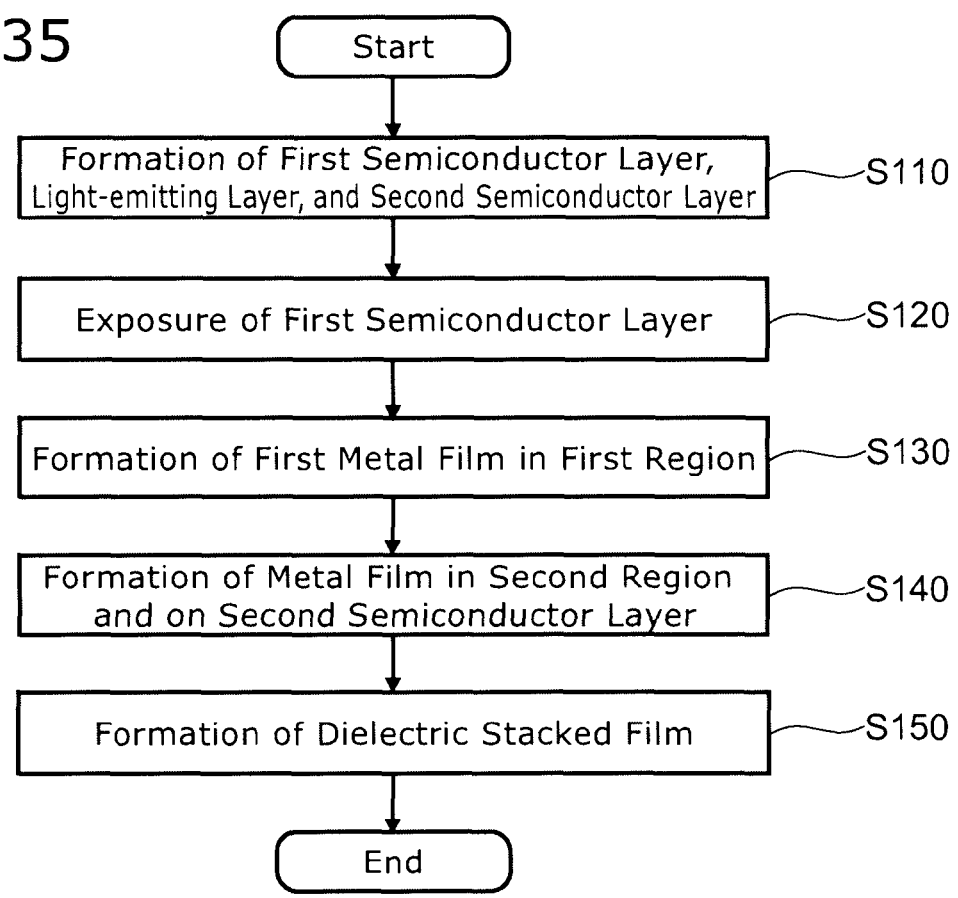
FIG. 35 is a flow chart illustrating a method for manufacturing the semiconductor light-emitting device according to a fourteenth embodiment of the invention.

FIG. 35 is a flow chart illustrating a method for manufacturing a semiconductor light-emitting device according to a fourteenth embodiment of the invention.

As shown in FIG. 35, in the method for manufacturing the semiconductor light-emitting device according to the fourteenth embodiment of the invention, first on the substrate 10, the first semiconductor layer (n-type semiconductor layer 1), the light-emitting layer 3 and the second semiconductor layer (p-type semiconductor layer 2) are laminated and formed (Step S110). For this, for example, the method described with regard to the first embodiment can be used.

Part of the second semiconductor layer and the light-emitting layer are removed to expose the first semiconductor layer (Step S120). For this, for example, the method described with regard to the second embodiment can be used.

On the first region of the exposed first semiconductor layer, a first metal film (first n-side electrode film 7a) is formed (Step S130). For this, for example, the method described with regard to the second embodiment can be used.

On a second region adjacent to the first region of the exposed first semiconductor layer and on the second semiconductor layer, a second metal film (second n-side electrode film 7b and second p-side electrode film 4b) that have a higher reflectance for light emitted from the light-emitting layer 3 than the first metal film and that has a higher contact resistance with respect to the first semiconductor layer than the first metal film are formed (Step S140). For this, for example, the method described with regard to the sixth embodiment can be used.

Furthermore, on the first semiconductor layer and the second semiconductor layer that are not covered with the first metal film and the second metal film, a dielectric laminated film 11 in which a plurality of kinds of dielectric films having different refractive indices are alternately laminated is formed (Step S150). For this, for example, the method described with regard to the second embodiment can be used.

According to the method for manufacturing the semiconductor light-emitting device according to this embodiment, the second p-side electrode film 4b having high-efficiency reflection characteristics of the p-side electrode 4 and the second n-side electrode film 7b having high-efficiency reflection characteristics are composed of the same material, and can be formed simultaneously.

Thereby, the number of processes can be reduced, and the light generated in the light-emitting layer can be taken out to the outside efficiently, and the method for manufacturing the semiconductor light-emitting device with high through-put can be provided.

The above Steps S110 to S150 can be interchanged in the technically possible range, or can be carried out simultaneously.

Fifteenth Embodiment

Figure 36:
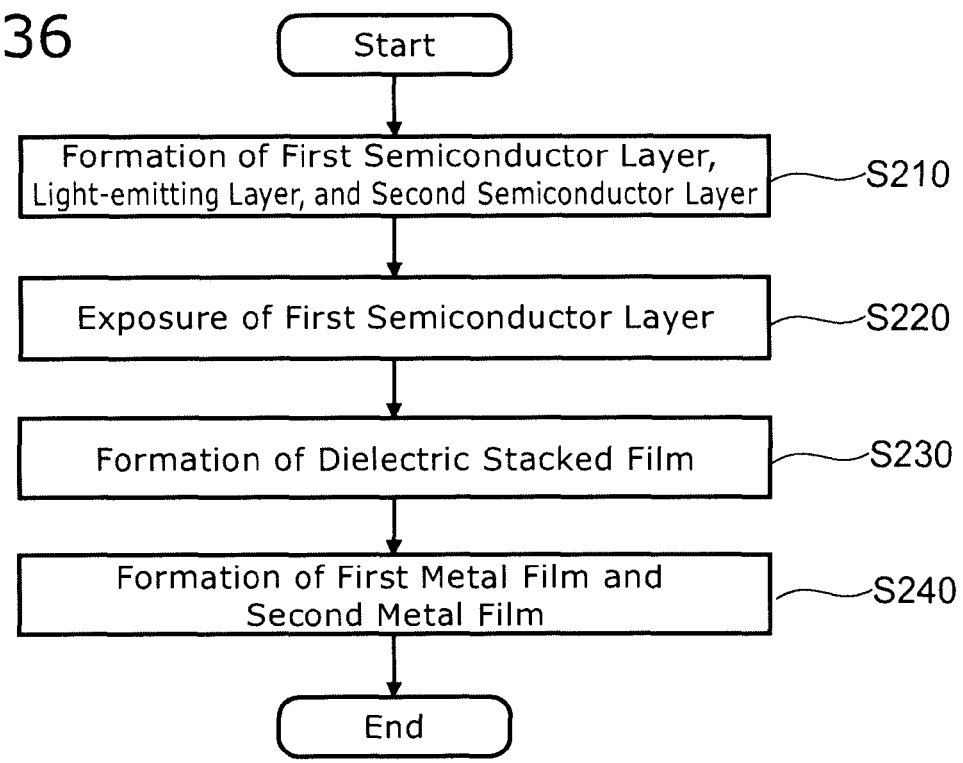
FIG. 36 is a flow chart illustrating a method for manufacturing the semiconductor light-emitting device according to a fifteenth embodiment of the invention.

FIG. 36 is a flow chart illustrating a method for manufacturing a semiconductor light-emitting device according to a fifteenth embodiment of the invention.

As shown in FIG. 36, in the method for manufacturing the semiconductor light-emitting device according to the fifteenth embodiment of the invention, first on the substrate 10, the first semiconductor layer (n-type semiconductor layer 1), the light-emitting layer 3, and the second semiconductor layer (p-type semiconductor layer 2) are laminated and formed (Step S210). For this, for example, the method described with regard to the first embodiment can be used.

Part of the second semiconductor layer and the light-emitting layer are removed to expose the first semiconductor layer (Step 220). For this, for example, the method described with regard to the second embodiment can be used.

On the first semiconductor layer and the second semiconductor layer, the dielectric laminated film 11 in which a plurality of kinds of dielectric films having different refractive indices are laminated is formed (Step 230). For this, for example, the method described with regard to the second embodiment can be used.

On the first region of the first semiconductor layer being not covered with the dielectric laminated film, the first metal film (first n-side electrode film 7a) is formed, and on the second region of the first semiconductor layer that is not covered with the dielectric laminated film 11 and that is adjacent to the first region, a second metal film (second n-side electrode film 7b) that has a higher reflectance for light emitted from the light-emitting layer than the first metal film and that has a higher contact resistance with respect to the first semiconductor layer than the first metal film is formed (Step S240). For this, for example, the method described with regard to the second embodiment can be used.

As described above, in the method for manufacturing the semiconductor light-emitting device according to this embodiment, before forming the first metal film (first n-side electrode film 7a) and the second metal film (second n-side electrode film 7b), the dielectric laminated film 11 is provided. That is, this is the order of steps in the methods for manufacturing the semiconductor light-emitting devices according to the twelfth and thirteenth embodiments.

According to experiments by the inventors, when the dielectric laminated film 11 is formed using a vacuum deposition apparatus at room temperature, the etching rate by wet etching is very rapid, and the workability of the film is low. Moreover, if high-temperature heat treatment is performed during or after the film formation, the wet etching rate becomes very small for zirconium oxide or titanium oxide or the like, and processing of the film becomes difficult. Therefore, the dielectric laminated film 11 can be processed by, for example, a lift-off method.

In this case, by providing the dielectric laminated film 11 before forming the first metal film (first n-side electrode film 7a) and the second metal film (second n-side electrode film 7b), the process consistency is enhanced and the margin of the production is enlarged.

As described above, the method for manufacturing the semiconductor light-emitting device according to this embodiment can provide the method for manufacturing the semiconductor light-emitting device in which the process consistency is high and that is easily fabricated and in which the light generated in the light-emitting layer can be taken out to the outside efficiently.

Figure 37:
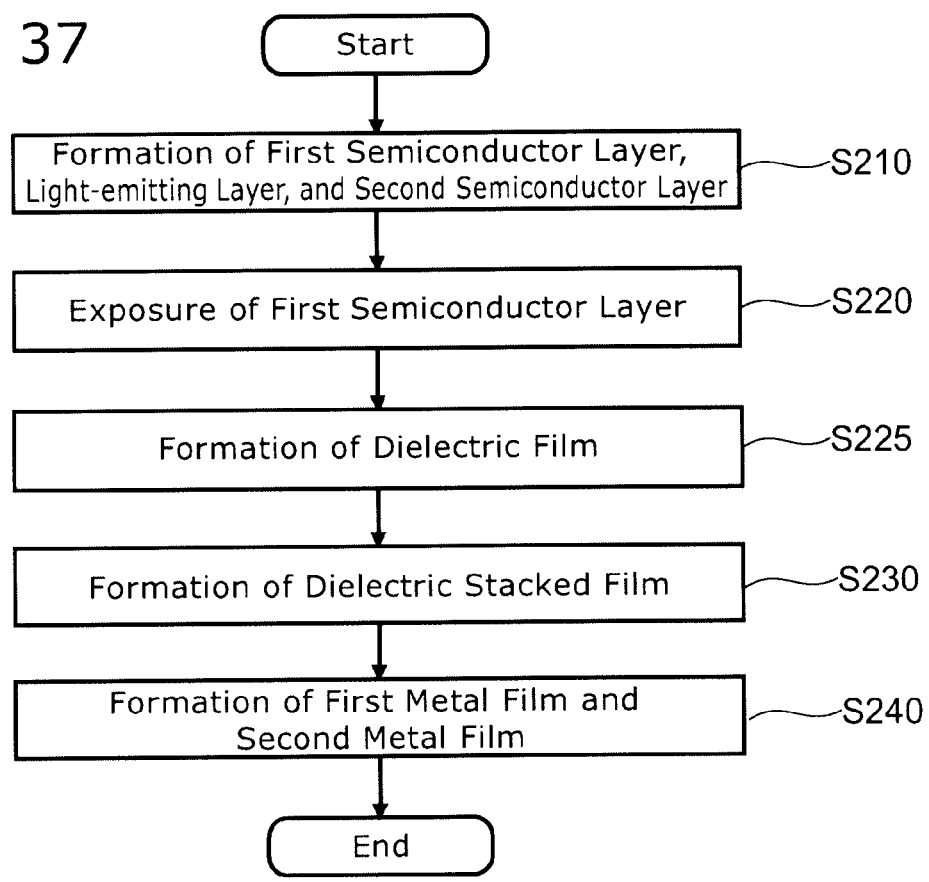
FIG. 37 is a flow chart illustrating a modified example of the method for manufacturing the semiconductor light-emitting device according to the fifteenth embodiment of the invention.

FIG. 37 is a flow chart showing a modified example of the method for manufacturing the semiconductor light-emitting device according to the fifteenth embodiment of the invention.

As shown in FIG. 37, in the modified example of the method for manufacturing the semiconductor light-emitting device according to the fifteenth embodiment of the invention, between the exposure process of the first semiconductor layer (Step S220) and the formation process of the dielectric laminated film 11 (Step S230), the dielectric film 11a having higher step coverage characteristics on the first semiconductor layer and the second semiconductor layer than the dielectric laminated film 11 is formed on the first semiconductor layer and the second semiconductor layer (Step S225).

For this dielectric film 11a, as explained in the thirteenth embodiment, for example, a $SiO_2$ film formed by a thermal CVD method can be used.

That is, the formation of the dielectric film 11a can be carried out by a chemical vapor deposition method.

Thereby, the dielectric film 11a having high step coverage characteristics on the first semiconductor layer and the second semiconductor layer can be formed.

And, as described with regard to the thirteenth embodiment, after the formation of the dielectric film 11a, the formation of the dielectric laminated film 11 is performed by, for example, a lift-off method, and then the dielectric film 11a is processed by, for example, a wet etching method or a dry etching method. And, on the exposed first and second semiconductor layers, the n-side electrode 7 and the p-side electrode 4 are formed, respectively.

In the method for manufacturing the semiconductor light-emitting device according to this embodiment, as described in fifth embodiment, before forming the first n-side electrode film 7a and the second p-side electrode film 4b, the dielectric film 11a is formed on the semiconductor layer, and hence, contamination attaching to the interface between the electrode and the semiconductor layer in the electrode-forming process can be drastically reduced, and therefore, reliability, yield, electric characteristic, and optical characteristics can be improved.

According to the method for manufacturing the semiconductor light-emitting device of the modified example of this embodiment, there can be provided the method for manufacturing the semiconductor light-emitting device in which the process consistency is high, and reliability, yield, electric characteristics, and optical characteristics are high.

Sixteenth Embodiment

Figure 38:
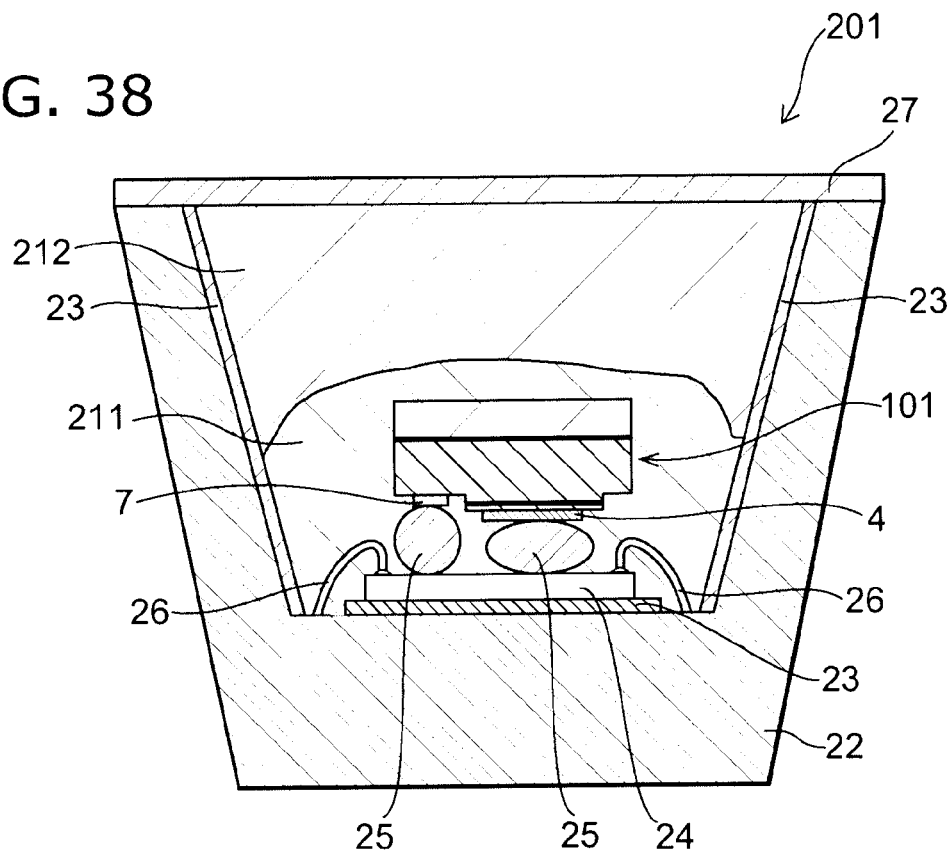
FIG. 38 is a schematic cross-sectional view illustrating the configuration of a semiconductor light-emitting apparatus according to a sixteenth embodiment of the invention.

FIG. 38 is a schematic cross-sectional view illustrating the configuration of a semiconductor light-emitting apparatus according to a sixteenth embodiment of the invention.

The semiconductor light-emitting apparatus 201 according to the sixteenth embodiment of the invention is a white LED in which any one of the above semiconductor light-emitting devices according to the respective embodiments and a fluorescent material are combined. Hereinafter, the case that the semiconductor light-emitting device 101 according to the first embodiment and a fluorescent material are combined will be described.

That is, the semiconductor light-emitting apparatus 201 according to this embodiment comprises any one of the semiconductor light-emitting devices described above and a fluorescent material layer irradiated with the light emitted in the semiconductor device.

As shown in FIG. 38, in the semiconductor light-emitting apparatus 201 according to this embodiment, a reflection film 23 is provided on the inner surface of a container 22 made of ceramic or the like. The reflection film 23 is provided so as to be divided into the inner side surface and the bottom surface of the container 22. The reflection film 23 is made of, for example, aluminum or the like. On the reflection film 23 provided on the bottom surface of the container 22, the semiconductor light-emitting device 101 illustrated in FIG. 1 is disposed through a submount 24.

On the semiconductor light-emitting device 101, gold bumps 25 are formed by a ball bonder, and the semiconductor light-emitting device 101 is fixed to the submount 24. It is also possible that without using the gold bump 25, the semiconductor light-emitting device 101 is directly fixed to the submount 24.

Adhesive bonding by an adhesive agent or soldering or the like can be used to fix the semiconductor light-emitting device 101, the submount 24, and the reflection film 23.

On the surface of the semiconductor light-emitting device side of the submount 24, patterned electrodes are formed so that the p-side electrode 4 and the n-side electrode 7 of the semiconductor light-emitting device 101 are insulated, and the respective patterned electrodes are connected to the electrodes (not shown) provided in the container 22 side, with bonding wires 26. The connections are formed between the reflective film 23 on the inner side surface and the reflective film 23 on the bottom surface.

Moreover, a first fluorescent material layer 211 containing a red fluorescent material is provided so as to cover the semiconductor light-emitting device 101 and the bonding wires 26. On the first fluorescent material layer 211, a second fluorescent material layer 212 containing a blue, green, or yellow fluorescent material is formed. On this fluorescent material layer, a lid 27 made of silicon resin is provided.

The first fluorescent material layer 211 contains a resin and a red fluorescent material dispersed in the resin.

For the red fluorescent material, for example, $Y_2O_3$, $YVO_4$, $Y_2(P,V)O_4$ or the like can be used as the parent material, and trivalent Eu ($Eu^{3+}$) is contained therein as the activation substance. That is, $Y_2O_3:Eu^{3+}$, $YVO_4:Eu^{3+}$, or the like can be used as the red fluorescent material. The concentration of $Eu^{3+}$ can be 1% to 10% in terms of molarity. As the parent material of the red fluorescent material, as well as $Y_2O_3$ or $YVO_4$, LaOS or $Y_2(P,V)O_4$ or the like can be used. Moreover, as well as $Eu^{3+}$, $Mn^{4+}$ or the like can be utilized. In particular, by adding a small amount of Bi with the trivalent Eu to the parent material of $YVO_4$, the absorption at 380 nm increases, and therefore, the light-emitting efficiency can be further enhanced. Moreover, as the resin, for example, silicone resin or the like can be used.

Moreover, the second fluorescent material layer 212 contains a resin and at least any one of blue, green, and yellow fluorescent materials dispersed in the resin. For example, the fluorescent material combining the blue fluorescent material and the green fluorescent material may be used, or the fluorescent material combining the blue fluorescent material and the yellow fluorescent material may be used, or the fluorescent material combining the blue fluorescent material, the green fluorescent material, and the yellow fluorescent material may be used.

For the blue fluorescent material, for example, $(Sr,Ca)_{10}(PO_4)_6Cl_2:Eu^{2+}$ or $BaMg_2Al_{16}O_{27}:Eu^{2+}$ or the like can be used.

For the green fluorescent material, for example, $Y_2SiO_5:Ce^{3+},Tb^{3+}$ with trivalent Tb serving as the emission center can be used. In this case, because the energy is transferred from the Ce ion to the Tb ion, the excitation efficiency is enhanced. For the green fluorescent material, for example, $Sr_4Al_{14}O_{25}:Eu^{2+}$ or the like can be used.

For the yellow fluorescent material, for example, $Y_3Al_5:Ce^{3+}$ or the like can be used.

Moreover, for the resin, for example, silicone resin or the like can be used.

In particular, trivalent Tb exhibits sharp emission in the vicinity of 550 nm where the visibility is maximized, and hence, when trivalent Tb is combined with the sharp red emission of trivalent Eu, the emission efficiency is significantly enhanced.

By the semiconductor light-emitting apparatus 201 according to this embodiment, the ultraviolet light of 380 nm generated from the semiconductor light-emitting device 101 is emitted toward the substrate 10 of the semiconductor light-emitting device 101, and the reflection at the reflection film 23 is also utilized, and thereby, the above fluorescent materials contained in the respective fluorescent material layers can be efficiently excited.

For example, in the above fluorescent material having the emission center of trivalent Eu or the like contained in the first fluorescent material layer 211, the light is converted into light having a narrow wavelength distribution in the vicinity of 620 nm, and thereby, the red visible light can be efficiently obtained.

Moreover, the blue, green, or yellow fluorescent materials contained in the second fluorescent material layer 212 are efficiently excited, and thereby, the blue, green, or yellow visible light can be efficiently obtained.

As the mixed colors thereof, white light and light with various other colors can be obtained with high efficiency and good color rendition.

Next, the method for manufacturing the semiconductor light-emitting apparatus 201 according to this embodiment will be described.

For the processes for fabricating the semiconductor light-emitting device 101, the previously described method can be used, and hence, hereinafter, the processes after the semiconductor light-emitting device 101 is completed will be described.

First, the metal film serving as the reflection film 23 is formed on the inner surface of the container 22 by, for example, sputtering, and the metal film is patterned to leave the reflection films 23 on the bottom surface and the inner side surface of the container 22, respectively.

Next, on the semiconductor light-emitting device 101, the gold bumps 25 are formed by a ball bonder. And, on the submount 24 having the electrodes patterned for the p-side electrode 4 and the n-side electrode 7, the semiconductor light-emitting device 101 is fixed, and the submount 24 is disposed and fixed onto the reflection film 23 on the bottom surface of the container 22. To fix them, adhesive bonding by an adhesive agent or soldering or the like can be used. Moreover, it is also possible that without using the gold bump 25 by the ball bonder, the semiconductor light-emitting device 101 is directly fixed onto the submount 24.

Next, the n-side electrode and p-side electrode (not shown) on the submount 24 are connected to the electrodes (not shown) provided on the container 22 side, respectively, with bonding wires 26.

Furthermore, the first fluorescent material layer 211 containing the red fluorescent material is formed so as to cover the semiconductor light-emitting device 101 and the bonding wires 26, and the second fluorescent material layer 212 containing blue, green or yellow fluorescent material is formed on the first fluorescent material layer 211.

For the respective methods for forming the fluorescent material layers, for example, a method of dropping each of the fluorescent materials dispersed in a resin raw material mixture and then performing thermal polymerization by heat treatment to cure the resin can be used. When the resin raw material mixture containing each of the fluorescent materials is dropped and then left to stand for a while and then cured, the fine particles of each of the fluorescent materials are precipitated and the fine particles can be localized to the lower portions of the first and second fluorescent layers 211, 212, and thereby, the emission efficiency of each of the fluorescent materials can be appropriately controlled. Then, the lid 27 is provided on the fluorescent material layer, and thereby, the semiconductor light-emitting apparatus 201 according to this embodiment, namely, a white LED is fabricated.

In this specification, "nitride semiconductor" includes all of the semiconductors having the compositions in which the composition ratios x, y, and z are changed in the respective ranges in the chemical formula of $B_xIn_yAl_zGa_{1-x-y-z}N$ ($0 \le x \le 1$, $0 \le y \le 1$, $0 \le z \le 1$, $x+y+z \le 1$). Furthermore, in the above chemical formula, the semiconductor further containing the group V element other than N (nitrogen) or the semiconductor further containing any one of various dopants to be added for controlling the conductivity type and so forth is also included in the "nitride semiconductor".

As described above, the embodiments of the invention have been described with reference to the specific examples. However, the invention is not limited to these specific examples. For example, for shape, size, material, and disposition relation of each of the components such as the semiconductor multilayer film, the metal film, and the dielectric film constituting the semiconductor light-emitting device, and for manufacturing methods thereof, such inventions are included in the scope of the invention as long as the inventions can be similarly carried out by performing appropriate selection from the known range by those skilled in the art and the same effect can be obtained.

Moreover, combinations of two or more components of each of the specific examples in the technically possible range are included in the scope of the invention as long as including the spirit of the invention.

In addition, all of the semiconductor light-emitting devices and the methods for manufacturing the same which can be carried out with appropriately design-modified by those skilled in the art based on the semiconductor light-emitting device and the method for manufacturing the same that have been described as the embodiments of the invention also belong to the scope of the invention as long as including the spirit of the invention.

In addition, it is conceived that in the range of the idea of the invention, various variations and modifications can be achieved by those skilled in the art and it is understood that such variations and modifications also belong to the scope of the invention.

The invention claimed is:

1. A semiconductor light-emitting device comprising:
    a laminated structure including, a first semiconductor layer, a second semiconductor layer, and a light-emitting layer provided between the first semiconductor layer and the second semiconductor layer, the second semiconductor layer and the light-emitting layer being selectively removed and a part of the first semiconductor layer being exposed to a first main surface on a side of the second semiconductor layer;
    a first electrode provided on the first main surface of the laminated structure and connected to the first semiconductor layer and including a first metal film provided on the part of the first semiconductor layer and a second metal film provided on the part of the first semiconductor layer, the first metal film physically contacting with the first semiconductor layer, the second metal film physically contacting with the first semiconductor layer, the first metal film having a first reflectance for light emitted from the light emitting layer, the second metal film having a second reflectance for the light higher than the first reflectance, and the first metal film having a first contact resistance with respect to the first semiconductor layer, the second metal film having a second contact resistance with respect to the first semiconductor layer, the second contact resistance being higher than the first contact resistance;
    a second electrode provided on the first main surface of the laminated structure and connected to the second semiconductor layer; and
    a dielectric laminated film provided on a surface of the first semiconductor layer and the second semiconductor layer, the surface being not covered with any one of the first electrode and the second electrode on the first main surface, the dielectric laminated film having a plurality of dielectric films having different refractive indices being laminated,
    wherein the first metal film opposes the second electrode, the second metal film is disposed on an opposite side of the first metal film to the second electrode, and
    top surfaces of the first and second metal films are substantially coplanar and directly adjacent to each other.

2. The semiconductor light-emitting device according to claim 1, wherein the first metal film has ohmic contact characteristics with respect to the first semiconductor layer.

3. The device according to claim 1, wherein the first metal film is a part of the first electrode, the part being opposed to the second electrode.

4. The device according to claim 1, further comprising a transparent electrode provided in at least part of at least one between the first semiconductor layer and the first electrode and between the second semiconductor layer and the second electrode.

5. The device according to claim 1, wherein a side surface of the portion where the second semiconductor layer and the light-emitting layer are selectively removed is sloped with respect to layer surfaces of the first and second semiconductor layers.

6. The device according to claim 1, wherein the dielectric laminated film is made by alternately laminating a first dielectric layer having a first refractive index $n_1$ and a second dielectric layer having a second refractive index $n_2$, the second refractive index $n_2$ being different from the first refractive index $n_1$, and when a wavelength of light emitted from the light-emitting layer is $\lambda$, a thickness of each of the first dielectric layers is substantially $\lambda/(4n_1)$ and a thickness of each of the second dielectric layers is substantially $\lambda/(4n_2)$.

7. The device according to claim 6, wherein the dielectric laminated film includes at least one of oxide, nitride, and oxynitride of at least one selected from the group consisting of silicon (Si), aluminum (Al), zirconium (Zr), titanium (Ti), niobium (Nb), tantalum (Ta), magnesium (Mg), hafnium (Hf), cerium (Ce), and zinc (Zn).

8. The device according to claim 6, wherein the laminating number of combination of the first dielectric film and the second dielectric film is 3 or more.

9. The device according to claim 1, further comprising a dielectric film provided between the dielectric laminated film and the laminated structure.

10. The device according to claim 9, wherein the dielectric film has a projecting portion being not covered with the dielectric laminated film, and one of the first and second electrodes is provided on the projecting portion or a conductive film being connected to one of the first and second electrodes is provided on the projecting portion.

11. The device according to claim 1, wherein the laminated structure further includes a substrate made of sapphire provided on a side of a second main surface facing the first main surface.

12. The device according to claim 11, wherein the laminated structure further includes an aluminum nitride layer of single crystal provided between the substrate and the first semiconductor layer.

13. The device according to claim 12, wherein on a side of the substrate in the aluminum nitride layer, a portion having a relatively high concentration of carbon is provided.

* * * * *